(12) United States Patent
Huber et al.

(10) Patent No.: US 7,414,779 B2
(45) Date of Patent: Aug. 19, 2008

(54) MODE LOCKING METHODS AND APPARATUS

(75) Inventors: Robert Huber, Cambridge, MA (US);
Kenji Taira, Brookline, MA (US);
James Fujimoto, Medford, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 11/337,105

(22) Filed: Jan. 20, 2006

(65) Prior Publication Data

US 2006/0187537 A1 Aug. 24, 2006

Related U.S. Application Data

(60) Provisional application No. 60/645,359, filed on Jan. 20, 2005.

(51) Int. Cl.
*H01S 3/00* (2006.01)
(52) U.S. Cl. ............................ 359/333; 372/20; 372/28; 372/18
(58) Field of Classification Search .................. 372/18, 372/19, 21, 26, 30, 98, 20, 28
See application file for complete search history.

(56) References Cited

U.S. PATENT DOCUMENTS 5,263,037 A 11/1993 Trutna, Jr. et al.
5,574,739 A * 11/1996 Carruthers et al. ............ 372/27
5,956,355 A 9/1999 Swanson et al.
6,282,215 B1 * 8/2001 Zorabedian et al. ........... 372/20
6,816,515 B1 * 11/2004 Yun et al. ..................... 372/18

FOREIGN PATENT DOCUMENTS

EP 0 524 382 A2 1/1993
WO WO 03/096106 A1 11/2003

OTHER PUBLICATIONS

Takesue, H., and Horiguchi, T., "Broad-Band Lightwave Synthesized Frequency Sweeper Using Synchronous Filtering," *J. of Lightwave Technology*, 22(3): 755-762 (2004).
Yun, S.H. et al., "Wavelength-Swept Fiber Laser with Frequency Shifted Feedback and REsonantly Swept Intra-Cavity Acoustooptic Tunable Filter," *IEEE Journal of Selected Topics in Quantum Electronics*, 3(4): 1087-1096 (1997).

(Continued)

*Primary Examiner*—Mark Hellner
(74) *Attorney, Agent, or Firm*—Hamilton, Brook, Smith & Reynolds, P.C.

(57) ABSTRACT

In one aspect the invention relates to a frequency varying wave generator. The generator includes a gain element adapted to amplify a wave having a wavelength; a time varying tunable wavelength selective filter element in communication with the gain element, the tunable filter element adapted to selectively filter waves during a period T; and a feedback element in communication with the tunable filter element and the gain element, wherein the tunable wavelength selective filter element, the gain element and the feedback element define a circuit such that the roundtrip time for the wave to propagate through the circuit is substantially equal to a non-zero integer multiple of the period T.

139 Claims, 44 Drawing Sheets

OTHER PUBLICATIONS

Yun, S.H., et al., "High-speed wavelength-swept semiconductor laser with a polygon-scanner-based wavelength filter," *Optics Letters*, 28(20): 1981-1983 (2003).

Yun, S.H., et al., "Interrogation of fiber grating sensor arrays with a wavelength-swept fiber laser," *Optics Letters*, 23(11): 843-845 (1998).

Huber, R., et al., "Fourier Domain Mode Locked Lasers for OCT imaging at up to 290 kHz sweep rates," *Proc. of SPIE-OSA Biomedical Optics, SPIE* vol. 5861: (2005).

Shimizu, K., et al., "Measurement of Rayleigh Backscattering in Single-Mode Fibers Based on Coherent OFDR Employing a DFB Laser Diode," *IEEE Photonics Technology Letters*, 3(11): 1039-1041 (1991).

Telle, J.M., and Tang, C.L., "Very rapid tuning of cw dye laser," Applied Physics Letters, 26(10): 572-574 (1975).

\* cited by examiner

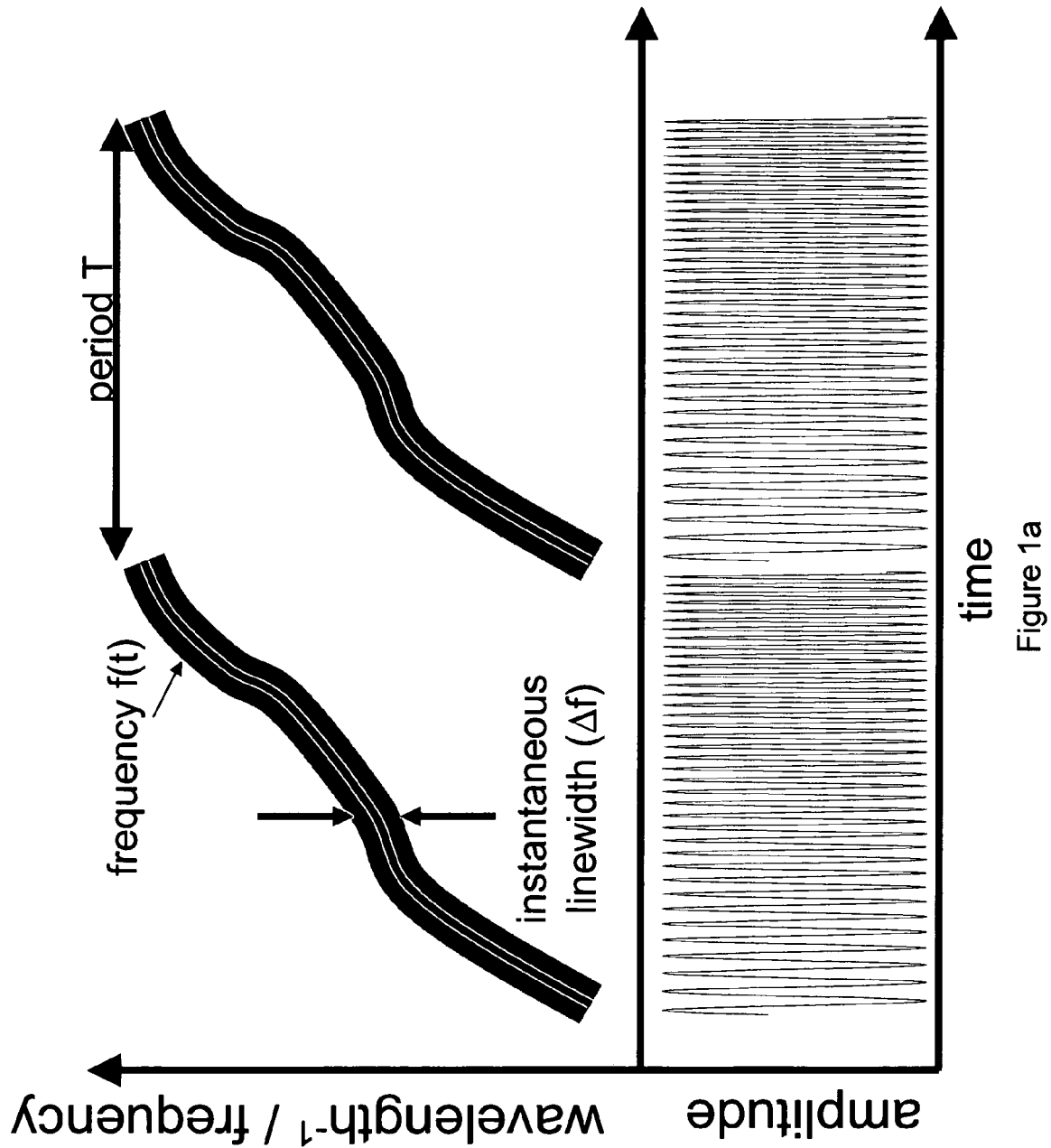

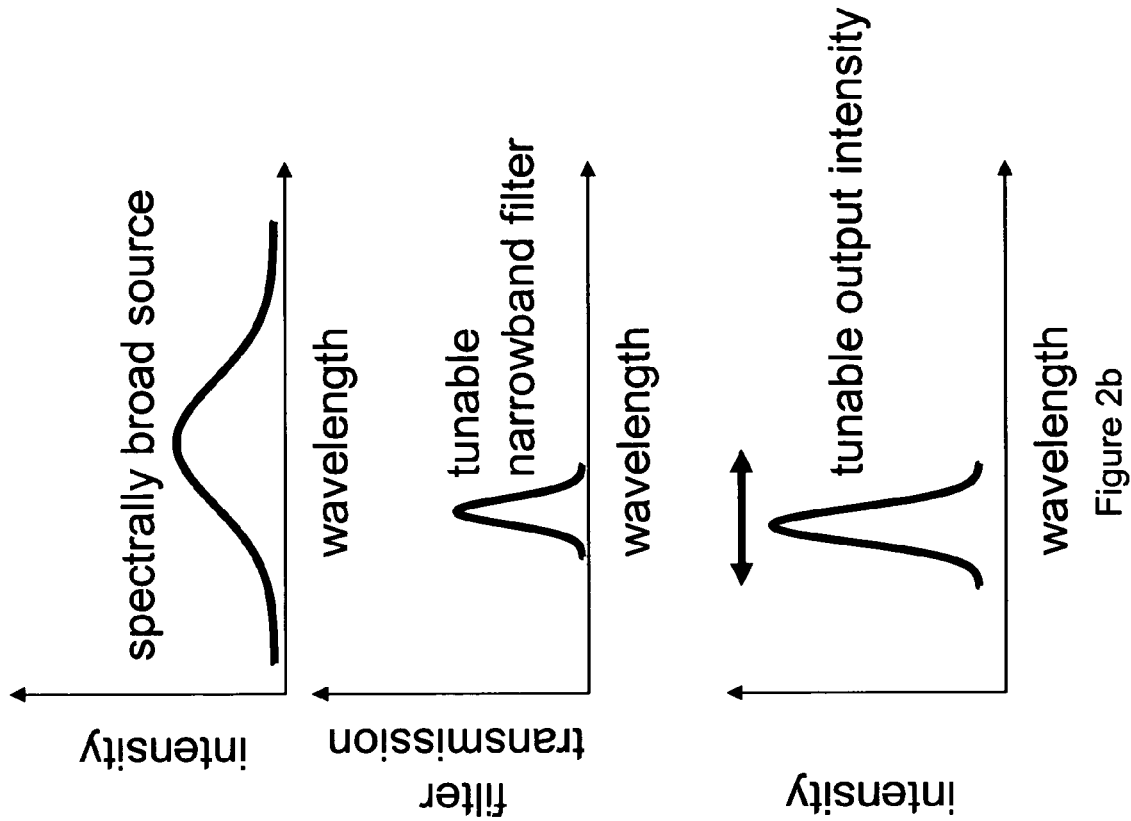
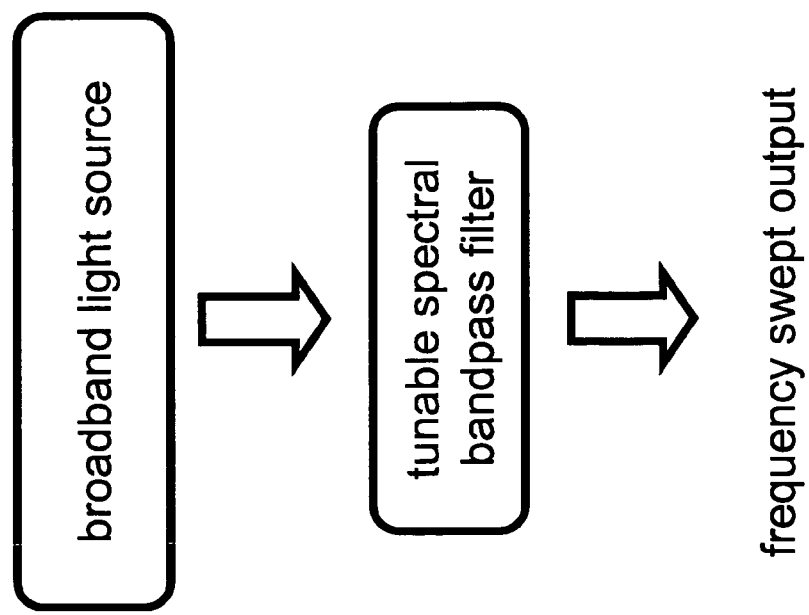
Figure 2a

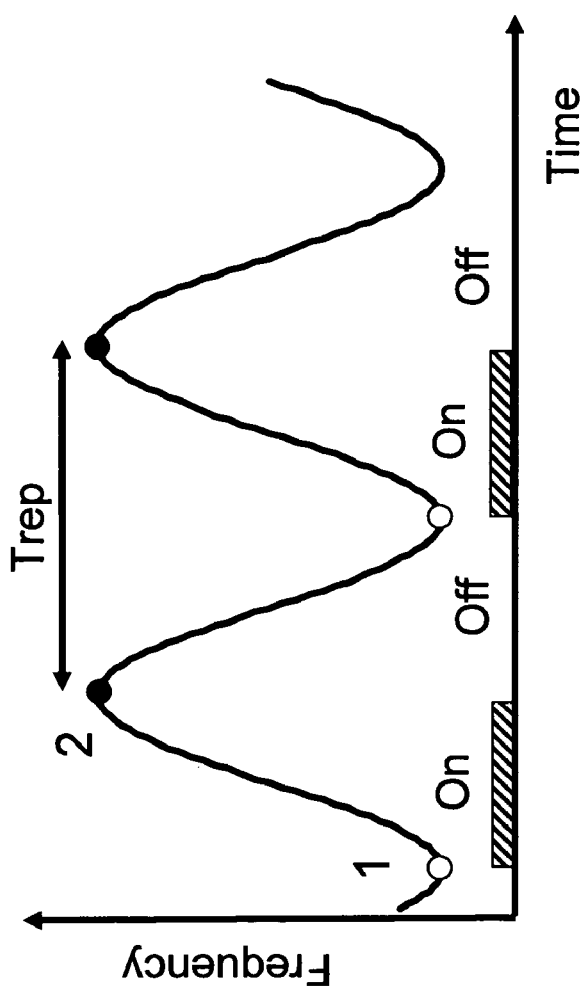
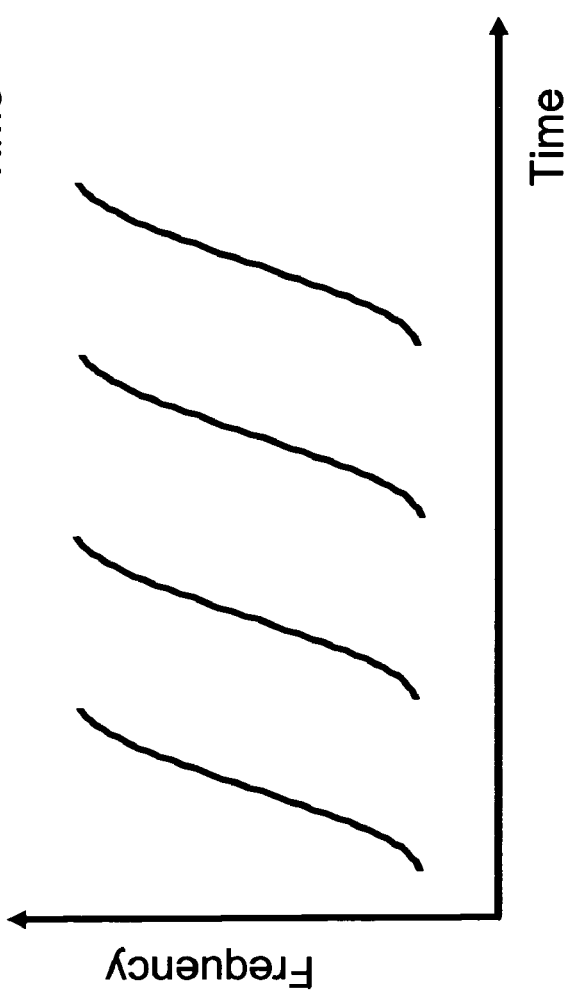

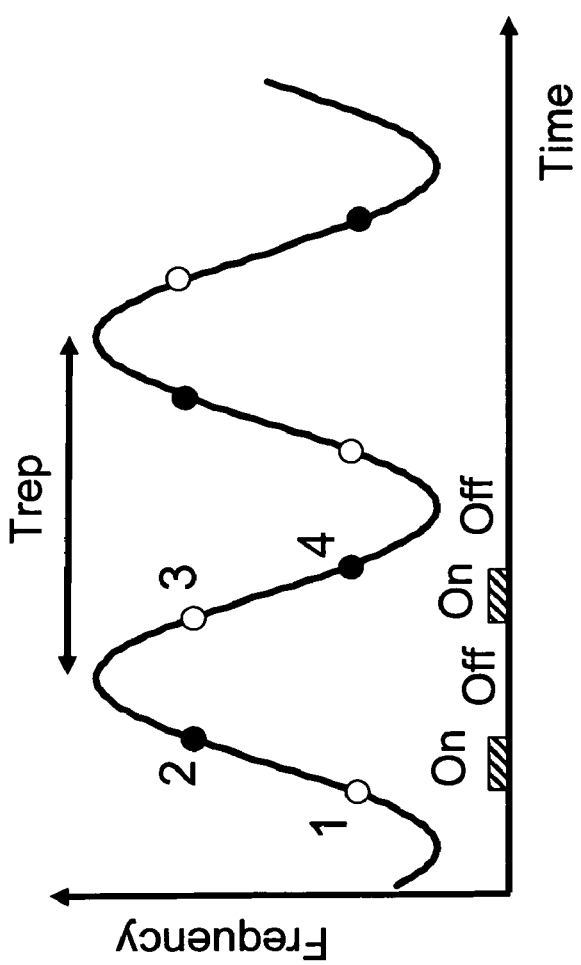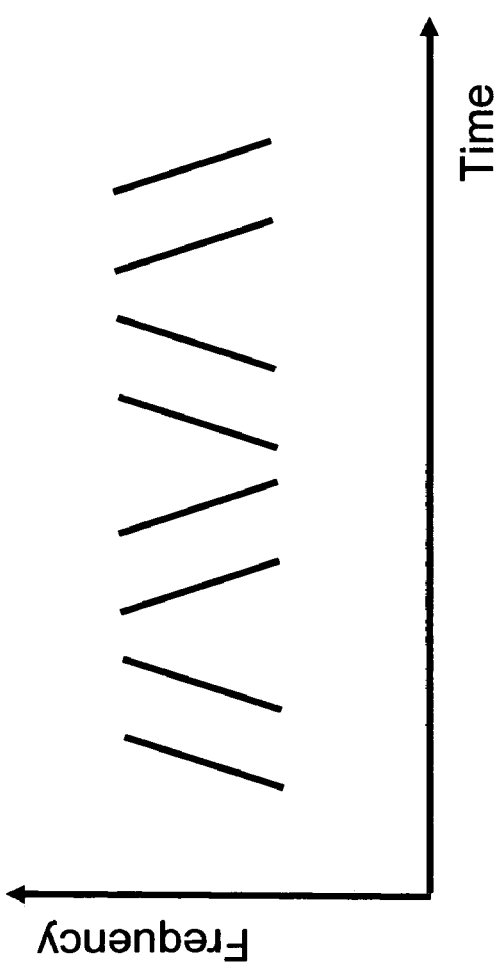

MODE LOCKING METHODS AND APPARATUS

RELATED APPLICATIONS

This application claims priority to U.S. Provisional Patent Application 60/645,359 filed on Jan. 20, 2005, the disclosure of which is herein incorporated by reference in its entirety.

GOVERNMENT SUPPORT

This invention was made with government support under Grant Number ECS-0119452, awarded by NSF, Grant Number EY011289, awarded by NIH, and Grant Number FA9550-04-1-0046, awarded by the Air Force. The government has certain rights in the invention.

FIELD OF THE INVENTION

The invention relates generally to the field of wave generation. In particular, the invention relates to Fourier Domain Mode Locking (FDML) and applications thereof.

BACKGROUND OF THE INVENTION

In many industries and technical areas of research, various systems and devices are used to obtain precise measurements or imaging. In conjunction with the need for precision, there is also a demand for high speed data collection. To satisfy these two criteria, many wave-based technologies are used. Specifically, electromagnetic radiation, in general, often in the form of light, is used in different applications to obtain measurement data. Typical applications include optical coherence tomography (OCT) and other interferometric based approaches.

However, different measurement applications often require additional conditions for satisfactory results. The source of the electromagnetic radiation and the resultant output wave characteristics are often deficient with respect to a set of parameters. For example, some sources produce waves that are low power or only use a portion of the available spectral intensity. Linewidth limitations plague other wave sources. As a result, many industrial and technical applications are limited by the wave generating component of the system.

Accordingly, a need therefore exists for wave sources with improved power delivery and enhanced utilization of available spectra. Furthermore, a need exists for devices, systems, and methods that enable high speed profilometry, measurement, and imaging over long distances.

SUMMARY OF THE INVENTION

In part, the invention relates to methods and apparatus for the generation of fast frequency swept waveforms and chirped pulses by synchronous frequency tuning. Thus, the generation of rapidly tunable narrowband waveforms or frequency swept continuous wave light or light pulses is one aspect of the invention. In the optical domain, wavelength tunable, narrow band light sources can be used for a multitude of applications. Suitable applications include, but are not limited to: optical coherence tomography (OCT), chirped radar, Fourier domain reflectometry, fast or high performance absorption, emission or Raman spectrometers, optical network analyzers, heterodyne analysis, and the generation of short laser pulses with high energy by compressing frequency chirped light pulses. The techniques disclosed herein can also be extended to other wave phenomena such as electromagnetic radiation, in general, and for acoustic waves.

In one aspect the invention relates to a frequency varying wave generator. The generator includes a gain element adapted to amplify a wave having a wavelength, a time varying tunable wavelength selective filter element in communication with the gain element, the tunable filter element adapted to selectively filter waves during a period T, and a feedback element in communication with the tunable filter element and the gain element, wherein the tunable wavelength selective filter element, the gain element and the feedback element define a circuit such that the roundtrip time for the wave to propagate through the circuit is substantially equal to a non-zero integer multiple of the period T. The wave generator can also include an optical compressor in optical communication with the circuit.

In one embodiment, the waves are electromagnetic waves and have wavelengths in the range of about 600 nm to about 2000 nm. The generated waves can also have wavelengths in the range of about 1200 nm to about 1600 nm. The tunable filter element can be a tunable band-pass filter. In one embodiment, the time varying tunable wave length selective filter element and the gain element are a single apparatus. In one embodiment, the filter element is a passive filter. The filter element can be self-tuning. The tunable filter element can include, but is not limited to an acoustic-optical filter, an electro-optical filter, a Bragg filter, a graded interferometric filter, a prismatic filter, a grating filter, a Fabry Perot filter, a Mach Zehnder filter, and combinations thereof. The feedback element can further include a means for performing dispersion management. The means for performing dispersion management can include, but is not limited to an optical fiber, a free space element, a telescope element, a multi-pass cavity element and combinations thereof. The feedback element can also include, but is not limited to an optical fiber, a free space element, a waveguide, a telescope element, a multi-pass cavity element, and combinations thereof. The wave generator can also include an energy extraction element in optical communication with the circuit. The gain element can include, but is not limited to a semiconductor optical amplifier, a fiber amplifier, a dye amplifier, an excimer amplifier, a solid state amplifier, a Raman amplifier, a gas amplifier, a Brillouin amplifier, a parametric amplifier and combinations thereof. The feedback element can also include at least two mirrors. In one embodiment, the energy is extracted at two or more different points in the circuit to generate temporally shifted output waves. The energy is extracted at two or more different point in the circuit to generate temporally shifted output waves which are combined in an external device in one embodiment.

In another aspect, the invention relates to an apparatus adapted for generating waves having temporally varying frequencies. The apparatus includes a gain element adapted for amplifying waves having different wavelengths, a time varying tunable wavelength selective filter element, a feedback element in communication with the gain element and the tunable filter element, the tunable filter element, gain element and feedback element defining a circuit such that the roundtrip time of the wave substantially equals a non-zero integer multiple of a periodic time T during which the tunable filter element is tuned.

In one embodiment, the energy is extracted at two or more different points in the circuit to generate temporally shifted output waves. The energy is extracted at two or more different points in the circuit to generate temporally shifted output waves which are combined in an external device in one embodiment. The time varying tunable wavelength selective filter element can have an associated substantially periodic varying wavelength dependent loss or gain. In one embodiment, the apparatus further includes at least one energy extraction mechanism adapted for transmitting energy from the circuit. In one embodiment, the feedback element contains an element for performing dispersion management. The tunable wavelength selective filter element can include a tunable bandpass filter and is tuned continuously over time to generate a frequency sweep. In one embodiment, the circuit defined by the filter element, gain element and feedback element includes, but is not limited to a laser having a linear laser cavity, a laser having a ring cavity, and a laser having a sigma-ring cavity. The circuit defined by the filter element, gain element and feedback element can be a ring laser cavity.

Additionally, the circuit defined by the filter element, gain element and feedback element can be a sigma-ring laser cavity. The tunable wavelength selective filter element can include, but is not limited to a Fabry Perot filter, a tunable etalon filter, an optical grating filter, a spectral filter, an acousto optic spectral filter, an electro-optic spectral filter, a Mach Zehnder or Michelson based filter and a thin film interferometric filter. The tunable wavelength selective filter element and the gain element can be one physical entity such that the gain medium is adapted to provide a tunable wavelength dependent gain factor. In one embodiment, the feedback element is an optical delay line that can include, but is not limited to an optical fiber, a free space beam, a multi-pass cavity, a waveguide, and a telescope assembly. The gain element can include, but is not limited to a rare earth doped fiber amplifier, a dye amplifier, an excimer amplifier, a solid state amplifier, a semiconductor optical amplifier, a Raman amplifier, a gas amplifier, a Brillouin amplifier, and a parametric amplifier.

In another aspect, the invention relates to a method of frequency sweeping a wave generator. The wave generator can include a gain element, a tunable filter having a tuning time period T in communication with the gain element and a feedback element in communication with the tunable filter and the gain element, the tunable filter, gain element and feedback element defining a circuit. The method can include the steps of generating waves; and periodically tuning a tunable filter over a period T, such that the waves travel from the filter element through the circuit and back to the filter element during a time which is a non-zero integer multiple of time T. In one embodiment, the method further includes the step of performing heterodyne measurements using waves from different filter tuning periods. In one embodiment, the method further includes the step of superimposing electric fields of two different waves separated in time, wherein the separation time is longer than one roundtrip time. The waves can be substantially short pulses generated using a compressor.

In another aspect, the invention relates to a laser for generating light having time varying wavelengths. The laser includes a gain element having a spectral bandwidth, a time varying, tunable optical bandpass filter having an optical pass band that is varied during a substantially periodic time T, and a feedback element in communication with the gain element and the filter, forming a laser resonator, wherein the roundtrip time of the optical waves in the resonator is substantially equal to a non-zero integer multiple of the time T. In one embodiment, the laser resonator is an optical fiber based laser resonator. The filter can be a tunable Fabry Perot filter.

Additionally, the feedback element can be single mode optical fiber. The gain element can be a semiconductor optical amplifier. The resonator can include an optical isolator. In one embodiment, the laser can further include a fiber coupler, the fiber coupler adapted to extract energy from the resonator. The feedback element can contain a means for performing dispersion management. In one embodiment, the laser further includes an external optical compressor in optical communication with the laser. In one embodiment, the compressor is adapted to substantially compensate for a relative time delay associated with waves emitted from the laser by regulating the transit time through the compressor for waves having different wavelengths. The compressor can include a dispersion compensating optical fiber adapted to generate temporally short optical pulses from the laser. In one embodiment, the laser can include a pulse analysis system and a feedback control system in communication with the filter. The compressor can be a grating type compressor. In one embodiment, the laser can include an interferometer, the interferometer adapted to superimpose electric fields of two different waves generated by the laser, wherein the waves are separated by a time period longer than one roundtrip time.

It should be understood that the terms "a," "an," and "the" mean "one or more," unless expressly specified otherwise.

The foregoing, and other features and advantages of the invention, as well as the invention itself, will be more fully understood from the description, drawings, and claims which follow.

BRIEF DESCRIPTION OF THE DRAWINGS

The objects and features of the invention can be better understood with reference to the drawings described below, and the claims. The drawings are not necessarily to scale, emphasis instead generally being placed upon illustrating the principles of the invention. The drawings associated with the disclosure are addressed on an individual basis within the disclosure as they are introduced.

FIGS. 1a-1c are graphs of tunable frequency functions suitable for use with illustrative embodiments of the invention;

FIG. 2a is a flow diagram depicting the generation of output waves using the method of post filtering of a broadband light source;

FIG. 2b are graphs corresponding to stages in the flow diagram of FIG. 2a.

FIGS. 17a-17b are graphs depicting time multiplexed outputs for a unidirectional system according to illustrative embodiments of the invention;

FIGS. 18*a*-18*b* are graphs depicting time multiplexed outputs for a linear system according to illustrative embodiments of the invention;

The claimed invention will be more completely understood through the following detailed description, which should be read in conjunction with the attached drawings. In this description, like numbers refer to similar elements within various embodiments of the present invention.

DETAILED DESCRIPTION

The following description refers to the accompanying drawings that illustrate certain embodiments of the present invention. Other embodiments are possible and modifications may be made to the embodiments without departing from the spirit and scope of the invention. Therefore, the following detailed description is not meant to limit the present invention. Rather, the scope of the present invention is defined by the appended claims.

It should be understood that the order of the steps of the methods of the invention is immaterial so long as the invention remains operable. Moreover, two or more steps may be conducted simultaneously or in a different order than recited herein unless otherwise specified.

Figure 1B:
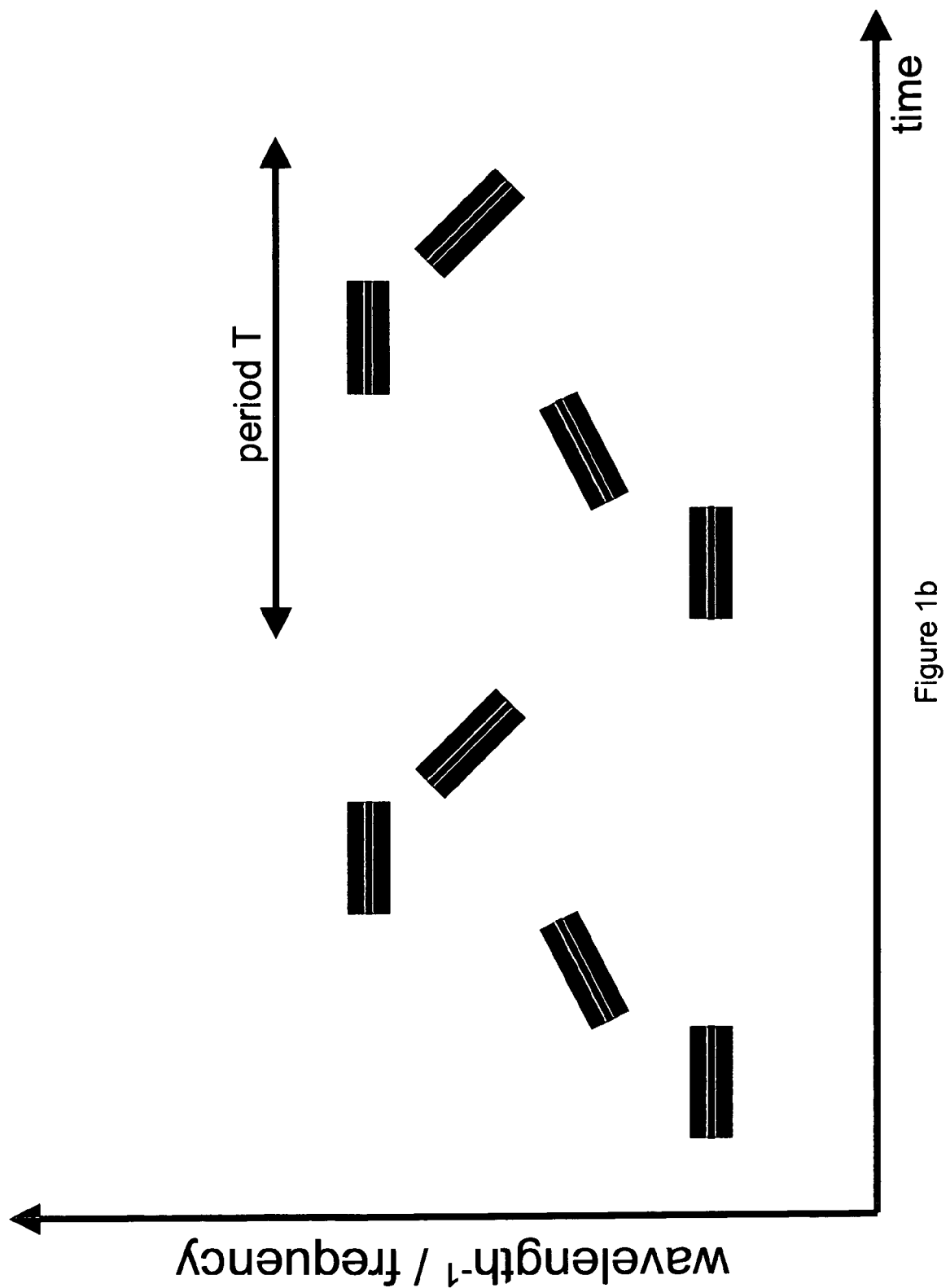
Figure 1C:
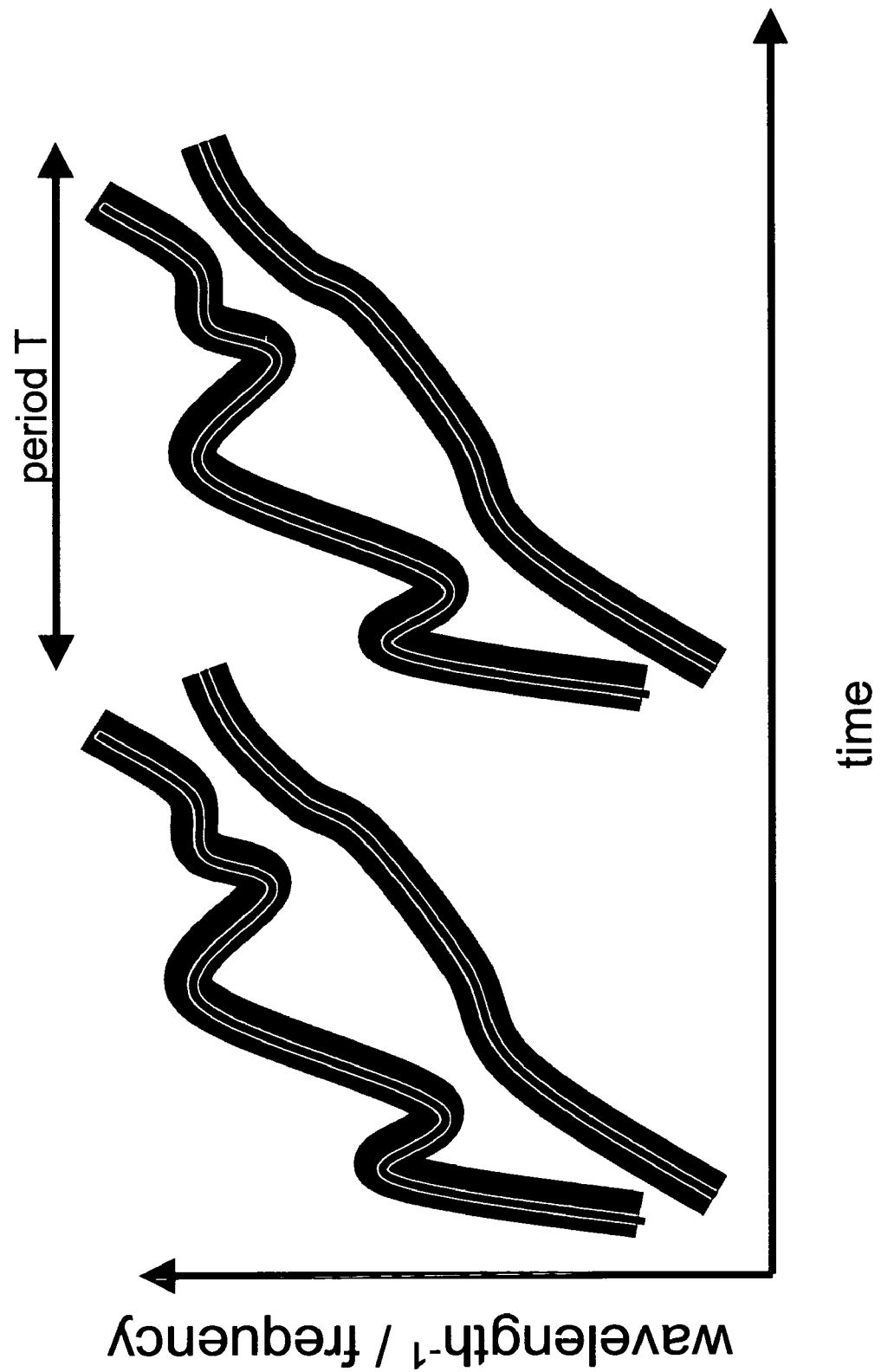

The aspects and embodiments of the invention disclosed herein relate to frequency swept, i.e. time varying wave sources. In particular, a frequency swept laser source is a wave source that changes the frequency or wavelength over time as a periodic function f(t), such as those depicted in FIGS. 1*a-c*. The f(t) function represents the relationship that results when a filter element is tuned over a time period T during a frequency sweep. In general, a frequency sweep for a particular tunable filter is repeated periodically with a time period T, which determines the sweep speed or rate. The frequency sweep can be continuous as shown in the relationships plotted in FIG. 1*a*. As a function of time, the frequency sweep can be a linear or nonlinear sawtooth or triangle wave, a sinusoid, or other periodic form. The frequency sweep or variation in time can also have stepwise constant frequencies or varying frequencies at different periodic time intervals, provided that the variation is periodic as shown in FIG. 1*b*. The simultaneous generation of two or more wavelength regions is also possible as shown in the plot of FIG. 1*c*. For the example depicted in FIG. 1*c*, each sweep of the filter element results in two changing groups of waves passing around a circuit.

The instantaneous linewidth ($\Delta f$) characterizes the frequency distribution of the source at a certain time. This quantity is also inversely proportional to the instantaneous coherence length. Coherence length describes the capability of a wave to interfere with itself over a certain length. Often a narrow instantaneous linewidth and a long instantaneous coherence length are desired. In general for frequency swept laser sources, the operating parameters include, but are not limited to the average output power, brilliance and spectral energy density, noise characteristics, instantaneous linewidth, sweep speed, duration of tuning period, and the accessible wavelength tuning range. The aspects of the invention disclosed herein provide methods and apparatus to significantly improve several or all of these parameters alone or simultaneously.

Frequency varying light sources can use time dependent spectral band-pass filtering of a spectrally broad light source (post filtering) using a filter together with a frequency output as shown in FIG. 2*a* and the corresponding wavelength versus intensity representation shown in FIG. 2*b*. Alternatively, a frequency varying wave source device 4 can be a resonator with a tunable resonance frequency (cavity tuning) as shown in FIG. 3.

Figure 3:
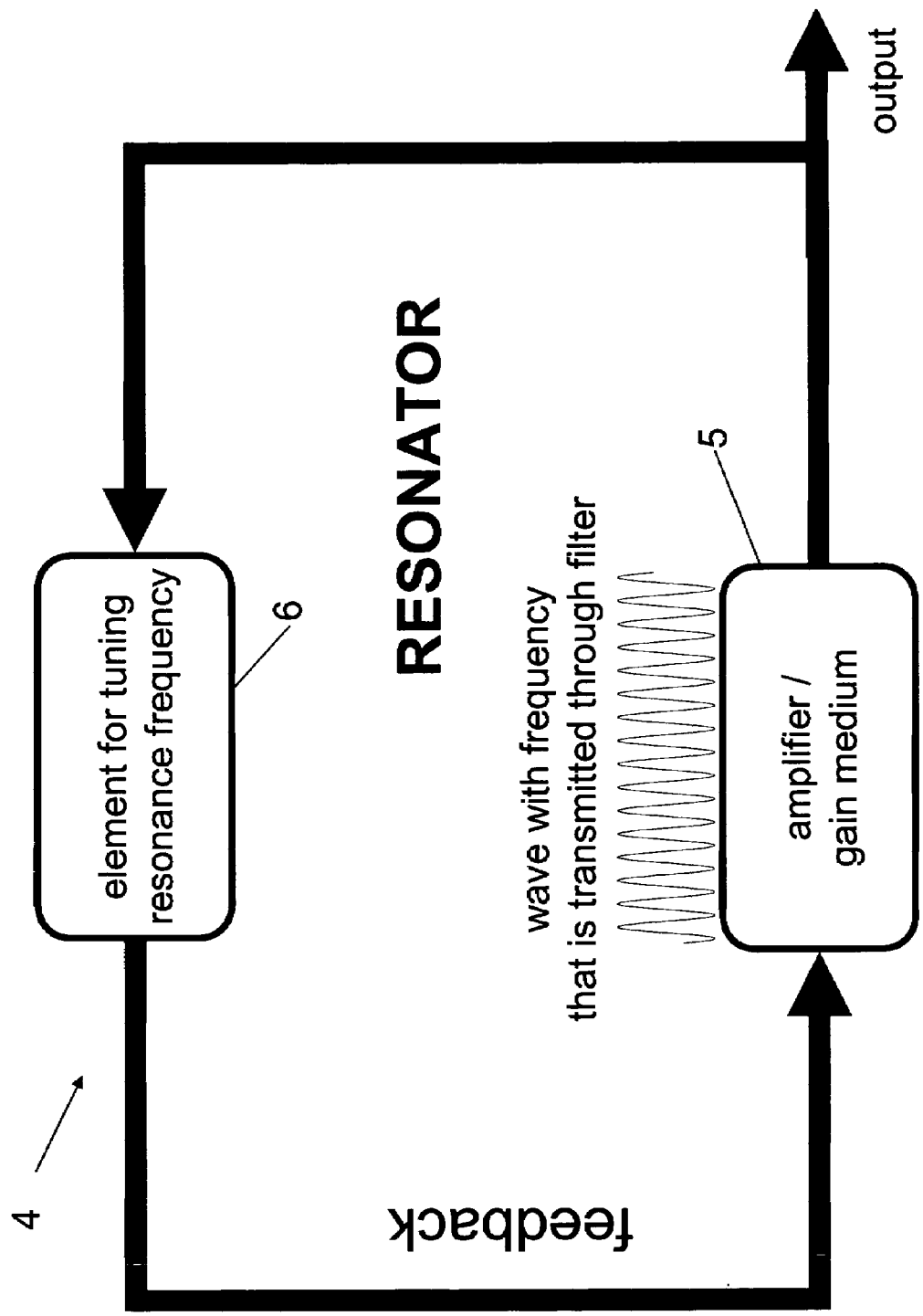
FIG. 3 is a schematic diagram depicting the generation of output waves using cavity tuning.

As shown in FIG. 3, the device 4 is a resonator that incorporates an amplifier or gain medium 5 in a circuit with an element for tuning resonance frequency 6. The circuit can function as a cavity and can be formed by an optical fiber ring. As a result, only the wavelengths of light that are transmitted by the filter reach the resonator such that the feedback resulting from the unidirectional transmitted light allows modes to interact with other filtered modes. For a resonator embodiment, as is the case in post filtering embodiments, the tuning of the resonance is often also achieved by a filter element inside the resonator or cavity (e.g. in a laser). The disadvantage of post filtering is usually low power, because only a small part of the intensity of the spectrally broad light source is used. A further disadvantage is that the instantaneous linewidth generated corresponds to the width of the filter and is never narrower.

For a cavity tuned wave source, the disadvantage is that the maximum sweep speed is not only limited by the maximum speed that the filter can be tuned, as in the case of post filtering, but is also limited by the cavity time constant, the cavity life time. As a result, each time the filter is tuned to another frequency, the previous cavity modes are blocked by the filter, and new modes having the new frequency of the filter require time to build up. In a laser, this limiting time is the time to build up lasing from fluorescence or amplified stimulated emission. Solutions to this problem include using frequency shifting devices inside the cavity, but the maximum tuning speed is then limited by the amount of the frequency shift of the shifting device.

The aspects of the invention disclosed herein enable the generation of fast frequency swept waveforms and chirped pulses by facilitating fast frequency sweeping or variation. This process is only limited by the maximum tuning speed of the filtering element. Applying cavity tuning to match the sweep period, or a harmonic of the sweep period, with the cavity roundtrip time of the wave in the cavity provides various benefits. These benefits and various systems, devices and methods implementing matched tuning and roundtrip times are described in more detail below.

Figure 4:
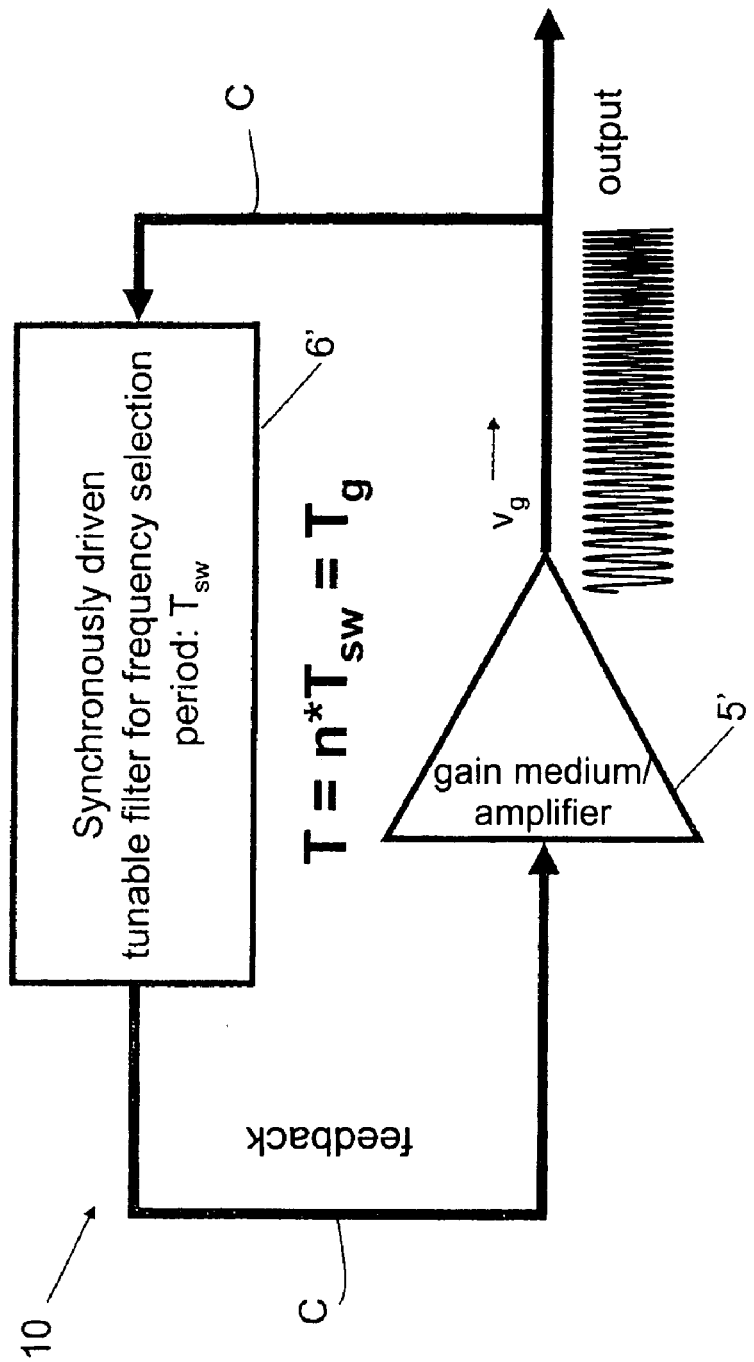
FIG. 4 is a schematic diagram depicting a system for matching tuning period and round trip time according to an illustrative embodiment of the invention.

A system 10 implementing a cavity tuning approach is shown in FIG. 4. The system 10 is suitable for Fourier Domain Mode Locking (FDML) using resonant frequency tuning. As shown, a circuit C connects an amplifier/gain medium with a tunable filter to facilitate feedback within the amplifier. The roundtrip time $T_g$ of a wave is measured relative to the filter location in the circuit C. In one embodiment, the roundtrip time ranges from about 1 microsecond to about 200 microseconds. In another embodiment, the tuning period ranges from about 5 nanoseconds to about 1 microsecond. The tuning or sweep period $T_{sw}$ is the periodic time over which the filter element is tuned to selectively pass waves of varying frequency. $T_g$ and $T_{sw}$ are either substantially the same, or $T_{sw}$ is a higher harmonic of $T_g$. This relation can be expressed by:

$$n \cdot T_{sw} = T_g$$

where n is a positive non-zero integer, $T_{sw}$ is the sweep period or tuning time and $T_g$ is the group roundtrip time of the wave. The period of the filter sweep or variation and the group roundtrip time are synchronized. The group roundtrip time $T_g$ is determined by:

$$T_g = \frac{l}{v_g}$$

wherein $v_g$ is the group velocity and the length of the feedback line or cavity is l. As a result, the feedback is not within one sweep with itself, but within two sweeps. The feedback delay line in the cavity "stores" all frequencies of a complete sweep, in contrast to standard frequency swept sources. Thus, in one embodiment elements in the circuit function as a type of optical memory.

The frequency transmitted through the filter makes one roundtrip and is fed back at the time when the filter is at the same frequency position. The wave does not have to build up again every time the filter is tuned. Using this method, cavities can be swept in frequency rapidly, independently of the cavity life time. This results in a narrow instantaneous linewidth. The fixed phase relation between sequential sweeps makes it possible to observe interference signals between two sweeps. This is usually not possible in standard tunable frequency sources since these two sweeps have no defined phase relation between each other.

The aspects of the invention relate, in part, to "Fourier Domain Mode Locking" (FDML) since the spectrum of the wave is modulated over time, representing a manipulation in the "Fourier domain." This leads to a windowing of the spectrum. Specifically, the spectrum is windowed in the sense that, as the filter is tuned, different groups of waves pass through the filter window at different points in time.

If the filter element is continuously tuned and driven synchronously with the roundtrip time, the output is a sequence of long sweeps in frequency over time. Since the instantaneous spectrum within each sweep is narrow, the instantaneous coherence length is very long. For example in the case of a swept light source, the coherence length can range from about 1 cm to about 40 cm. In combination with the repetitive feedback, this leads to a fixed phase relation between the modes which span the range of the frequency sweep or frequency variation. Thus, the modes are phase locked.

In general, a perfect locking of all modes over the whole spectral range of the sweep can only be expected in the case of a very narrow and repetitive filtering. For more typical cases, a jitter of the phase of modes within the bandwidth of the filter-function typically occurs. However, a phase correlation between modes which are spectrally separated more than the width of the filter function is provided by the filtering. The average phase of all modes within the filter function is stabilized and locked for different spectral positions of the filter.

Figure 8:
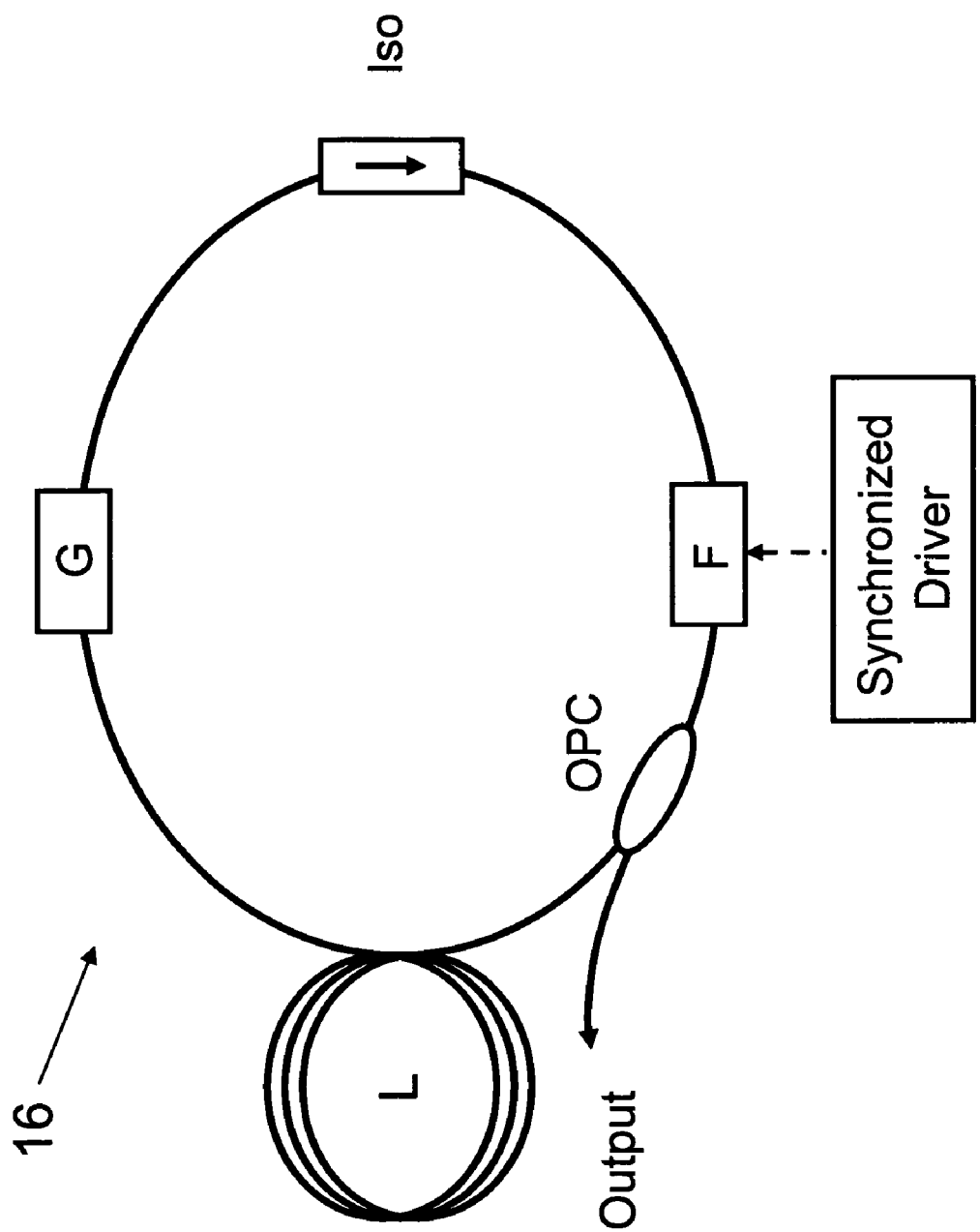

FIG. 4 gives a general description of the apparatus 10 having an amplifier 5' and a tunable filter 6' for Fourier Domain Mode Locking by synchronous frequency tuning. The operation of the system is independent of the cavity design with the matching of tuning time and roundtrip time regulating system operation. Linear cavities, ring cavities, sigma cavities which include a ring and linear portion, figure-8-cavities, multiple coupled cavities or other known cavities can be used. In one embodiment, the resonator or oscillator includes (a) an amplifier or gain medium, (b) a feedback line acting as delay, (c) a wavelength selecting element, e.g. a tunable band-pass filter, and (d) at least one energy extraction mechanism, where at some point a part of the waveform energy is extracted. Also, mechanisms for shifting the gain spectrum of the gain medium are suitable wavelength selecting elements.

When the filter is tuned in wavelength/frequency with a periodic waveform as shown in FIGS. 1a-c, a waveform with periodically varying frequency is generated. This waveform propagates with the group velocity $v_g$. A dispersion free or dispersion managed feedback-line can ensure that the waveform does not change or spread out after one roundtrip, or that the dispersion is specifically designed to influence the performance. As used herein, the term "dispersion managed delay" implies using a dispersion controlling device in an embodiment of the invention or a delay which has substantially no dispersion over the range of generated wavelengths. In some embodiments, a dispersion controlling element is not required.

Figure 5A:
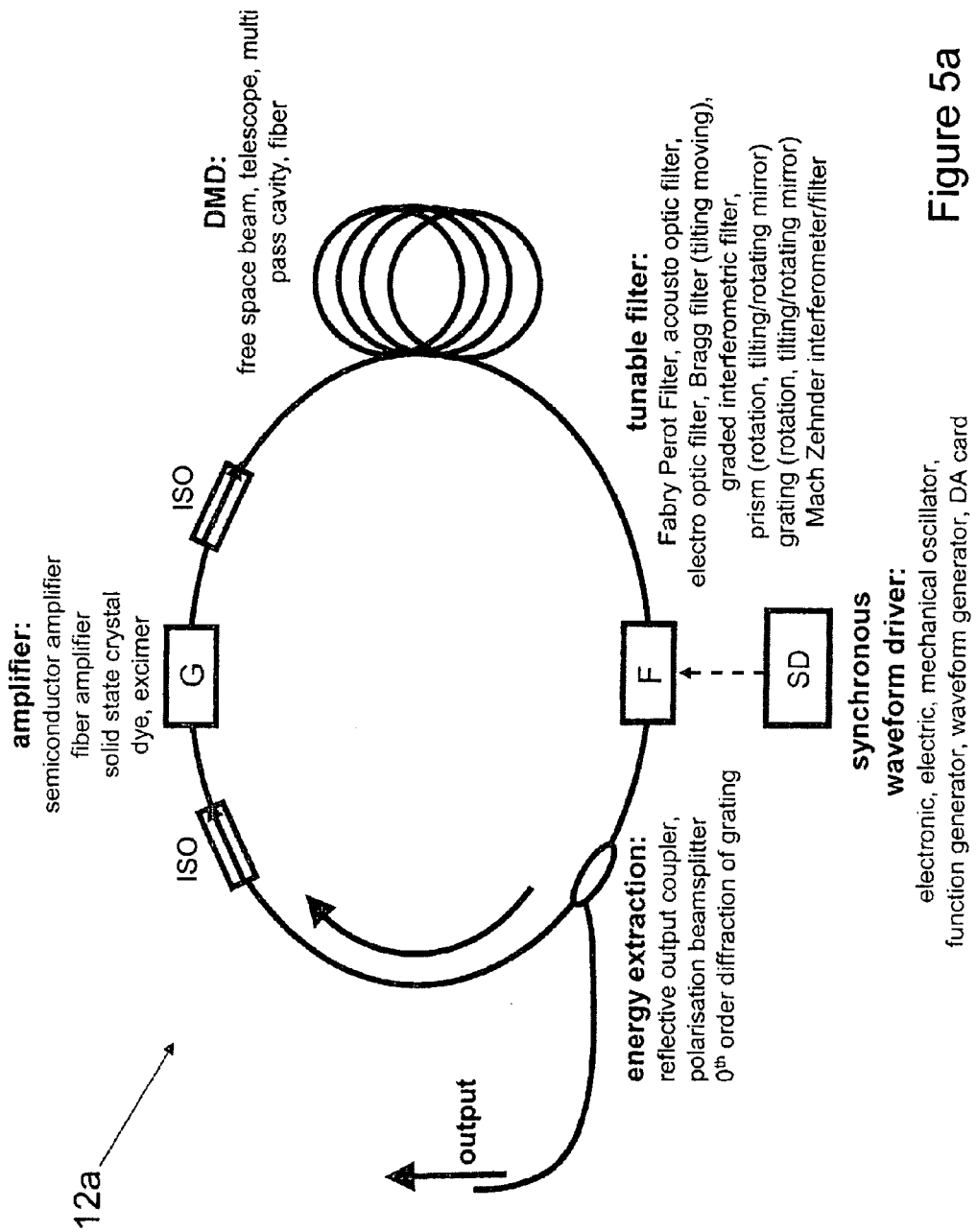
FIGS. 5a-5d are schematic diagrams depicting optical systems according to illustrative embodiments of the invention.
Figure 5B:
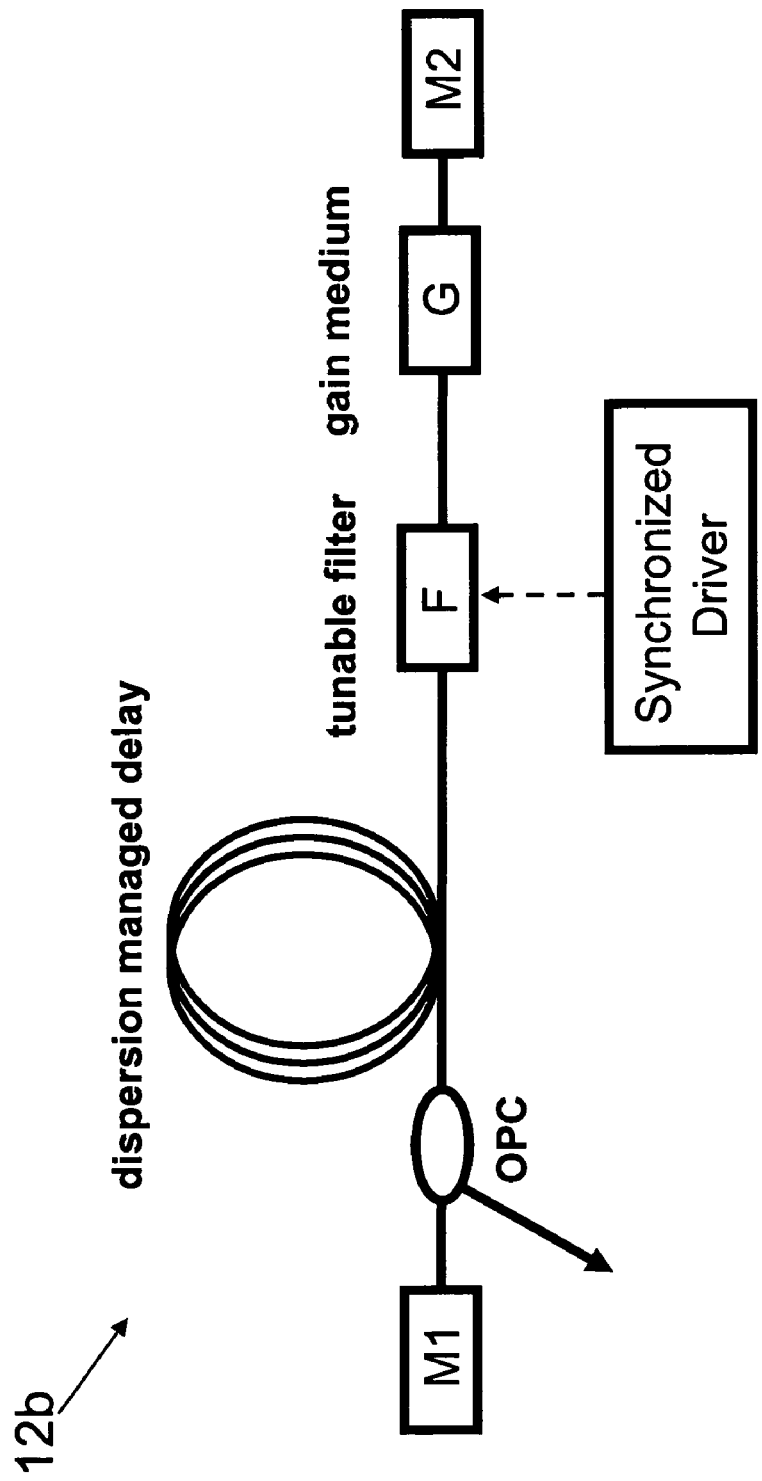
Figure 5C:
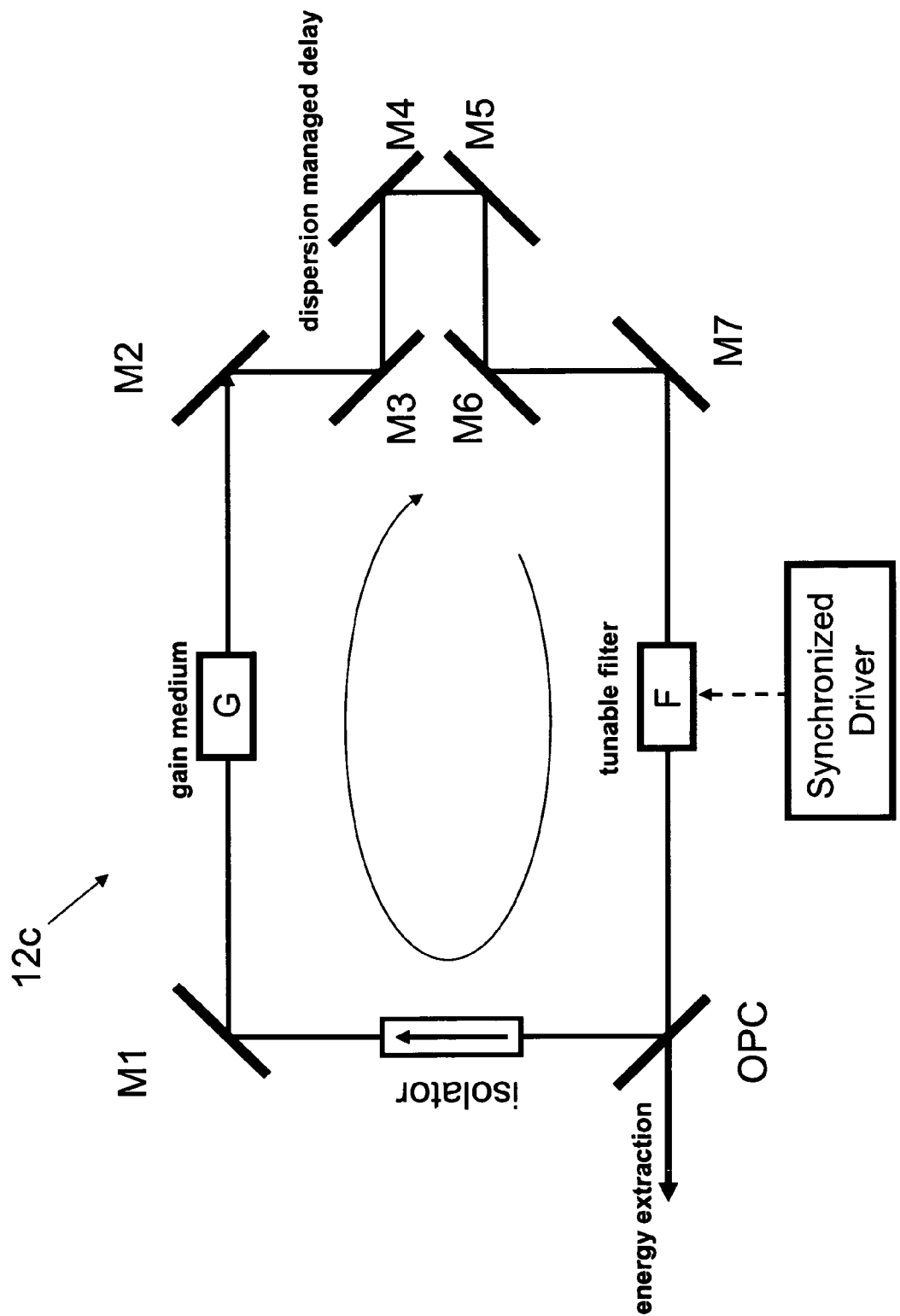
Figure 5D:
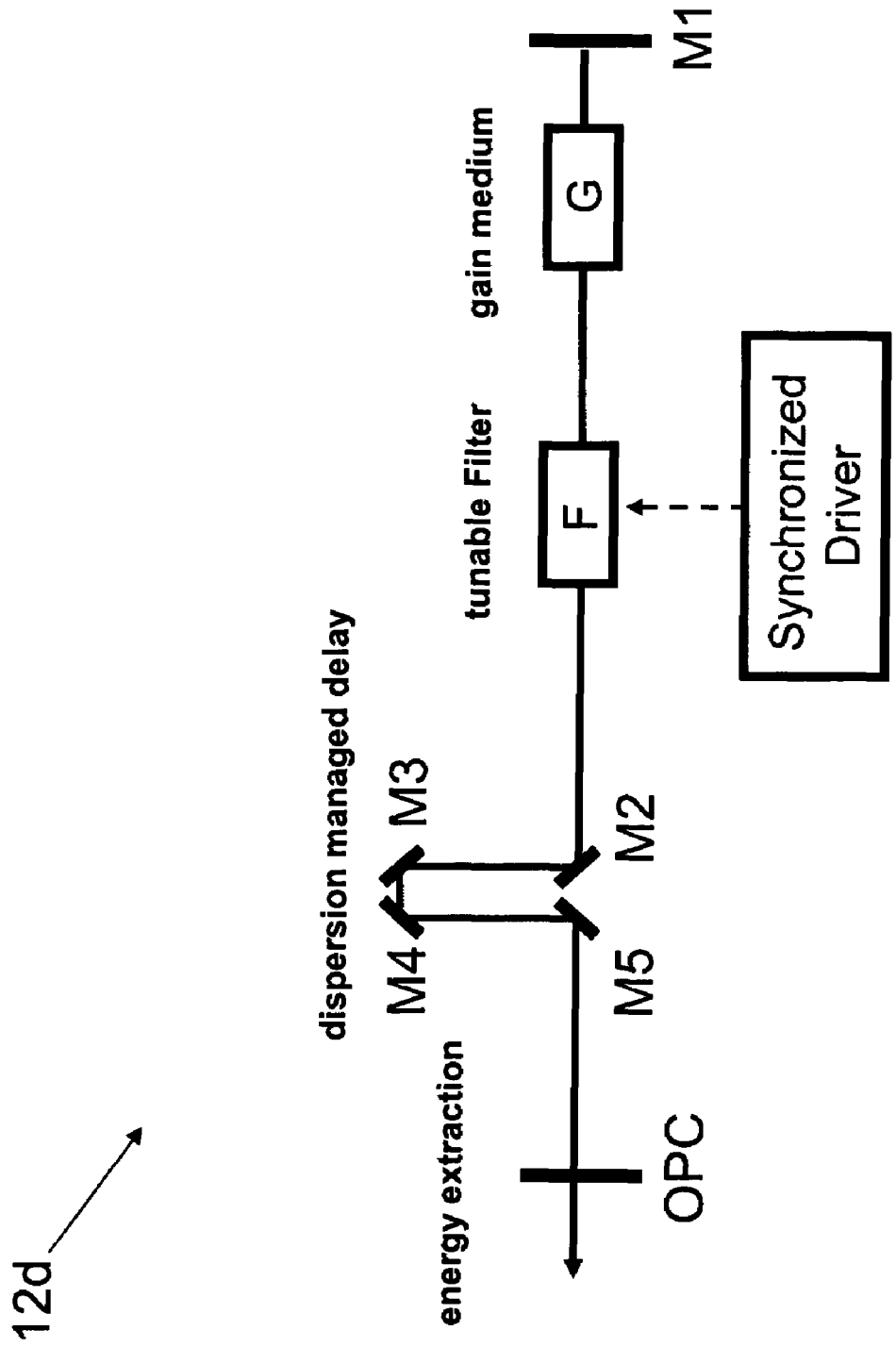

FIGS. 5a-d depict various embodiments for time varying wave sources such as fast frequency swept or tunable laser-based systems. FIG. 5a depicts a ring cavity system 12a. FIG. 5b depicts a linear fiber based cavity system 12b. FIG. 5c depicts a bulk optic ring cavity system 12c. FIG. 5d depicts a bulk optic linear cavity system 12d.

The different embodiments depicted in FIGS. 5a-5d and those discussed in more detail below include amplifiers/gain media G; isolators ISO; tunable filters F; synchronous waveform drivers SD; mirrors M1, M2, etc.; fiber delay line or dispersion managed delay line L; dispersion managed delay elements DMD; energy extraction elements EE; optical circulators CIR; Feedback delay line FDL; optical couplers OC; output couplers OPC; interferometers IF and others.

In each figure, it is understood that use of the same or similar reference characters in multiplied figures is not intended to limit those embodiments, but rather allows any suitable component element to be used in a particular embodiment. For example, the use of the character G to designate an amplifier or a gain medium in various figures does not limit those figures to any particular amplifier or gain medium, other than one suitable for a particular application.

The following table gives examples for possible combinations for the different embodiments and aspects of the invention that substantially match roundtrip time to tuning time T, or multiples thereof.

| | |
|---|---|
| a) Amplifier/Gain medium | Laser medium (semiconductor amplifier, fiber amplifier, doped glass, solid state crystal, dye, excimer, gas, polymer, and free electrons), nonlinear effect (Raman, Brillouin, parametric amplification or conversion), and combination of multiple gain media. |
| b) Feedback delay line | Optical fiber, telescope, free space beam, multi pass cavity, waveguide, transparent bulk material. |
| c) Wavelength selecting element/Filter | Tunable Fabry-Perot filter, acousto-optic tunable filter, actuated dielectric band-pass filter, tunable fiber-Bragg grating, tunable etalon, thin film filter, Lyot Filter, mechanically actuated grating/prism assembly, Mach Zehnder interferometer, Michelson interferometer, gain shifter for gain medium (e.g. current controller), tunable Brewster plates, array waveguides. |
| d) Energy extraction/Coupler | reflective output coupler, polarization output coupler, fiber coupler, circulator, beamsplitter, $0^{th}$ or other order diffraction of grating |
| e) Dispersion managed delay elements | Fiber delay lines; optical compressors; mirrors and other bulk optics |

As an example, consider a fiber ring cavity system 12a as depicted FIG. 5a. As shown in FIG. 5a, different components can be used to create a multitude of embodiments by varying the combination and selection of elements that form a particular embodiment. The amplifier/gain medium G can include a semiconductor amplifier chip for wavelength operation between 1250 nm and 1350 nm. However, in various embodiments the wavelengths range from about 600 nm to about 2000 nm. The wavelength-filter F can include a tunable PZT actuated Fabry Perot filter with filter a width of 0.135 nm. A sine wave of 29 kHz generated by a digital function generator SD and an amplifier is used to drive the filter F. The period of the sine wave frequency tuning is matched to the roundtrip period of the fiber ring laser. A fiber coupler is used as an energy extractor to direct the output waves to a suitable application. Other candidate devices are listed in the figure for various components in the circuit. However, the components listed are not intended to be limiting and other components can be used.

Figure 6:
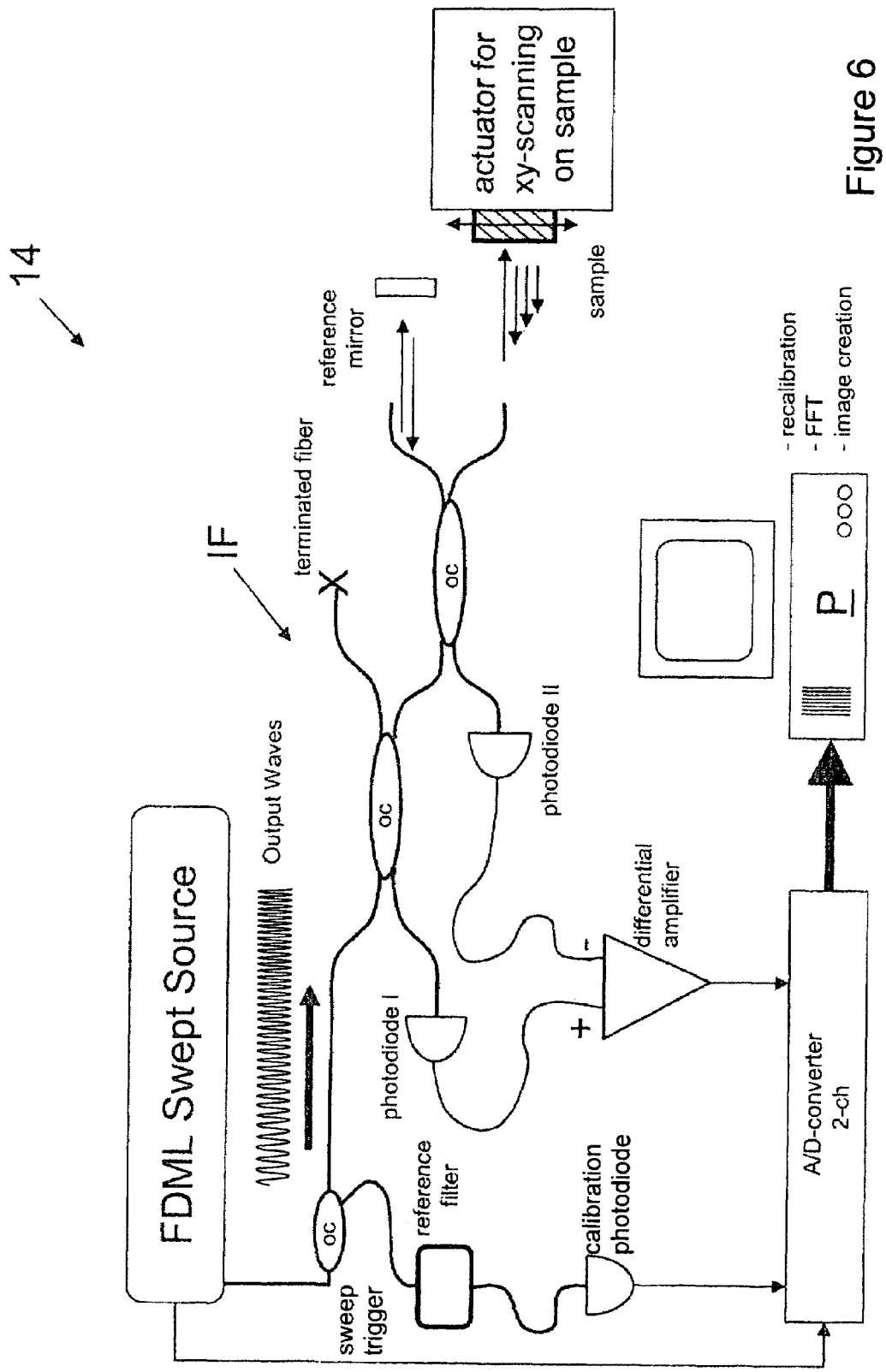
FIG. 6 is a schematic diagram depicting an FDML source coupled with an interferometer according to an illustrative embodiment of the invention.

For the system 12A shown in FIG. 5a and various other systems disclosed herein, the roundtrip period is estimated by the physical length of the cavity and the RF spectrum of the output power in non-lasing operation. The roundtrip value can be determined by generating a 1 Hz stepwise increase of the drive frequency, monitoring the power output of the source and the oscilloscope trace of the detector signal of a Michelson interferometer to measure the coherence. An embodiment suitable for performing this estimation process is shown in FIG. 6, wherein the sample used would have an isolated reflection.

Synchronous frequency tuning operation can be obtained when the sine wave drive frequency is matched to within 1 Hz of the frequency of the cavity roundtrip. The energy extraction can be performed by a 50:50 fiber coupler. Also, an isolator can be used to achieve unidirectional lasing. Two optional isolators ISO are included in the system 12a. The delay line or feedback line is 7 km long, single mode fiber (type Corning SM28e, from Corning, N.Y., USA).

Additional dispersion management is not necessary because the zero dispersion point of the fiber is at 1313 nm. Such a system operates with a wavelength sweep range between 1250 nm and 1360 nm. The sweep period is 29 kHz, and because two sweeps per period have been generated, the effective sweep repetition rate is 58 kHz, counting the increasing and decreasing frequency sweeps individually. The average output-power is greater than 10 mW and the instantaneous coherence length is about 4 cm.

The observed coherence length is at least on the order of 4 cm. This is significantly longer than the 10 mm expected from the filter width of 0.135 nm. This coherence length demonstrates that the exemplary system 12a discussed above does not just filter the broad spectrum, but also narrows the spectrum or linewidth by the repetitive feedback. The sequential roundtrips and the mode competition in the laser lead to the effect, that only modes with a frequency that matches exactly the spectral filter position are effectively amplified. This effect corresponds to a much narrower effective filtering than the transmission width of the Fabry Perot filter. This effect of line-narrowing is usually only observed at continuous wave lasers or in lasers with extremely slow tuning speed of several Hertz.

The system 12a can also be operated by applying a sine wave frequency sweep period that matches the second harmonic of the cavity roundtrip time. In this case, the driving waveform for the filter is set to a frequency of 58 kHz. Because two sweeps per period have been generated, the effective sweep repetition rate is 116 kHz, counting the increasing and decreasing frequency sweeps individually. The tuning range is limited by the tuning range of the amplifier-filter assembly at this frequency.

FIG. 5b shows a linear system 12b that includes two mirrors M1 and M2 to define a portion of the cavity that is linked by a length of optical fiber with intervening elements in the circuit. These elements include a device for dispersion managed delay in the form of an optical delay line; a filter F; a gain medium/amplifier G and driver for tuning the filter F and an output coupler OPC for energy extraction. Similarly, FIG. 5c shows a ring system 12c that uses a plurality of mirrors M1-M2 in lieu of optical fiber segments to define a unidirectional circuit for wave propagation and mode locking. FIG. 5d shows a linear system 12d similarly to the system 12b wherein the dispersion managed delay is replaced by a free space beam path rather than an optical fiber. Thus, FIGS. 5a-5d depict representative embodiments suitable for use with a frequency varied optical system.

An exemplary system 14 for the application of a FDML swept laser for optical coherence tomography (OCT) imaging is shown in FIG. 6. The system 14 includes an FDML swept laser source in communication with an interferometer IF using lengths of optical fiber connected using optical couplers OC. The FDML source can be any of the sources described herein such as, for example, those shown in FIGS. 4-5d. The system 14 also includes a processor P for performing at least one of recalibration, fast Fourier transforms of any data collected, system control and/or image generation. The sample of interest is attached to an actuator to facilitate scanning in different directions. A reference mirror is also included for interferometric calculations and scan control. The interferometer IF shown is in a dual-balanced configuration that is used to cancel excess noise in the light source. These dual-balanced configurations incorporate a single coupler, a coupler in combination with one or more circulators, or couplers whose splitting ratios are not 50:50, but are optimized to improve power throughput from the light source or detection sensitivity.

The output waves generated using the FDML source are generated as the source is swept. The sweep information is transmitted to an A/D converter for use by the processor P. The path of the output waves splits to a reference arm and a sample arm. The reference arm includes a reference mirror, the sample arm includes means to transmit light to a sample and collect the backreflected light. The backreflected light from reference and sample arm is interfered and detected by two photodiodes. These photodiodes connect to a differential amplifier that connects to the A/D converter that receives the sweep trigger from the FDML source. The A/D converter transmits data to the processor P.

In many applications, the sensitivity and resolution performance depend on calibrating the exact frequency sweep with time, when measurements of the interference signal are performed. This is accomplished by detecting the light output from the FDML laser using a Fabry Perot filter or other reference filter having a periodic frequency or wavelength characteristic. The filter output is detected and used to measure the frequency sweep with time by a calibration photodiode. This in turn can be used to calibrate the measurement of the interferometer output or to clock the A/D conversion of the detected interferometer output in order to compensate for non-uniformities in the frequency sweep.

The following sections describe various embodiments and enhancements. These embodiments are shown using fiber optic lasers, however these also apply to embodiments of lasers using bulk optics, integrated optical waveguides, or other known methods for building such lasers.

Figure 7:
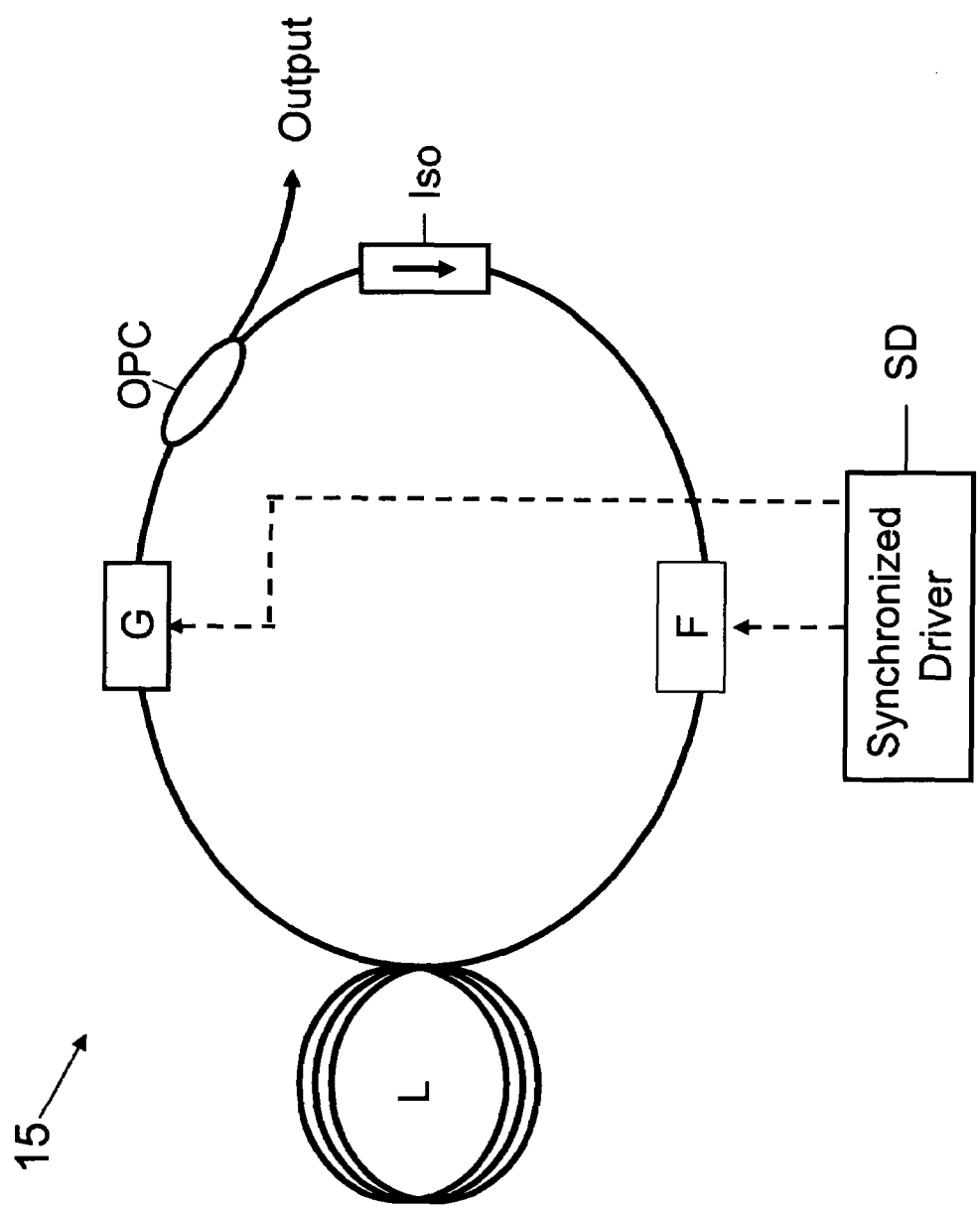
FIGS. 7-12 are schematic diagrams depicting ring cavity systems according to illustrative embodiments of the invention.

FIG. 7 shows a ring laser 15 suitable for use as an FDML source that includes a gain medium G, filter F, delay L, isolator ISO and output coupler OC. The position of the elements; the gain medium G, filter F, fiber delay L, isolator ISO and output coupler OC, may be different from that shown in FIG. 7 and may be optimized depending on their characteristics and the desired application. The cavity is in a ring configuration and includes optical fiber that is typically single mode. The gain medium G is a semiconductor amplifier, a combination of semiconductor amplifiers, a Raman amplifier, a nonlinear optical device producing gain, or other gain device which produces amplification or gain over the wavelength/frequency range of operation.

The filter F is a device which has a narrow bandwidth or other specific desired filter function whose center wavelength or frequency is dynamically tunable under external control by a driver. The filter F can be a Fabry Perot or resonator based filter, an acousto optic tunable filter, diffraction based device, thin film device, or other device which produces frequency selection. The filter wavelength or frequency can be dynamically tuned or varied using a suitable driver. The filter F may operate with a predetermined variation of center wavelength/ frequency with time. Examples of these filters F include filters which are actuated by sinusoidal motion of piezoelectric transducers, galvanometers, or MEMS devices. When actuated at high frequencies, many filters have the property that the variation of center wavelength or frequency is sinusoidal in time. In this case the frequency (repetition rate) and phase of the sinusoidal like variation in time can be driven or controlled externally.

In other cases, the filter F can be driven in order to achieve a desired variation of the center wavelength or frequency with time. For example, an acousto optic tunable filter (AOTF) can be driven to achieve virtually arbitrary variations of the center wavelength or frequency with time. In the case of a homogeneously broadened gain medium, mode competition between the different lasing wavelengths within the different windows of a filter can lead to instabilities in the operation of the system.

Stabilization and control of the relative transmittance of the filter with respect to the different lasing wavelengths may be required to address such instabilities. A suitable control mechanism can be used to monitor the power of the multiple active spectral modes, for example by using a spectrograph with a CCD camera. As a result of the monitoring, the control can adjust the transmittance of the filter such that in wavelength regions with higher power the transmittance is reduced and the loss is increased.

Another method for achieving multiple wavelength lasing uses cavities with multiplexed gain media, which prevents mode competition in the gain medium. In the case of an inhomogeneously broadened gain medium, mode competition between simultaneous lasing modes in multiple wavelength regions does not create instability. Yet for the case of homogeneously broadening, a minimum spectral separation threshold is used.

Synchronously driving the gain as a periodic function of the cavity round trip time or its higher harmonics, commensurate with the periodic tuning of the filter is also beneficial in some embodiments. This amplitude modulation can be used to equalize the power output, compensating for variations in the gain of variations of the devices in the cavity with frequency or wavelength. In addition, for some applications, specific output intensity profiles in time may be desirable. For example, in the case of optical coherence tomography, optimum measurement resolution with low sidebands is usually achieved using a Gaussian like intensity profile in time.

In general, arbitrary frequency sweeps or modulations as well as intensity modulated waveforms can be generated by synchronous driving of the tunable filter and the gain. Other active elements can be used in the cavity to influence phase or amplitude of the light to optimize performance. Such elements can include, but are not limited to acousto optic devices, electro-optic devices, LCD elements, deformable mirrors, etc. These elements can be applied inside or outside the cavity.

The fiber delay line L is a length of single mode fiber or combination of single mode fibers with varying dispersion properties. In the case of bulk optical designs, other devices which produce time delays may be used, such as mirror arrangements. The fiber delay functions to produce a delay in the propagation of light around the laser cavity. The fiber delay may be "dispersion managed," such that a fiber with desired dispersion characteristics, or a combination of fibers with differing dispersion properties may be spliced together in order to achieve a desired dispersion for the delay or a dispersion managed delay (DMD).

Dispersion management can also be performed by an optical compressor device, which compensates or introduces the desired amount of dispersion. Optical compressor devices suitable for the systems and methods disclosed herein include, but are not limited to dispersion compensating fibers, grating compressors, prism compressors and chirped dielectric mirror structures. The delay line and a suitable compressor are type of dispersion managed delay (DMD). In some embodiments, the total group velocity dispersion of a ring laser is substantially reduced or minimized to reduce the variation in time delay of the various frequencies of light upon transiting the laser cavity. As previously described, the filter is driven with a synchronized driver such that its wavelength or frequency is varied or scanned periodically with a period substantially equal to the round trip time or a harmonic of the round trip time of the cavity. This operating condition ensures that comparable wavelengths or frequencies of light are amplified by the gain medium at periodic time intervals spaced by one round trip or multiples thereof.

FIG. 7 shows a system 15 having one isolator ISO in the ring cavity; however, more than one isolator may be used depending upon the embodiment. The isolator(s) can be Faraday isolators, nonreciprocal devices, or other devices which function to transmit light propagating in one direction while attenuating light propagating in the reverse direction. The isolator(s) are used to prevent undesired feedback to the gain and to achieve unidirectional operation of the ring laser and optimize power. However, embodiments are also possible which do not require isolators and operate with bidirectional lasing. Finally, in some embodiments and applications an isolator may also be required in the output of the cavity in order to prevent feedback to the cavity.

The output coupler which is used to direct the generated waves can be a fiber optic coupler, fiber to bulk optical device with a partially reflecting mirror, micro optic device, or other device which functions to couple out a desired fraction of the intensity in the ring cavity. In one embodiment, the coupling ratio can be chosen to optimize the output power. Also, the fiber and components in the laser can be either polarization independent or polarization maintaining. Polarization controllers (not shown) can also be used in the fiber cavity to control the polarization states of the light.

Without loss of generality, different laser cavity configurations can be used depending upon the properties of the devices used and optimization of desired performance characteristics of the laser. For example, the cavity embodiment 15 shown in FIG. 7 is appropriate for a filter operating in a transmission mode, such that desired wavelengths/frequencies are transmitted through the filter. Depending upon the type of filter used, the filter may have the property that light, which is not in the pass band, is retroreflected rather than transmitted. In this case, an isolator is required between the filter and the gain medium to prevent feedback of the unwanted light from the filter to the gain medium. The output coupler can be placed at various positions in the cavity depending upon the desired operation.

In FIG. 7, the output coupler OPC, such as an optical coupler, is positioned after the gain element or amplifier. This provides a higher power output since the intensity in the cavity is highest immediately after the gain. However, this can also couple out spontaneous emission and other parasitic noise from the amplifier. The output coupler may also be placed after the filter and before the gain as shown in the system 16 shown in FIG. 8. This configuration provides a low noise output since the output is coupled after the filter. However, since the intensity in the ring cavity is attenuated by parasitic losses in the filter, the output powers are lower than in previous, high power, configuration of FIG. 7. The output can be used in various applications such as an OCT source, chirped radar, and other applications as appropriate.

In certain embodiments, more than one isolator may be required or no isolator may be required. For example, in some cases, depending upon the properties of the gain, unidirectional operation is desired in order to reduce parasitic effects such as spatial hole burning, four wave mixing and other nonlinear effects in the gain and/or to optimize the output power available. Also, depending upon the application of the laser, additional isolators may be required to prevent parasitic feedback into the laser output.

Figure 9:
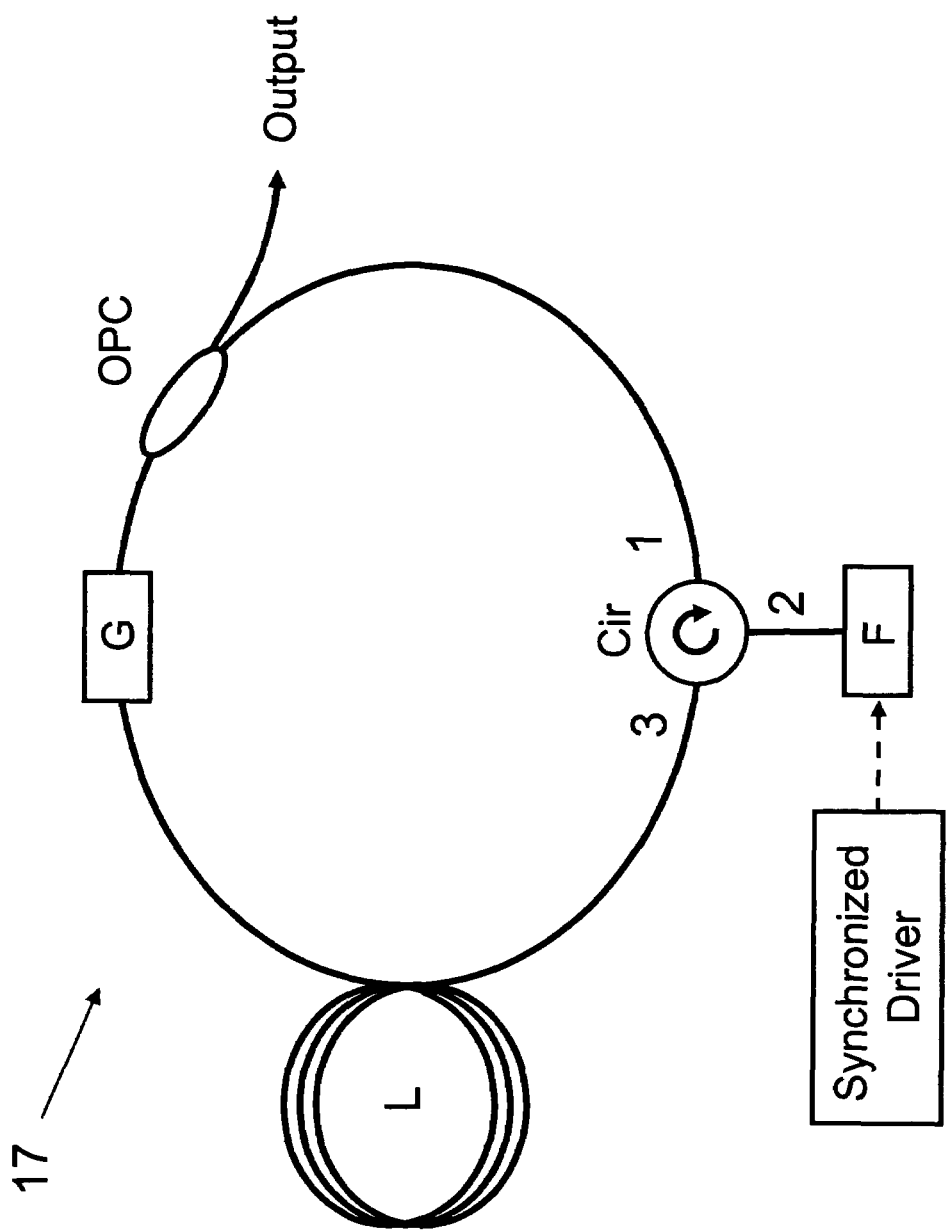

FIG. 9 shows a ring laser system 17 that includes a filter F which operates in a reflection mode. The system 17 shown also includes an optical circulator that connects three different ports (1, 2, and 3). Many types of filters operate by reflecting rather than transmitting light within a narrow bandwidth at a tunable center wavelength or frequency. Examples of these types of filters include, but are not limited to diffraction gratings and mechanically actuated mirrors operated in retro reflection mode, certain types of acousto optic tunable filters, and others. In the cavity configuration of system 17, the filter element is connected to the cavity with an optical circulator CIR or other nonreciprocal element having a function such that it transmits light incident from port 1 to port 2 and from port 2 to port 3, but does not transmit light in the reverse direction from port 2 to 1, from port 3 to 2, or from port 1 to 3. Light incident on port 1 of the circulator is transmitted to the filter where desired wavelengths/frequencies are retroreflected. This retroreflected light is incident on port 2 of the circulator and is transmitted to port 3, where it re-enters the ring. If the circulator transmits light from port 3 to 1, an additional isolator ISO may be required if unidirectional operation of the ring is desired.

Figure 10:
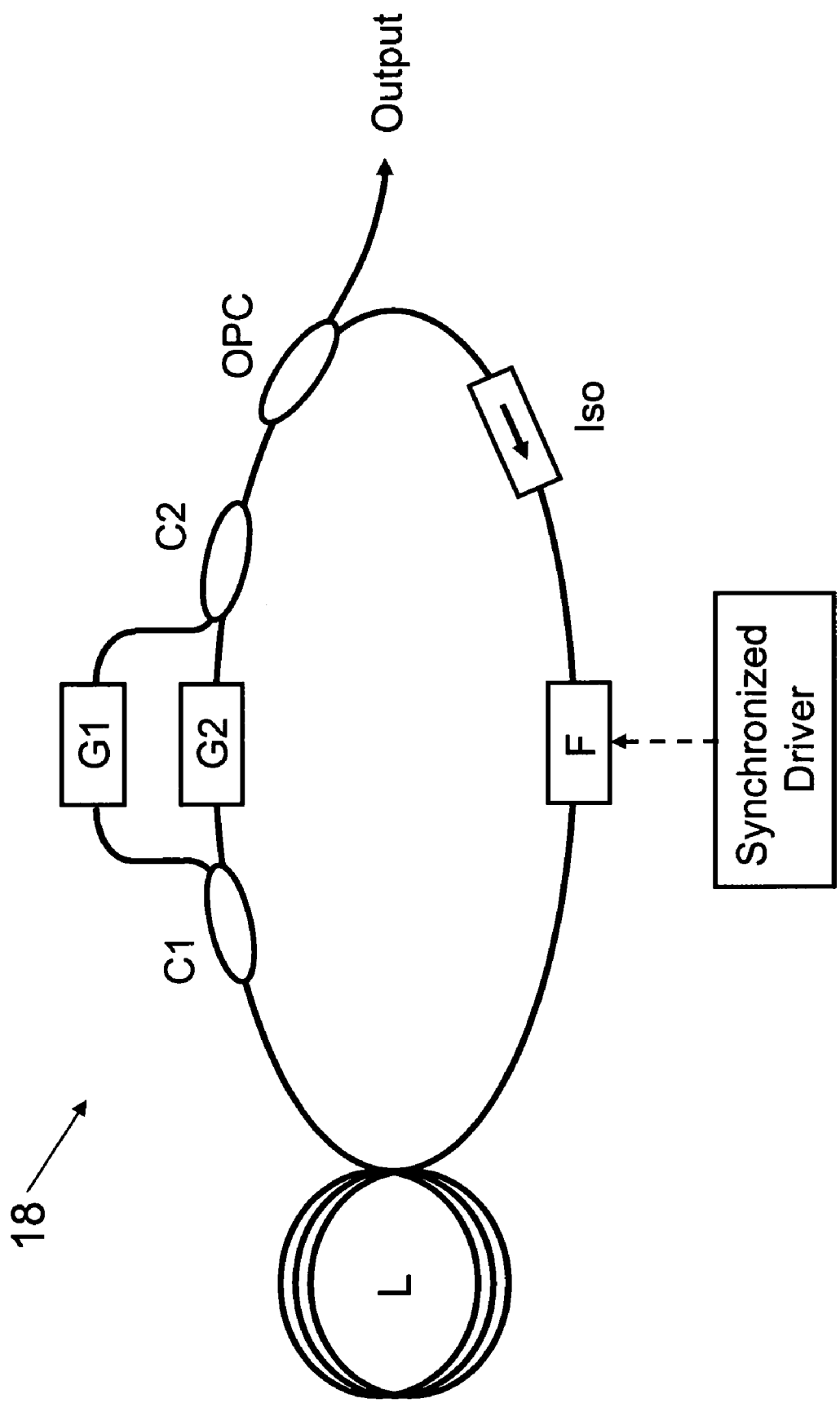
Figure 11:
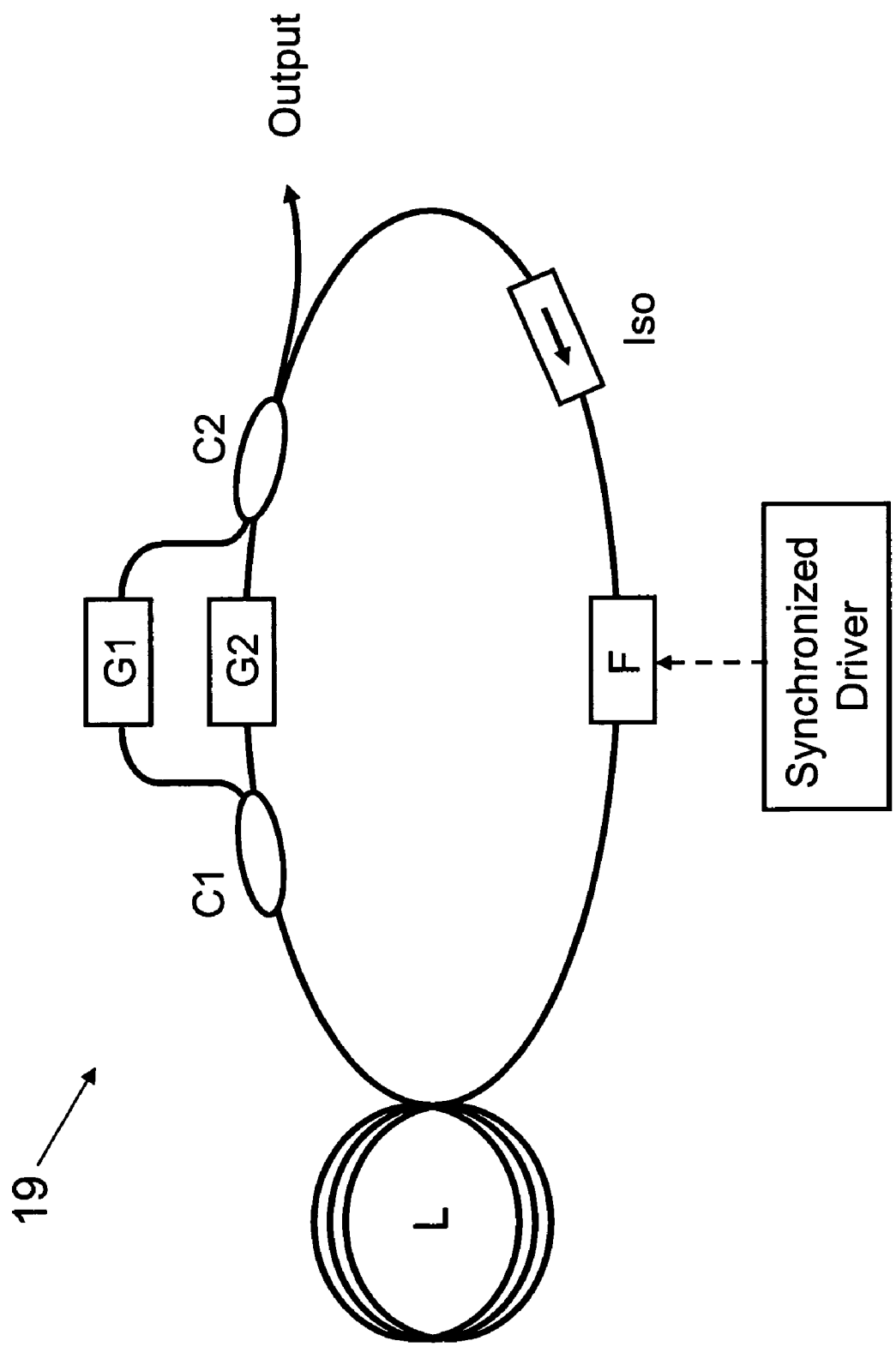

In some applications, it is desirable to increase the wavelength or frequency bandwidth of operation of the laser. This can be achieved by multiplexing multiple gain media together as shown in FIGS. 10 and 11. FIG. 10 shows a system 18 having two gain devices (G1 and G2) which are combined or multiplexed using wavelength or frequency dependent couplers (C1 and C2). FIG. 11 shows a similar system 19 that lacks the additional output coupler OPC of system 19.

In both systems 18 and 19, the gain devices G1, G2 have center wavelengths or frequencies which are displaced from each other such that their bandwidths are overlapping and the net bandwidth from the combined devices is greater than from each device alone. The wavelength or frequency dependent couplers (dichroic couplers) have characteristics that match the gains such that light of a given wavelength or frequency is directed through the appropriate gain device. The transition wavelength or frequency of the couplers is chosen to be near the mean wavelength or frequency between the two gain devices in order to optimize operation. Although it is shown with two gain devices, this configuration can be implemented with larger numbers of gain devices to further increase bandwidth.

The configuration shown in FIGS. 10 and 11 uses gain devices connected in parallel. In addition, depending upon the type of gain device, a series configuration can be used (not shown) in which gain devices having different center wavelengths or frequencies are connected in series. This series configuration is appropriate for gain devices which do not have parasitic absorptions outside their gain bandwidths. Using two or more gain devices in series facilitates compensating losses within the delay. If the losses are too high, it can be necessary, that the gain media are distributed over the length of the delay line.

FIG. 11 shows an alternate embodiment of a system 19 which multiplexes multiple gain media together to achieve broader bandwidths. In this configuration, the couplers (C1 and C2) are broadband couplers having a substantially flat wavelength or frequency response and a near equal or 3 dB coupling ratio. The coupler C1 directs incident light to gain devices G1 and G2. Depending upon the wavelength or frequency of the light, it is amplified by either or both devices. The coupler C2 combines the amplified light and directs part of it into the laser cavity and part of it to the laser output. Finally, the laser output may also be obtained from another position in the cavity using an additional coupler, although power efficiency will be reduced.

Figure 12:
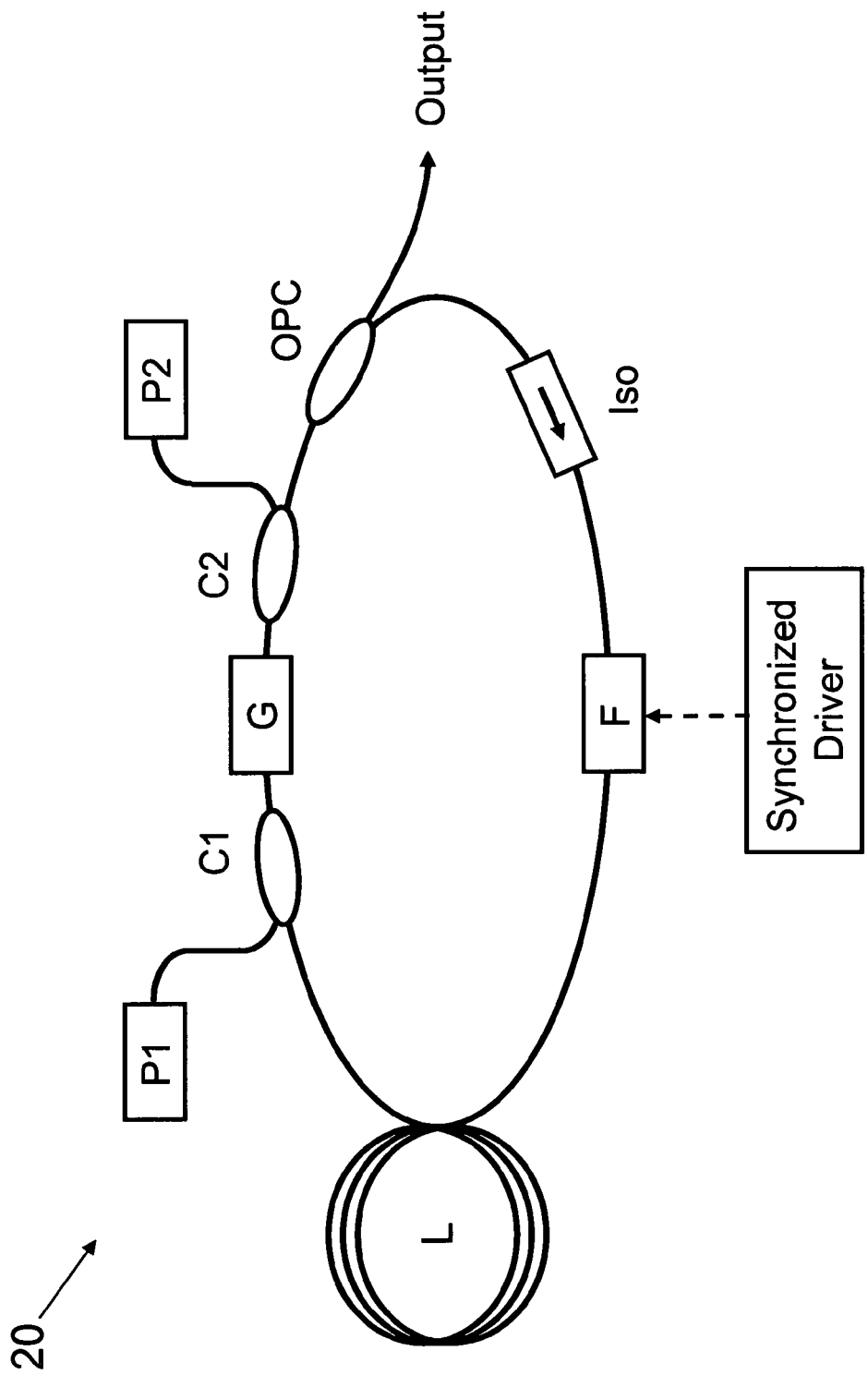

In order to achieve broad bandwidth operation, other types of gain media may be used. FIG. 12 shows a system 20 which uses a Raman gain, a parametric gain, or another type of nonlinear gain G. These types of gain medium which use third order nonlinear optical effects have the advantage that broader bandwidths can often be achieved compared to standard types of gain arising from population inversion. In the case of a Raman gain, the gain G may include a length of optical fiber or other material having nonlinear optical properties which enhance stimulated Raman scattering. The pump power for the Raman gain is provided by pump lasers (P1 and P2) which pump in the forward or backward direction. The wavelengths of the pump lasers are chosen along with the properties of the optical fiber in order to enhance the Raman gain in the desired bandwidth of operation. In addition, the gain G may be a waveguide, bulk crystal, or other medium exhibiting nonlinear optical properties with pump lasers P1 and P2 chosen to achieve amplification from this nonlinear process over the desired bandwidth.

Figure 13:
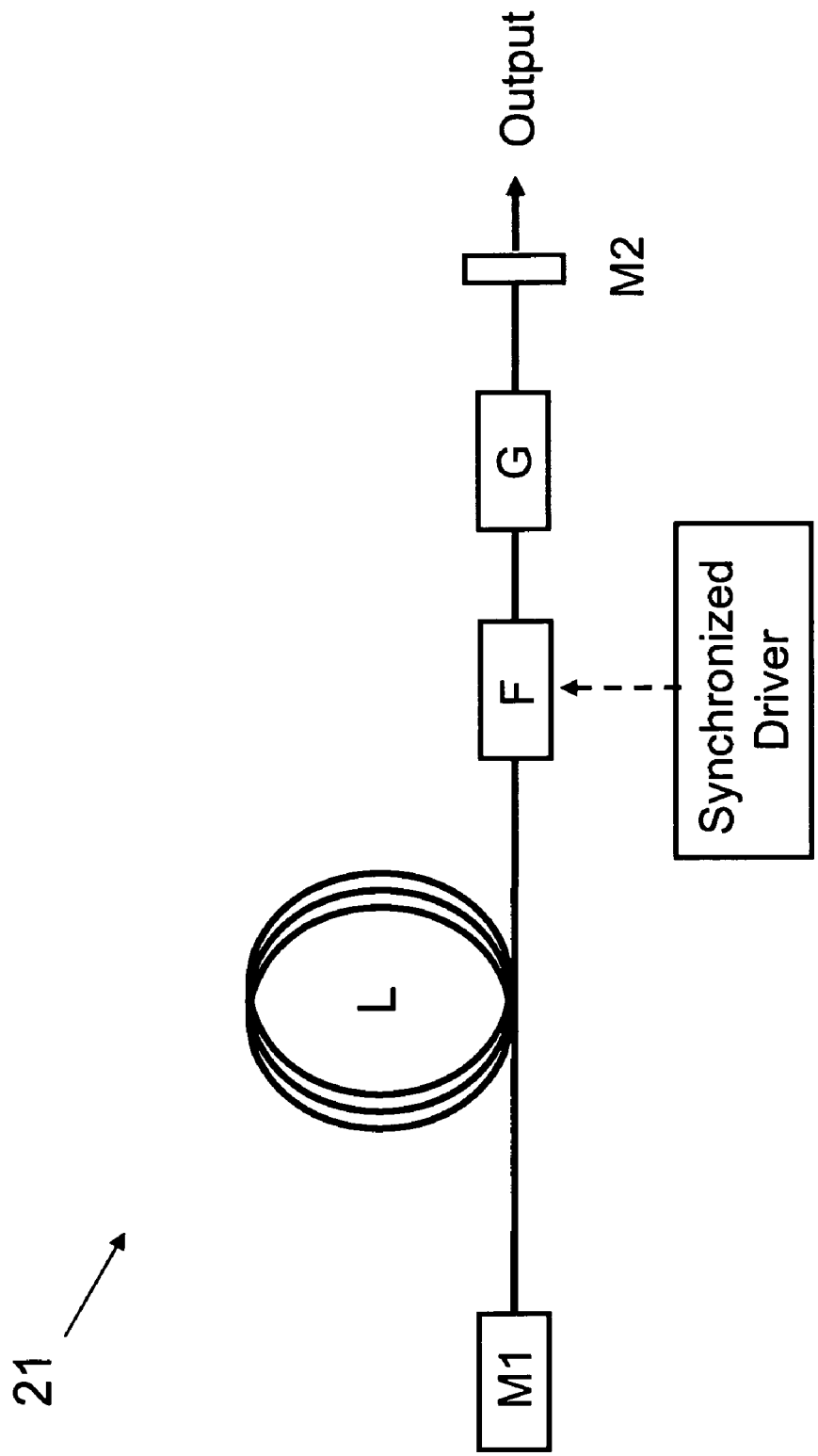
FIGS. 13-14 are schematic diagrams depicting linear cavity systems according to illustrative embodiments of the invention.

The previous embodiments have shown ring laser cavities. However, there are also embodiments which use linear cavity configurations. An example of a linear cavity configuration 21 is shown in FIG. 13. M1 is a mirror, a fiber loop reflector, or other reflecting device positioned at one end of the cavity. M2 is a partially reflecting mirror or other type of output coupler which couples out a portion of the incident intensity and retroreflects a portion back into the laser. This configuration has the property that light in the cavity propagates through all of the elements including the gain G, filter F, and fiber delay L in both the forward and backward directions.

The positions of the gain G, filter F, and fiber delay line L may be different from those shown and may be chosen to optimize the operation of the laser. For example, the gain G may be placed near the output coupler as shown in order to optimize output power. Alternately, the filter F may be placed near the output coupler (not shown) in order to obtain the output after transit through the filter in order to reduce noise. Since the light passes through the filter F twice each round trip, the position of the filter F is chosen in a manner which accounts for the delay of the light between the forward and reverse pass. In one configuration, the filter F is placed near the end of the cavity such that the forward and reverse passes occur closely spaced in time, such that the filter is tuned to substantially the same wavelength. However, the position of the filter F and hence the time delay between the forward and reverse passes of the light can be chosen to optimize the filtering effect.

Figure 14:
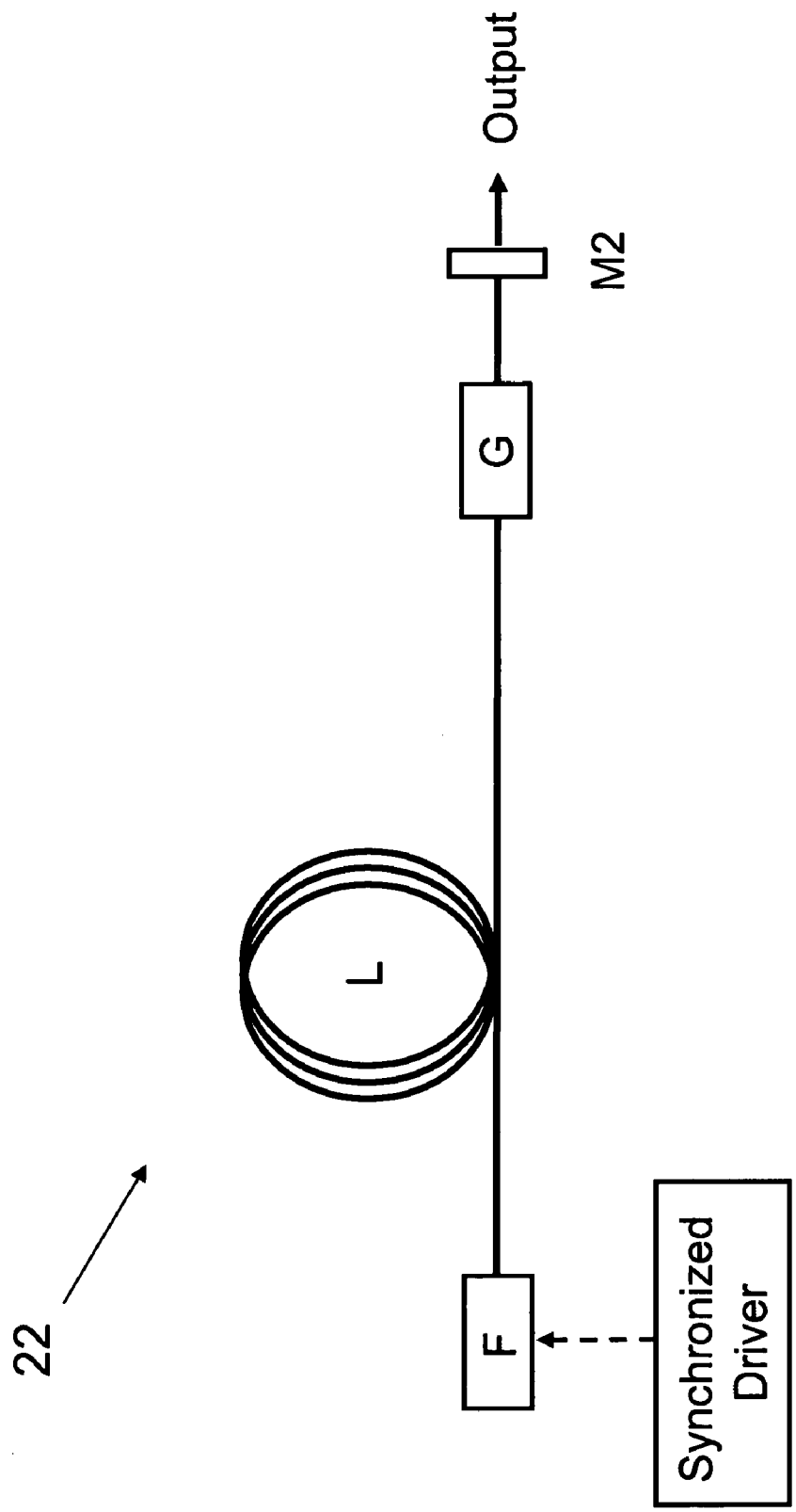

The configuration of the linear cavity system 21 shown in FIG. 13 is appropriate for a filter F which operates by transmitting the desired wavelengths or frequencies. FIG. 14 shows another example of a linear cavity embodiment 22 which is suitable for use with a filter F which operates by retroreflecting the desired wavelengths or frequencies.

The linear cavity has some advantages compared to ring cavities which can be used to achieve optimum operation. For example, in the configuration 21 shown in FIG. 13, the light propagates through the filter twice per round trip. This enhances the filtering function provided by the filter. Since the light propagates through the fiber delay L twice, the length of fiber required for to achieve a given time delay is one half of that required in the ring cavity where the light propagates through the fiber once per round trip. In the geometry shown, the mirror M1 may also be a Faraday mirror or similar non-reciprocal reflecting element. The use of a Faraday mirror compensates the birefringence of the forward and reverse pass thorough the fiber in the case where the fiber is not polarization preserving or not single polarization fiber.

However, the linear cavity may not be suited for certain types of gain or filter characteristics. For example, if the gain exhibits nonlinear effects such as hole burning, nonlinear mixing, or other effects which are made worse by operation with forward and backward propagation of light, a ring cavity may be desirable compared to a linear cavity. As another example, if the filter has the property that light outside the passband is retroreflected, a linear cavity would not work and a ring cavity with one or more isolators would be preferred.

Figure 15:
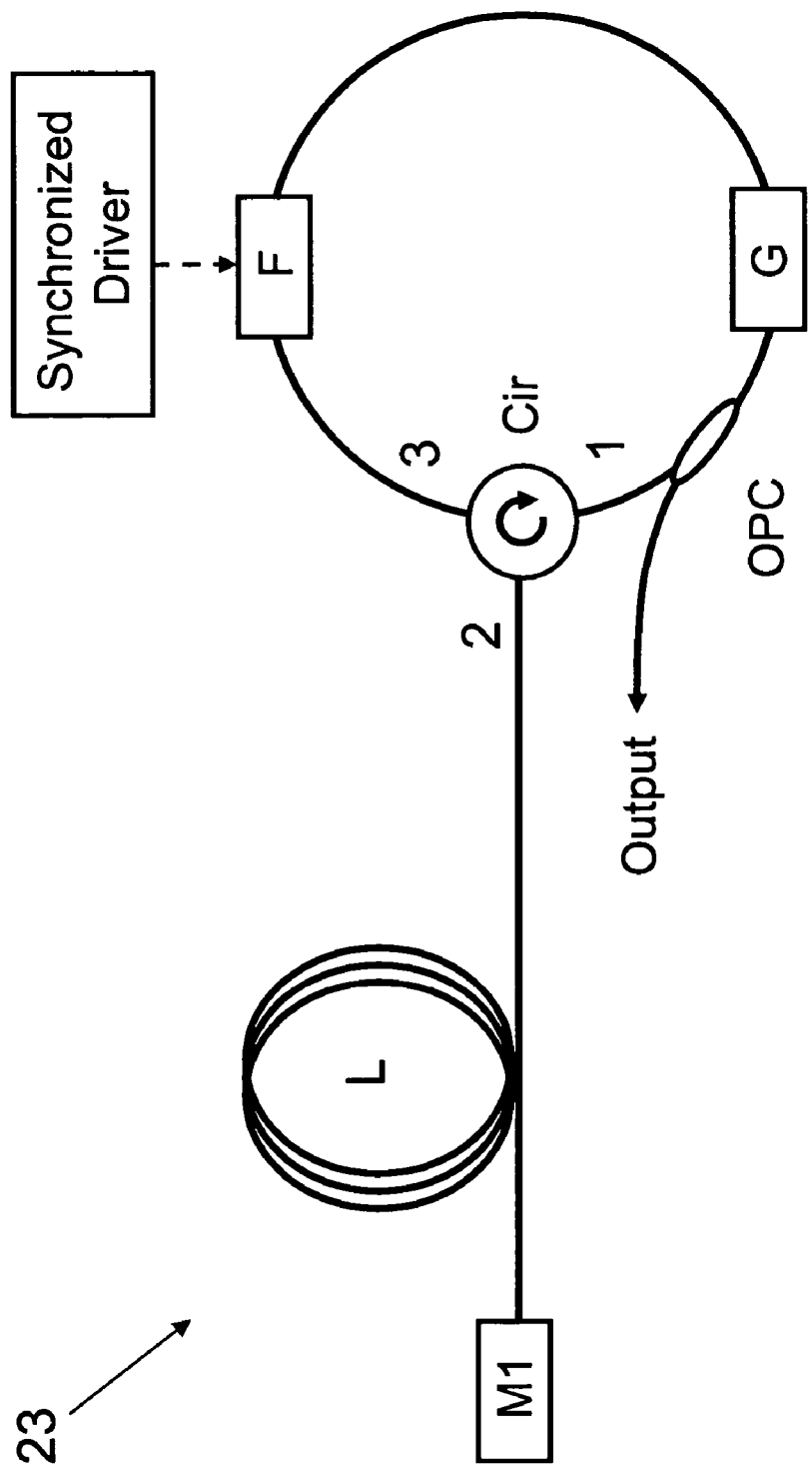
FIG. 15 is a schematic diagram depicting a linear cavity system having a unidirectional filter and gain and a bidirectional delay according to an illustrative embodiment of the invention.

Some of the limitations of the simple linear cavity can be overcome using hybrid cavities. An example of a hybrid cavity system 23 is shown in FIG. 15. The system 23 includes a unidirectional ring and a bidirectional linear segment. This configuration is known as a "sigma cavity." In this configuration, light from port 3 of the circulator CIR is directed into the ring. The light is filtered by the filter F and amplified by the gain G. A portion of the light is coupled out OC to obtain an output and the remainder is incident onto port 1 of the circulator, where it is transmitted to port 2, into the linear portion of the cavity. The light propagates through the fiber delay L where it is retroreflected by mirror M1 at the end of the cavity. The light then propagates in the reverse direction through the fiber delay and is incident on port 2 of the circulator, where it is transmitted to port 3, into the ring.

Since the light propagates in both the forward and reverse direction through the fiber delay L, the length of fiber required to achieve a given delay is approximately two times less than that in the ring cavity where the light propagates in one direction through the fiber. In addition, in the case where the fiber is not polarization preserving or not single polarization fiber, a Faraday rotator mirror may be used for mirror M1 in order to compensate parasite polarization birefringence effects from propagating through the fiber. The hybrid cavity also has the potential advantage that light propagates in a single direction through the gain G, thus reducing any parasitic nonlinear effects. A preferred embodiment of such a hybrid cavity is described in FIG. 16 that exhibits improved polarization management.

Figure 16:
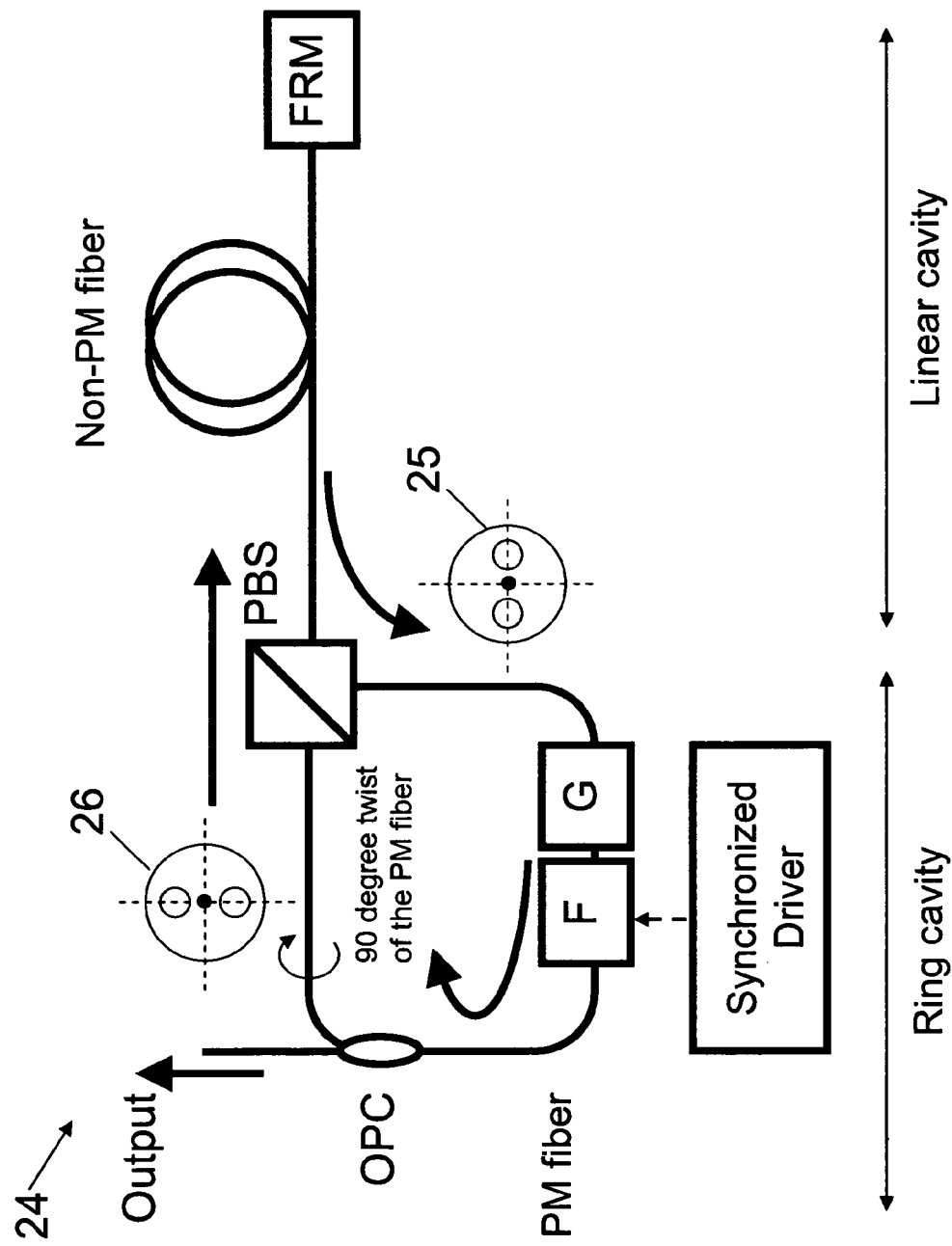
FIG. 16 is a schematic diagram depicting a polarization controlled system according to an illustrative embodiment of the invention.

Depending on the length of the feedback line, especially in the case of fiber cavities, instabilities in the polarization state can occur due to mechanical vibrations and drift in temperature. A polarization managed layout of the cavity can be necessary. A suitable polarization managed sigma cavity system 24 is shown in FIG. 16. This system 24 is a combination of a ring cavity and a linear cavity. The ring cavity allows using uni-direction components, such as the uni-direction filter, and the uni-direction amplifier. But when the ring cavity is composed of a non-polarization maintained (non-PM) fiber, the stability of the ring cavity laser decreases due to mechanical vibrations and the temperature fluctuations. These fluctuations can change the birefringence of the fiber and the polarization state of the laser.

In contrast, a linear cavity which employs a Faraday rotator mirror (FRM) as shown in FIG. 13 offers high polarization stability, even if the non-PM fiber is used in the cavity. By rotating the polarization state using the Faraday rotator mirror, the light inside the cavity can propagate along both of the principle axes of the cavity. This compensates for the birefringence of the optical fiber and the other components. The other polarization dependent effects, such as a polarization dependent loss, gain, filtering function, can also be compensated with the scheme. However, the uni-directional components cannot be in the linear cavity.

The sigma cavity can combine both features of the ring and the linear cavity. Any uni-directional component can be placed in the ring cavity part, and any polarization sensitive component can be placed in the linear cavity part. FIG. 16 shows an example of a sigma cavity. FIG. 16 shows the detailed concept of polarization management in such a cavity. This configuration of a fiber-based sigma ring cavity laser shows enhanced polarization state stability. The linear cavity portion of system 24 includes a Faraday rotator mirror and the non-PM fiber for the optical delay. The birefringence of the non-PM fiber is compensated by this configuration and the polarization state is stabilized at the fiber end connected to the polarization beam splitter (PBS). Linearly polarized light passes the PBS and the orthogonal polarized light is reflected. The polarization state of the light which comes back from the linear cavity part is always orthogonal to the polarization state of the incident light due to the Faraday rotator mirror.

The non-PM fiber can be replaced by the polarization maintained PM fiber, but the PM fiber is much more expensive than the non-PM fiber. Thus, for long feedback lines the application of the delay in the non-polarization sensitive part offers advantages. The ring cavity includes the gain medium, filter, output coupler, and the PM fiber. The ring cavity part and the linear cavity part are connected by the PBS. The ring cavity includes the gain medium, the filter, the output coupler, and the PM fiber. The PM fiber should be 90 degree rotated in the ring cavity to enable the laser light to pass through the PBS. A cross-sectional view showing the rotated fiber 25 and the rotated fiber 26 is shown in the figure. This sigma-ring cavity laser stabilizes the polarization state and reduces the noise which is originated by the polarization state instability.

Other laser-based embodiments can be used to time multiplex the output waves and increase the repetition rate of the time varying frequency of the laser output. Still other embodiments can be used to specifically tailor the type of time varying frequency that is desired. The following examples include a substantially sinusoidally varying frequency versus time behavior, however it is recognized that the concept of time multiplexing can be implemented with other types of frequency tuning behavior.

FIGS. 17a and 17b shows graphs that provide an example of time multiplexing with a sinusoidal like frequency tuning versus time behavior. In the examples shown, the period of the sinusoid is substantially equal to the round trip time of the laser cavity. Many types of filters which are mechanically actuated have the characteristic that they have a center wavelength or frequency which varies sinusoidally in time. This is especially the case when the repetition rate of the filter is very high. This follows because it is easier to achieve sinusoidal motion at higher frequencies than other types of motion such as a saw tooth or triangle. The frequency sweep occurs in both directions from low to high and from high to low. In some applications, it is desirable to have a frequency sweep which occurs in only one direction.

As shown in FIG. 17a, a unidirectional frequency sweep can be achieved by time multiplexing, combining the laser output with a delayed version of the laser output and appropriately modulating the gain of the laser. In the example shown, the laser gain is modulated such that output is obtained during the rising edge of the sinusoidal frequency sweep (from point 1 to point 2 on the curve). The laser output is then combined with an output delayed by one half of the laser round trip time ($T_{rep}/2$). This produces the combined output shown in the FIG. 17b in which the frequency sweep occurs at twice the repetition rate of the laser, every $T_{rep}/2$, with the frequency sweep occurring unidirectional from low to high frequency.

FIGS. 18a and 18b show another example of time multiplexing to linearize a sinusoidal frequency sweep. In the example shown in FIG. 18a, the laser gain is modulated such that output is obtained during the nearly linear portion of the rising edge of the sinusoidal frequency sweep (from point 1 to point 2) and during the nearly linear portion of the falling edge of the frequency sweep (from point 2 to point 3). The laser output is combined with an output delayed by approximately one quarter of the laser round trip time ($T_{rep}/4$). This produces the combined output shown in FIG. 18b in which the frequency sweeps occur over nearly linear portions of the sinusoid. In this example the direction of the frequency sweeps occur from both low to high and high to low frequencies. Although these examples show time multiplexing using two outputs, one of which is time delayed with respect to the other, this concept can be extended to the multiplexing of more than two outputs.

Figure 19:
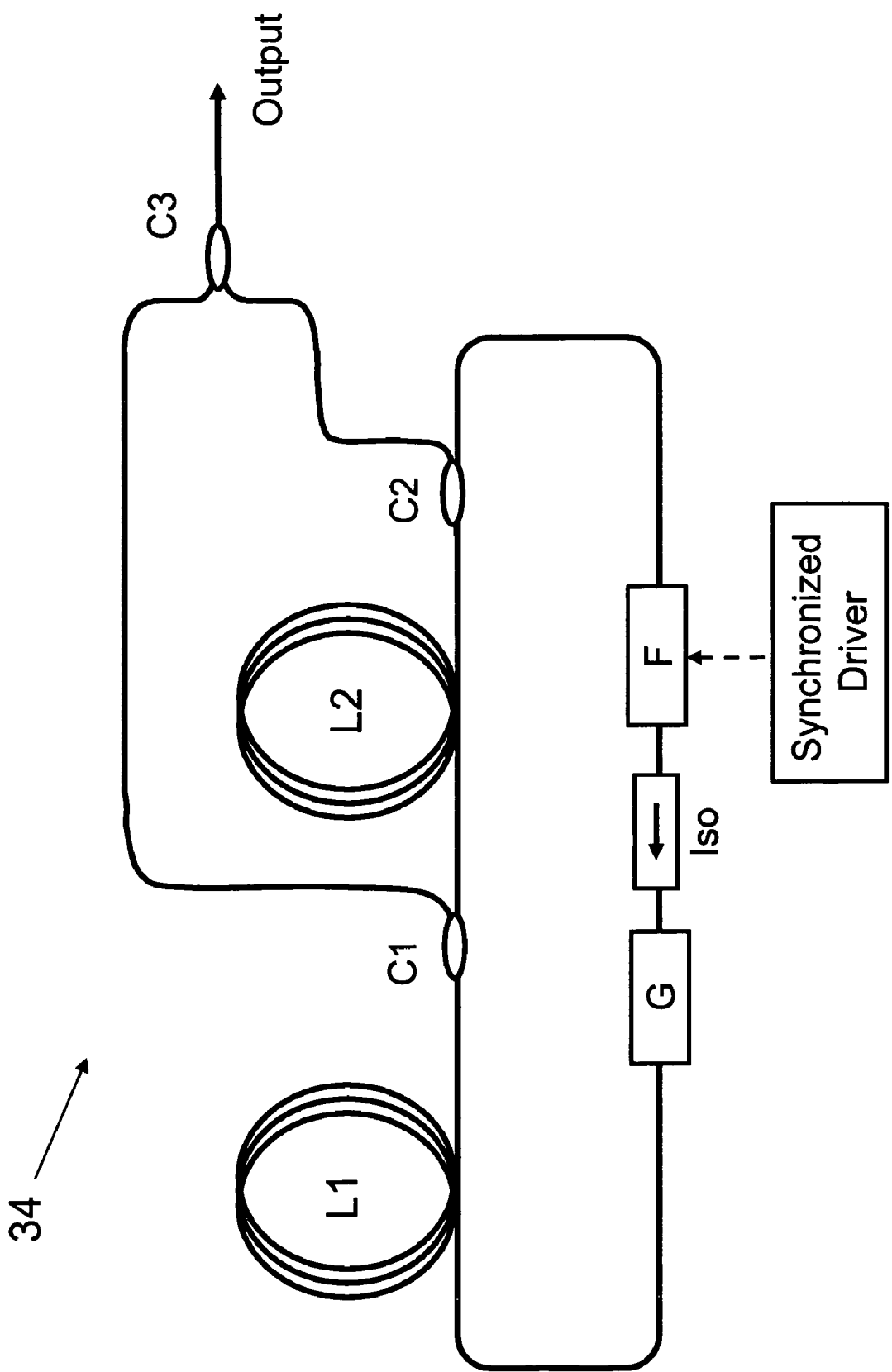
FIG. 19 is a schematic diagram depicting a ring cavity having time multiplexed outputs according to an illustrative embodiment of the invention.

Time multiplexing may be performed by splitting the output of the laser, time delaying one output, and combining them. This action can be performed by devices such as an unbalanced Mach Zehnder interferometer (not shown). However, it is also possible to perform time multiplexing directly from the laser itself. FIG. 19 shows a ring laser configuration 34 which generates two time delayed outputs. The ring laser includes a gain G, filter F, an isolator ISO, with a fiber delay L1, a coupler C1, a second fiber delay L2, a coupler C2, and a combiner C3 which combines the two outputs. This combiner can be a fiber coupler, a polarization beamsplitter or an active optical switching element, like a Pockels-cell with a subsequent polarization beamsplitter assembly. An acousto-optic deflector can also be used for switching between the two ports.

The total round trip delay of the ring is determined by the lengths of the fibers in the two delay lengths L1 and L2, with additional delay from the other components in the ring. The relative delay between the two outputs from couplers C1 and C2 is determined by the length of the fiber delay L2. The coupling ratios of couplers C1 and C2 can be chosen differently in order to equalize the intensities coupled out while accounting for attenuation losses. The coupling ratio of coupler C3 can also be optimized to equalize the intensities combined from the two outputs from couplers C1 and C2. The coupler C3 will have loss of approximately one half when equally combining two outputs. Although this example is shown for two time multiplexed outputs, this cavity configuration can be generalized to time multiplex large numbers of outputs. Polarization controllers (not shown) can be used to ensure that the polarizations of the time multiplexed outputs are included if necessary.

Figure 20:
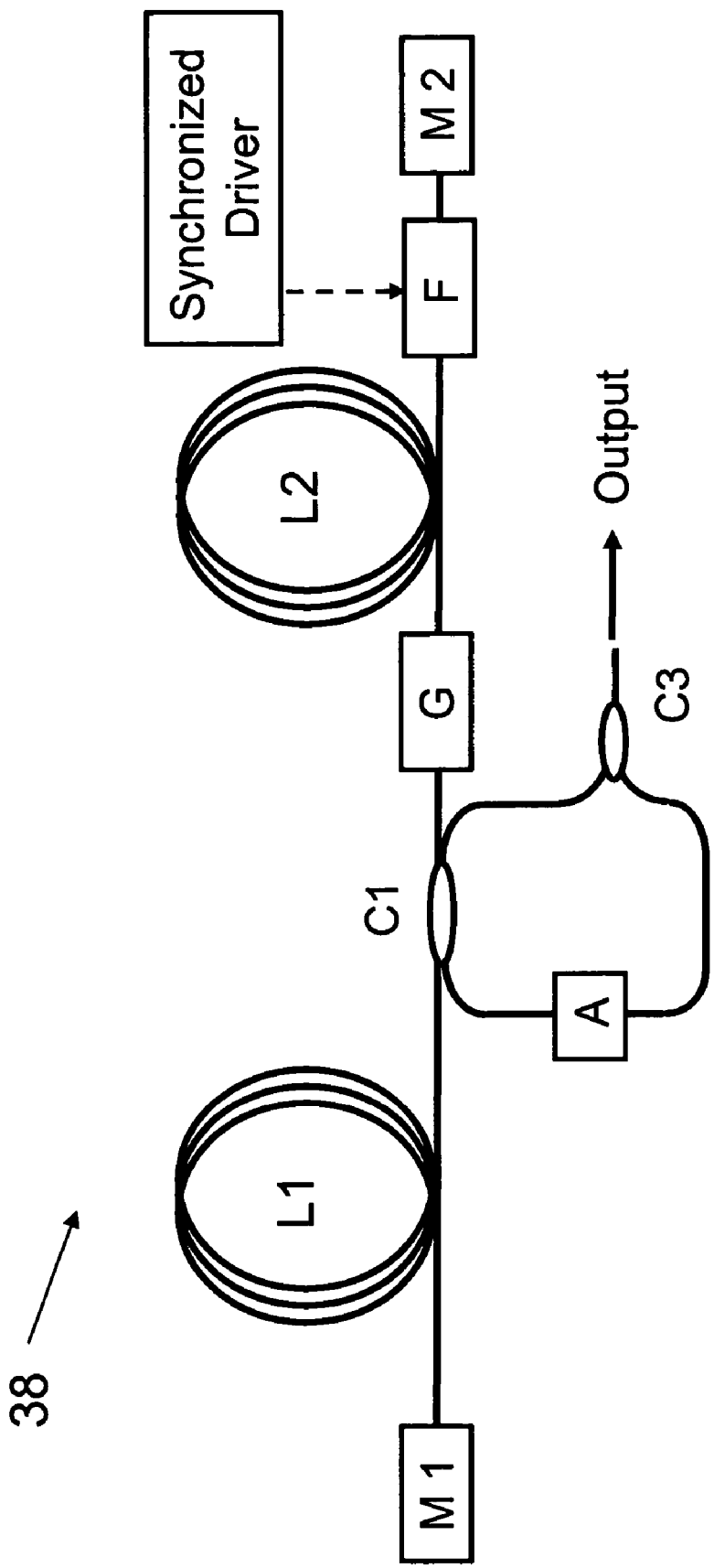
FIG. 20 is a schematic diagram depicting a linear cavity having time multiplexed outputs according to an illustrative embodiment of the invention.

FIG. 20 shows a linear laser system 38 which generates two time delayed outputs. The linear laser includes a gain G, filter F, two fiber delay lengths L1 and L2, and end mirrors M. This configuration illustrates the concept of using a single coupler C1 placed at a given point in the cavity in order to couple the light out of the laser on the forward and reverse transits through the cavity at different times. For example, if the coupler C1 is placed at the midpoint of the cavity such that the fiber lengths L1 and L2 are substantially the same, then two outputs will be obtained which are time delayed by one half the cavity round trip time with respect to each other. These two outputs can be combined using an additional coupler C3 to obtain the time multiplexed output. The intensities of the two outputs can be adjusted by using the appropriate amplifier or the attenuator A in one of the paths or the coupling ratio of C3 chosen to equalize the intensities if so desired. Combining two outputs into a single output in coupler C3 results in a loss of approximately one half when equally combining the two outputs.

Figure 21B:
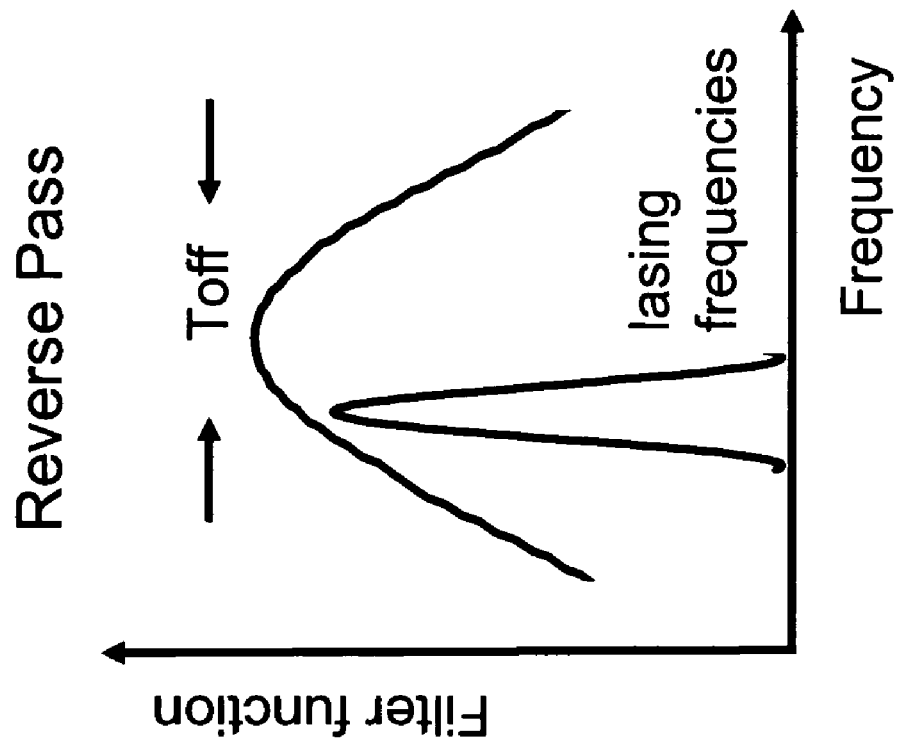
FIGS. 21*a*-21*b* are graphs depicting a dual pass filter relationship according to an illustrative embodiment of the invention.
Figure 21A:
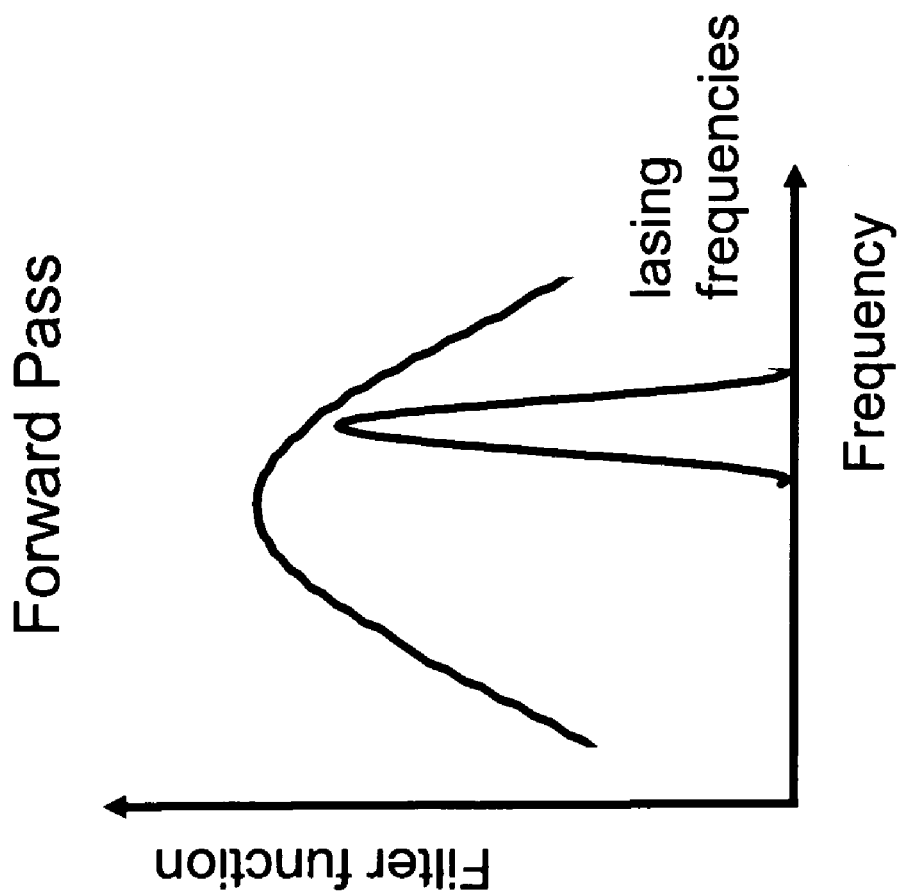

The concept of using the time delay upon propagation in the cavity can also be used to enhance the filtering from the tunable filter in a linear cavity. In a linear cavity using a transmitting filter, the light propagates in both the forward and reverse direction through the filter at different times depending upon the position of the filter in the cavity, with a time offset $T_{off}$. FIGS. 21a and 21b show this concept schematically by depicting filter function as a function of frequency in a forward pass and reverse pass embodiments.

The filter produces a wavelength or frequency dependent passband which is periodically tuned at the cavity round trip or a harmonic of the round trip delay time. The cavity operates with a narrow band of instantaneous wavelengths or frequencies whose center wavelength or frequency varies as a function of time. The filter produces a wavelength or frequency dependence which has a maximum at some center frequency or wavelength and decreases away from the maximum. In some applications, where very narrow band operation is desired, the width of this passband, which can be obtained from the filter function, may not be narrow enough.

In this case, the effectiveness of the filtering can be enhanced by using two time delayed passes through the filter. The time delay $T_{off}$ between the two passes is chosen so that the lasing wavelengths are slightly detuned from the maximum on the forward and reverse passes. This places the wavelengths on the portion of the filter function which is more rapidly varying with wavelength than at the maximum. This point of operation can enhance the filtering function and result in narrower bandwidth operation.

Figure 22:
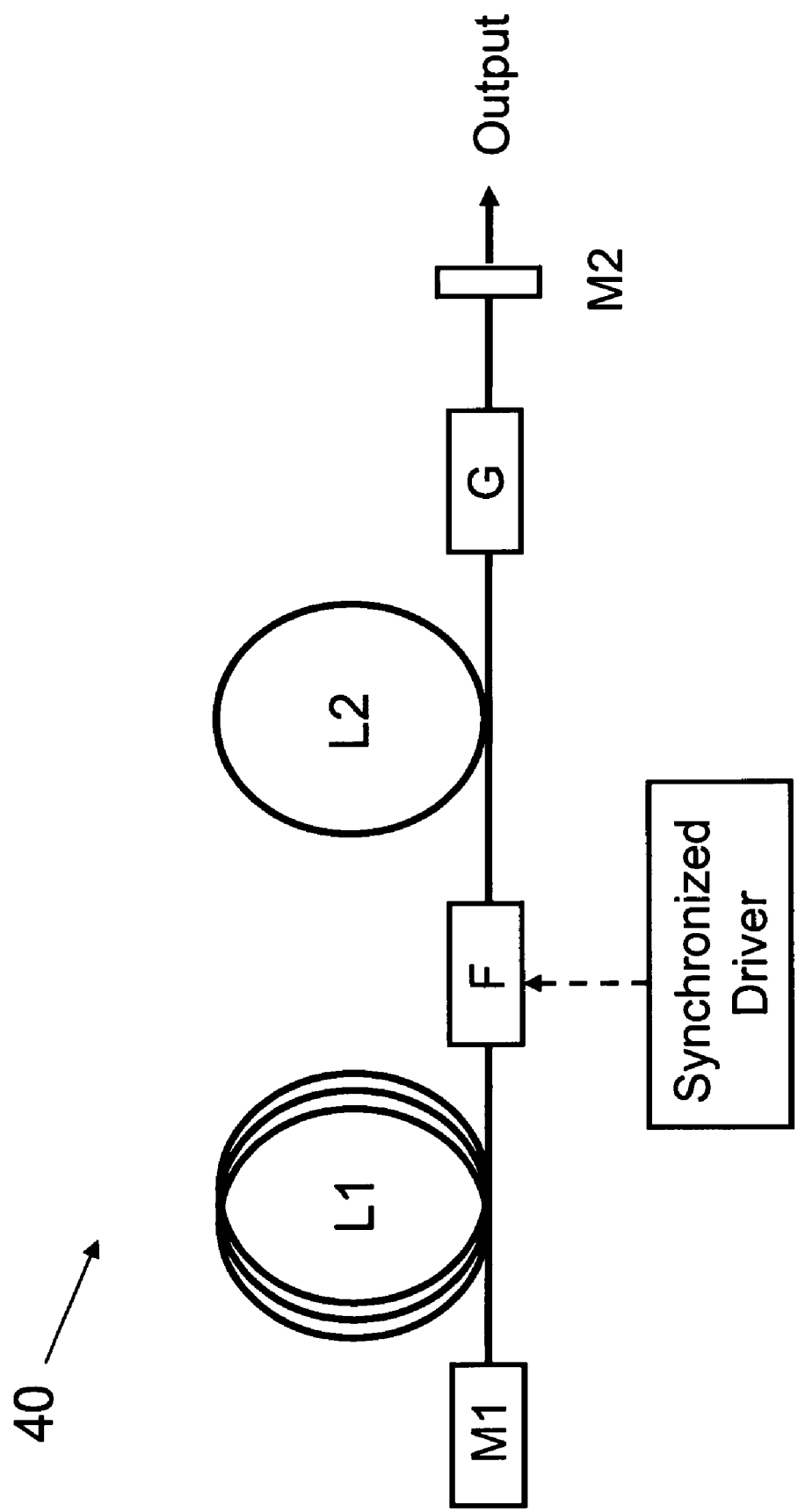
FIG. 22 is a schematic diagram depicting a linear cavity with a dual pass time displaced filter according to an illustrative embodiment of the invention.

FIG. 22 shows an example of a linear laser system 40 which implements enhanced filtering by using time delayed forward and reverse passes though the filter. In this example, the filter is not placed at the end of the cavity, but is placed after a length of fiber delay L1 from one of the end mirrors. Thus, light which makes one pass though the filter in one direction will make a second pass through the filter in the reverse direction after it propagates forward and back through the fiber (a length of 2×L1). Setting the length of L1 determines the time delay $T_{off}$ between the forward and reverse transits though the filter. The use of controlled multiple pass time delays to enhance the filter function, similar concepts can enhance operation if other devices in the cavity depend upon the timing of incident optical frequencies.

Figure 23B:
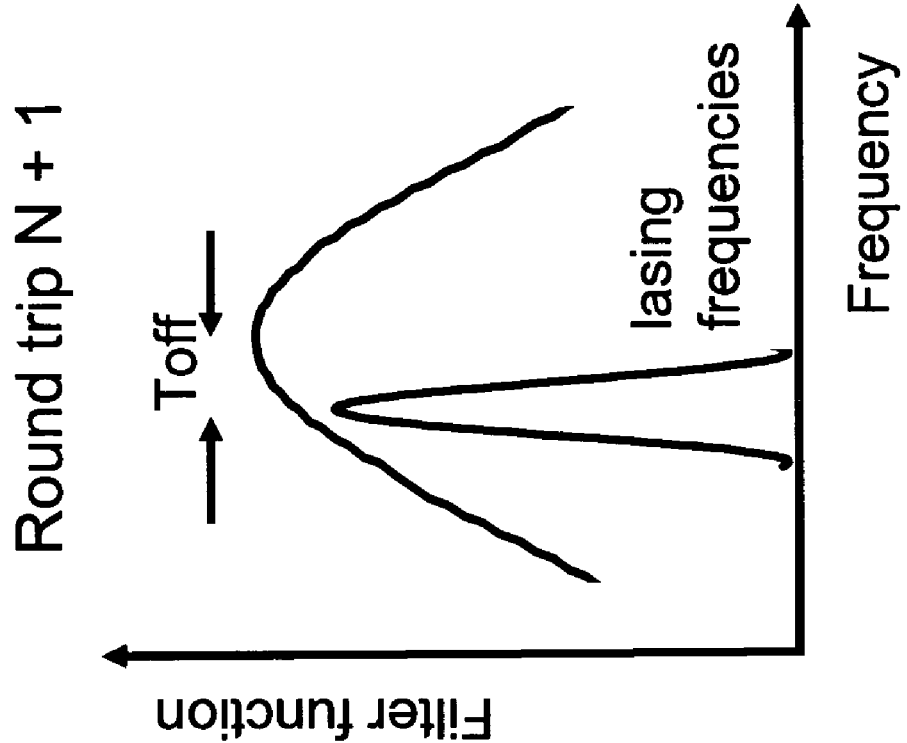
FIGS. 23*a*-23*b* are graphs depicting detuning filter repetition frequency relationships according to an illustrative embodiment of the invention.
Figure 23A:
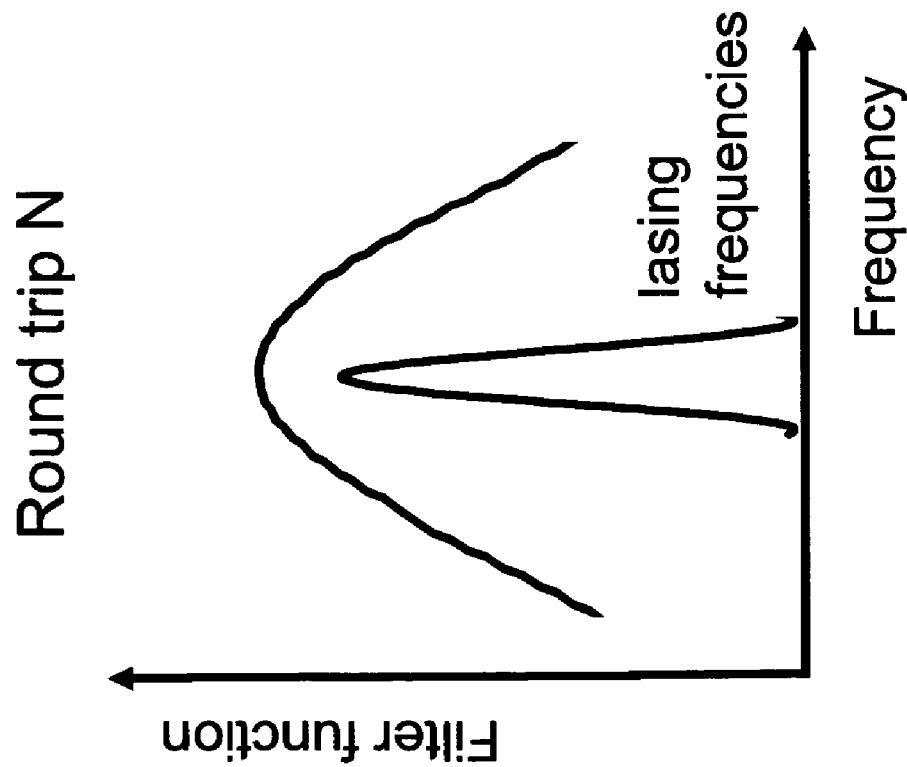

In order to enhance narrow band operation, the frequency of the synchronous drive of the tunable filter can itself be slightly detuned from the cavity round trip time, drive period and cavity roundtrip time differ by $T_{off}$. This concept is shown in the graphs of FIGS. 23a-23b. FIG. 23a shows a filter function versus frequency relationship for roundtrip N and FIG. 23b shows the relationship for roundtrip N+1. If the drive frequency of the tunable filter is slightly detuned from the cavity round trip time, this results in a displacement of the lasing wavelengths or frequencies away from the maximum center wavelength or frequency of the tunable filter upon successive round trips through the cavity. This shift from center wavelength is shown in FIG. 23b. Depending upon the dynamical effects of the gain and other devices in the laser cavity, such detuned operation can be used to enhance the filtering effect since the lasing wavelengths or frequencies transit the filter when the filter function is more sharply varying.

As stated previously, the lasers disclosed herein operate by driving the tunable filter such that the center wavelength or frequency of the filter is varied periodically with a period that is substantially equal to the cavity round trip time or its harmonics. For practical applications, stabilization of the synchronous drive frequency and phase with respect to the cavity round trip time or its harmonics may be required in order to achieve long term stable operation of the laser. In this case, active feedback to stabilize the drive frequency can be applied. An optical error signal, which is a measure of the mismatch of the incident lasing wavelengths or frequencies with respect to the center wavelength of the filter, can be obtained and detected electronically. This signal can be used to feedback control a voltage controlled oscillator or other similar device to set the frequency of the synchronous driver.

Figure 24:
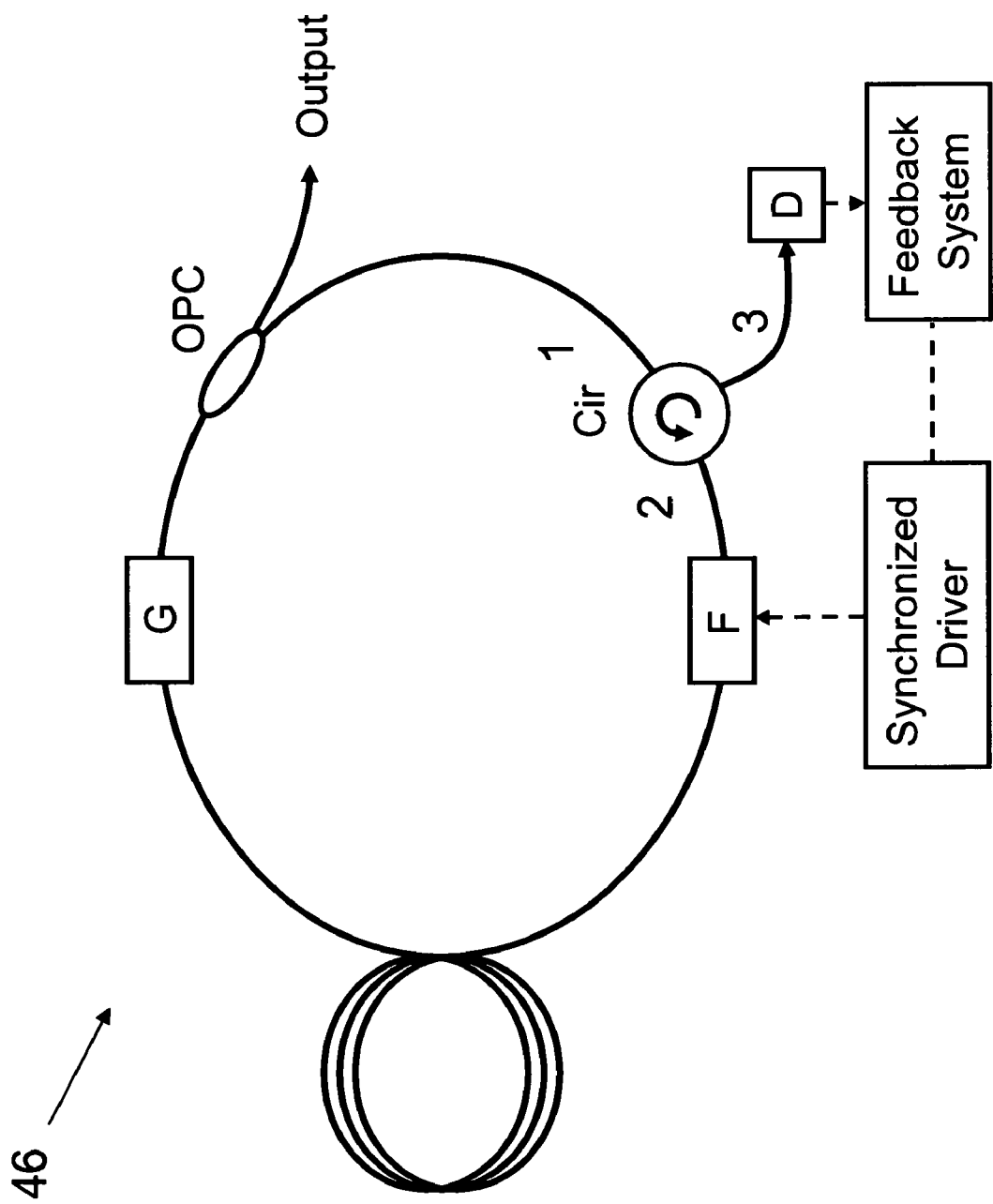
FIG. 24 is a schematic diagram depicting active stabilization of filter drive frequency according to an illustrative embodiment of the invention.

FIG. 24 shows a feedback system 46 which is appropriate for use with a filter that retro-reflects incident light that is outside its filter's passband. In this system 46, a circulator (Cir) is incorporated into the laser to collect the retroreflected light and direct it to a detector. Alternatively, the retroreflected light could be collected and detected by another method known in the art. The magnitude of this light signal is a measure of the mismatch of the filter center wavelength or frequency from the center wavelength or frequency of the lasing light. In this example, the light signal increases for both positive or negative mismatch of wavelength or frequency and other methods such as forming the derivative with respect to a perturbation are used to lock to the maximum of the filter. Alternately, as stated previously optimum narrow band operation might be achieved with a slight detuning from the maximum. The error signal could also be generated directly by an RF analysis of the power output of the source.

Figure 25:
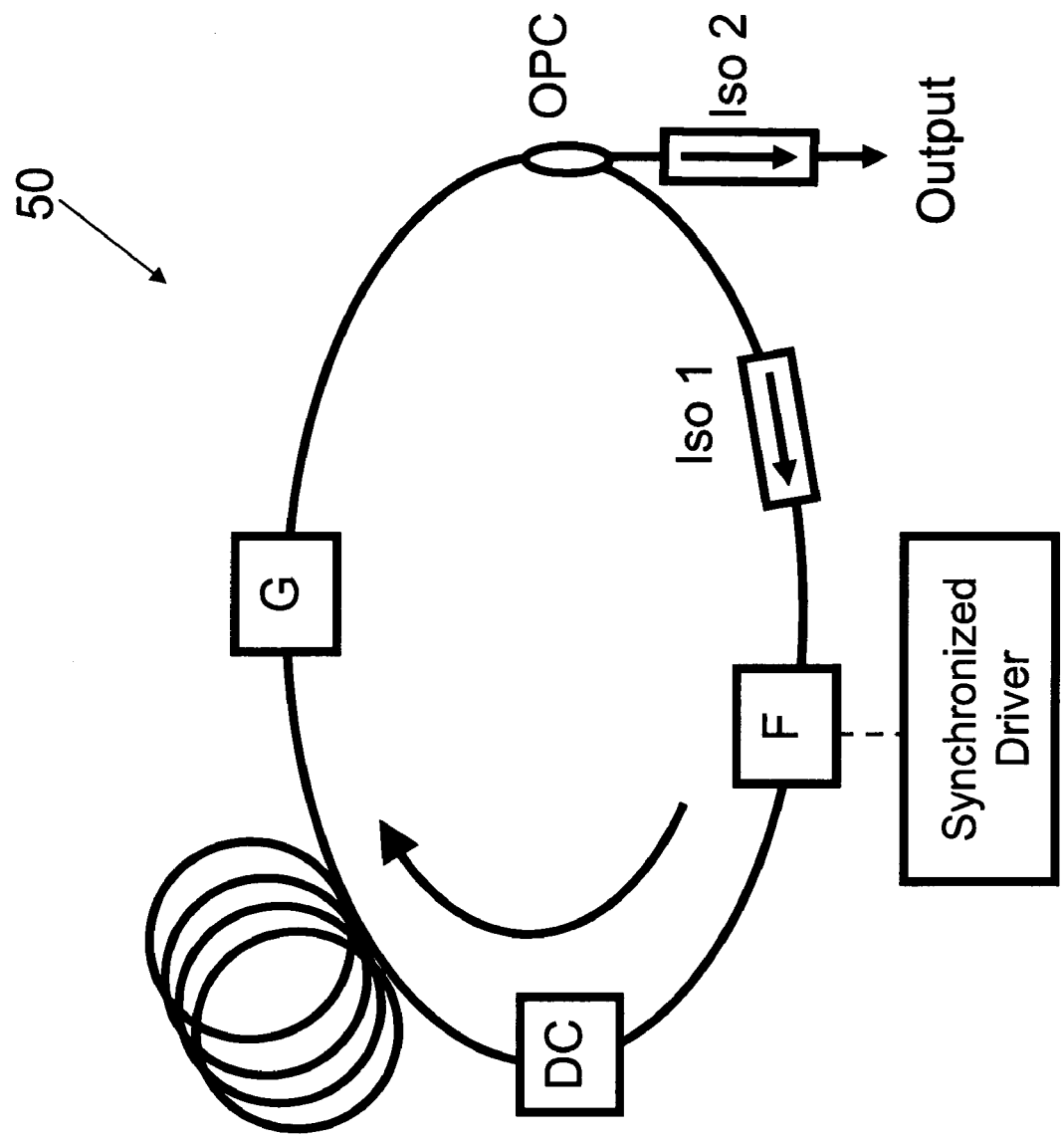
FIG. 25 is a schematic diagram depicting a dispersion compensator for dispersion management according to an illustrative embodiment of the invention.

FIG. 25 shows a laser system 50 with dispersion compensation. The residual group-velocity dispersion (GVD) causes round trip time mismatch of the different frequency components. Frequency components, which have a round trip time that is different from the interval time of the scanning filter, cannot pass through the filter. Therefore, the residual GVD reduces the optical bandwidth of the swept source. The minimization of the residual GVD in the laser cavity is important to achieve a broad spectrum operation. The GVD of the laser cavity is induced by the employed optical components, such as the optical filter, amplifier, and delay line. A dispersion compensator DC, such as the dispersion compensation fiber, chirped fiber Bragg grating, and grating pair, prism compressors, acousto optic or liquid crystal based shaper devices, can reduce the GVD effect, if they are placed in the laser cavity. Multiple DC elements can be used to achieve a defined evolution of the waveform inside the cavity to manage the local intensity.

Figure 26A:
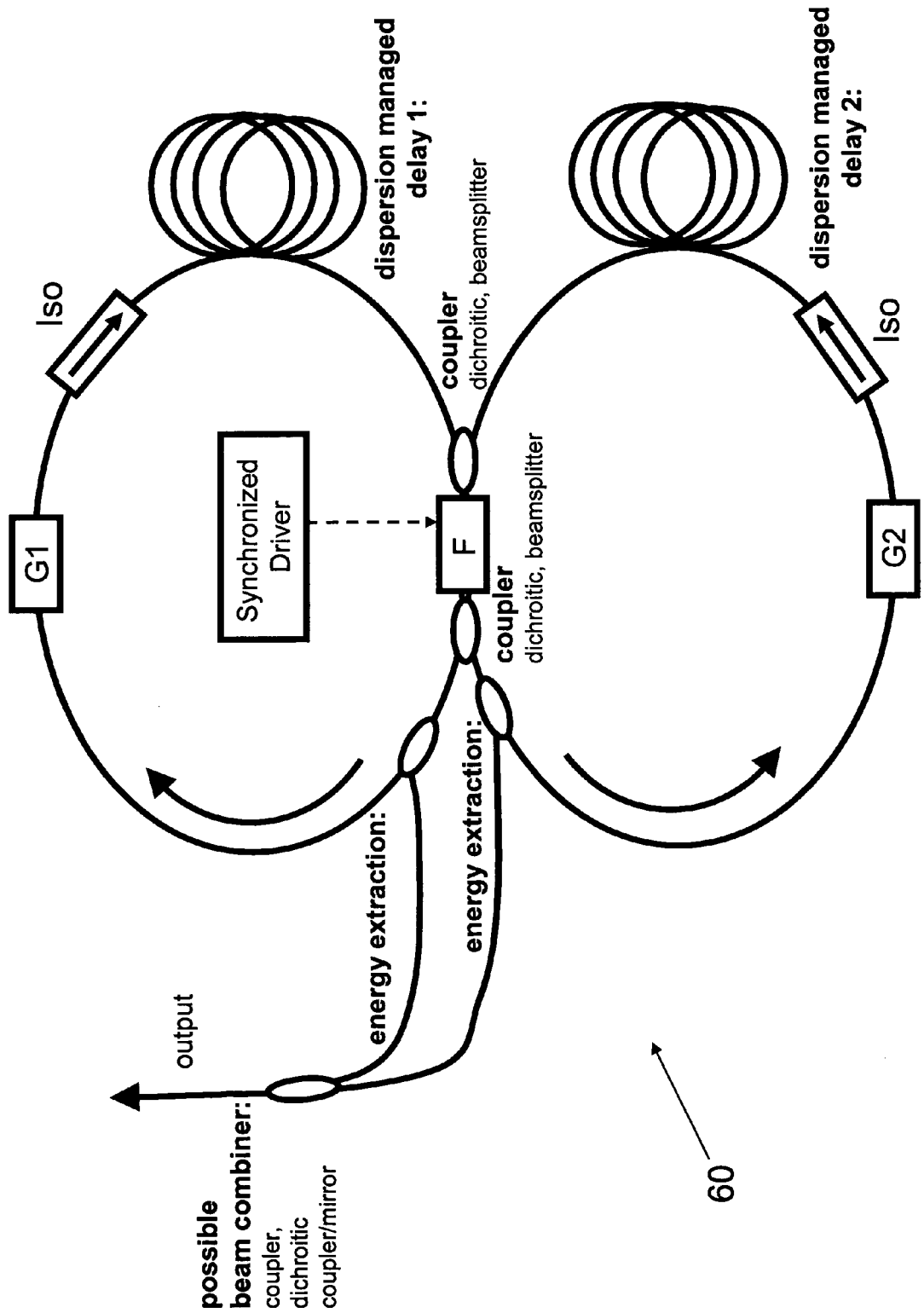
FIGS. 26*a*-26*b* are schematic diagrams depicting coupled cavities according to illustrative embodiments of the invention.
Figure 26B:
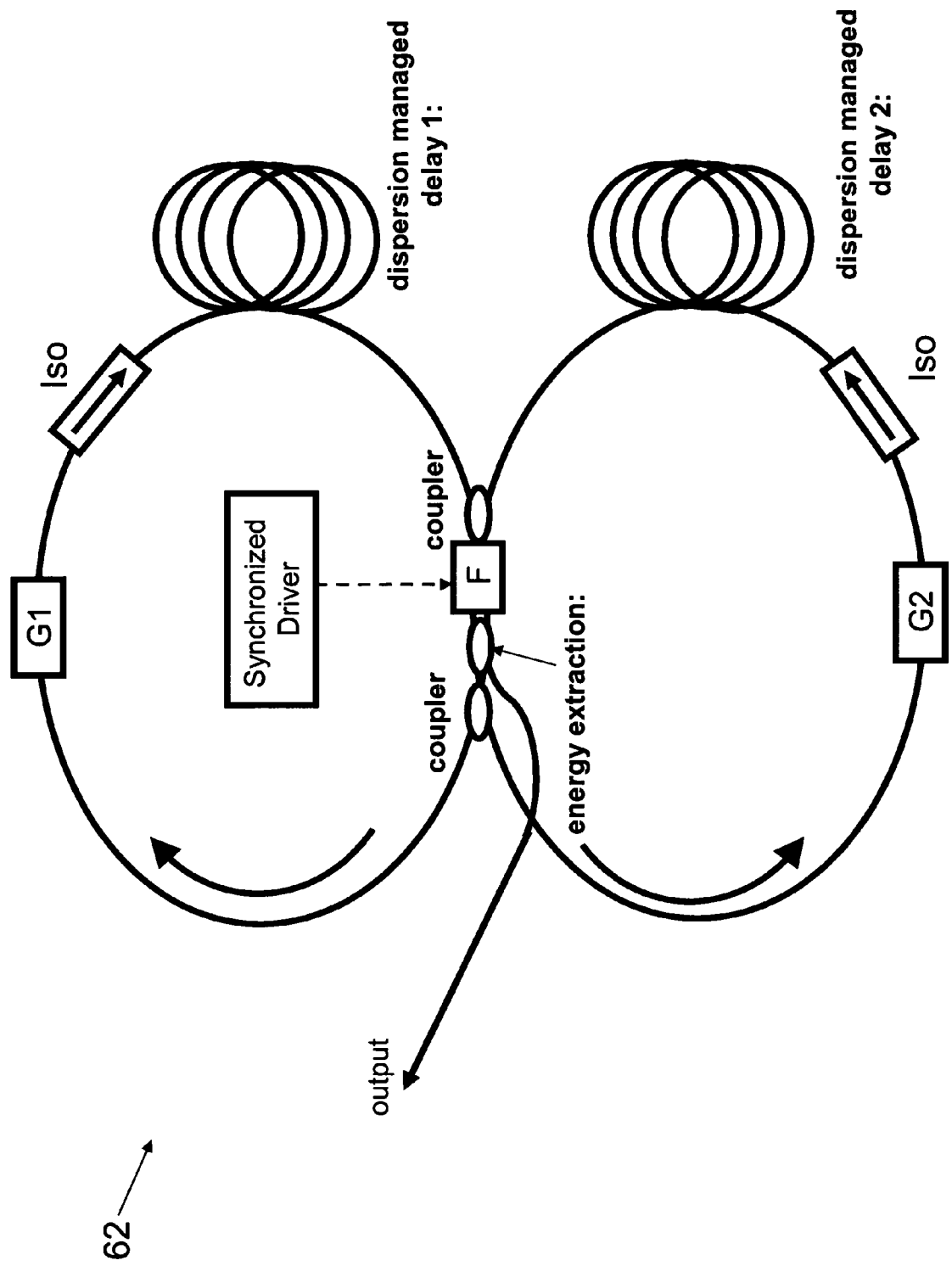

FIGS. 26a-b show the possibility of two optically coupled cavities 60, 62 to achieve broader tuning spectra and/or improve the dispersion management. A configuration of two ring cavities 60, 62 is shown, but other combinations of cavity types is possible such as wherein more than two cavities could be coupled. The two cavities are optically coupled by using couplers before and after the tunable filter F. The energy is extracted at one or more points of the cavities. It is possible to combine multiple outputs by a beam combiner (FIG. 26a). FIG. 26b shows cavities 60', 62' that illustrate the same concept with the energy extraction in the common path of both cavities. Synchronization of two cavities requires control or adjustment of their round trip times. Typically, the cavity round trip times should either be equal or a harmonic of each other.

Figure 27:
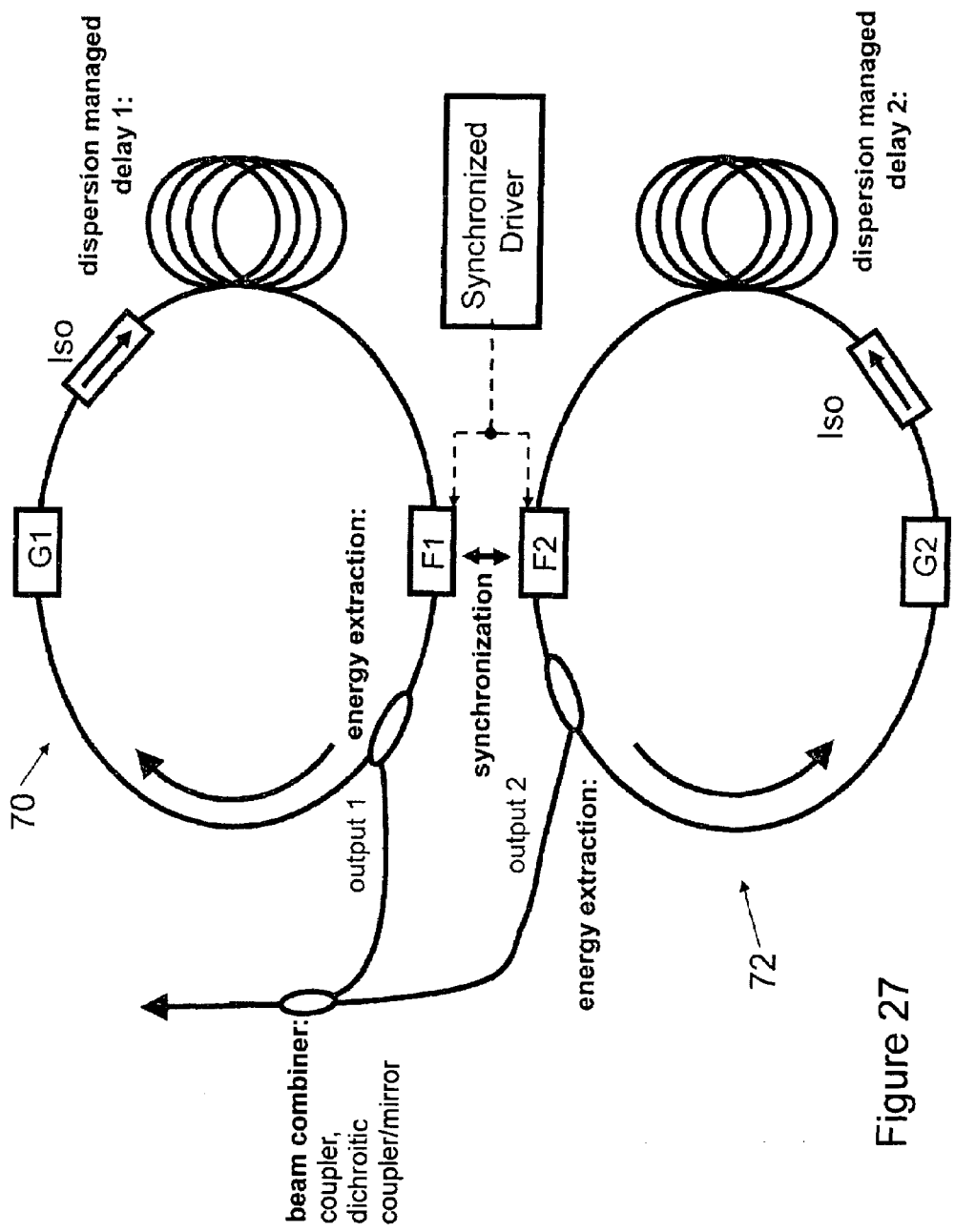
FIG. 27 is a schematic diagram depicting coupled cavities according to an illustrative embodiment of the invention.

FIG. 27 shows the synchronized operation of two individual cavities 70, 72. However, more than two cavities can be synchronized. The two cavities 70, 72 are synchronized by synchronizing the two separate filter elements. The energy is extracted at one or more points of the cavities. It is possible to combine multiple outputs. Accurate synchronization may require active feedback and adjustment of two separate drive signals to the two tunable filters F1, F2. This may be accomplished by measuring the laser outputs, by measuring the filter characteristics, and using this signal to adjust the drive signals. Synchronization of two individual cavities requires control or adjustment of their round trip times. The cavity round trip times should either be equal or a harmonic of each other.

Figure 28:
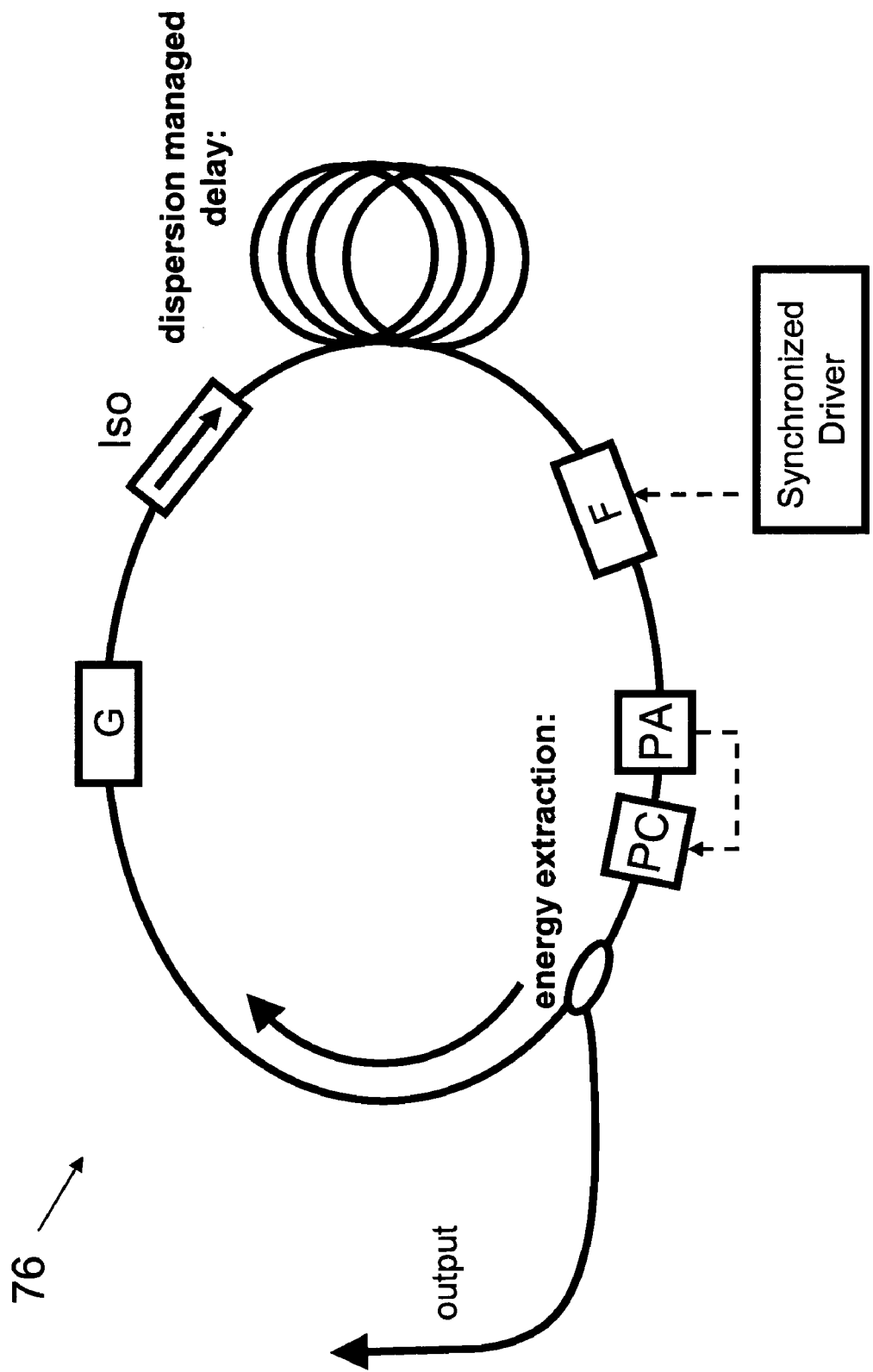
FIG. 28 is a schematic diagram depicting active polarization control according to an illustrative embodiment of the invention.

FIG. 28 shows a system 76 with active polarization control. The system includes a polarization analyzer (PA) and a polarization controller (PC). The PA can include a polarization beamsplitter that incorporates diodes or other suitable devices. This can be used to compensate for drift effects and changing birefringence in a fiber caused by vibrations and temperature changes. Active polarization control may also be required in cases where elements in the cavity, such as the gain medium, have non-uniform polarization characteristics. Active polarization control may also be desired if the laser is required to generate light within a well defined polarization, but the laser contains non-polarization maintaining elements. The analyzer PA analyzes the polarization state and generates a correction signal for the polarization controller PC. A passive polarization controller can also be used.

To stabilize the output sweep-frequency or variation-rate, a device for controlling the cavity length can be used. This can include any device which generates a group delay, such as a fiber stretcher, a temperature controller for the delay line or a controllable and adjustable free space delay. An error signal can be generated in the same way as for the active stabilization of the filter drive frequency on the roundtrip time shown in FIG. 24.

Figure 29:
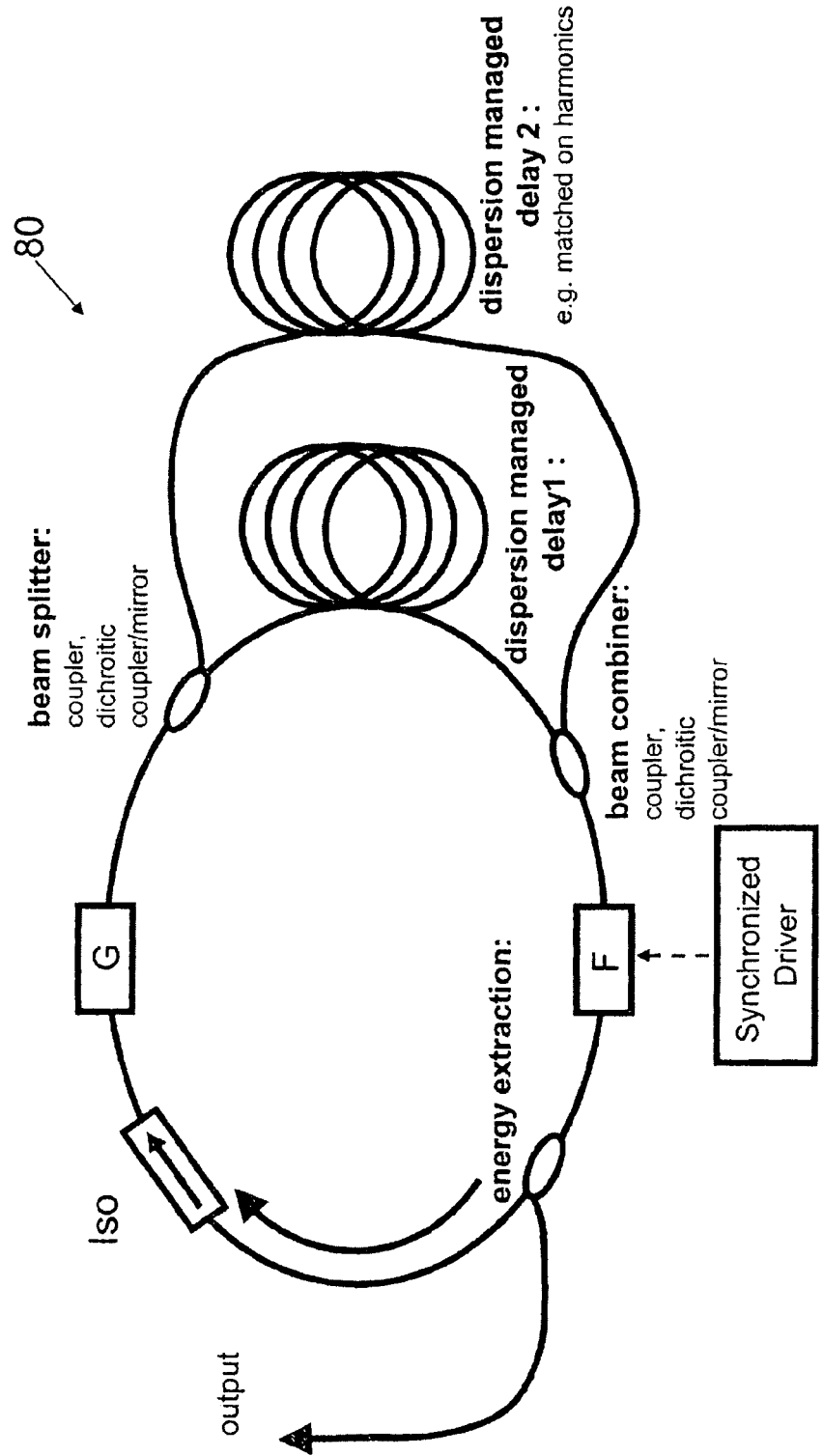
FIG. 29 is a schematic diagram depicting multiple delay elements for improved dispersion compensation and/or mixed feedback according to an illustrative embodiment of the invention.

FIG. 29 shows a system 80 having different delays within the cavity. The light in the cavity is split into two or more separate paths (for example by a dichroic splitter or other coupler). This approach can be used for better dispersion management, if different wavelengths travel in the different paths whereby the total dispersion in both paths is different. Also, this multiple delay based concept can allow for better compensation of higher order dispersion. Another application of this concept occurs when the roundtrip time in one arm matches the sweep period and the other matches a multiple (e.g. two times) the sweep period. This would result in a mixed feedback from one sweep to the next, as well as to the one after the next. For this reason a better phase stabilization can be expected, as an averaging effect in the feedback is achieved.

Figure 30:
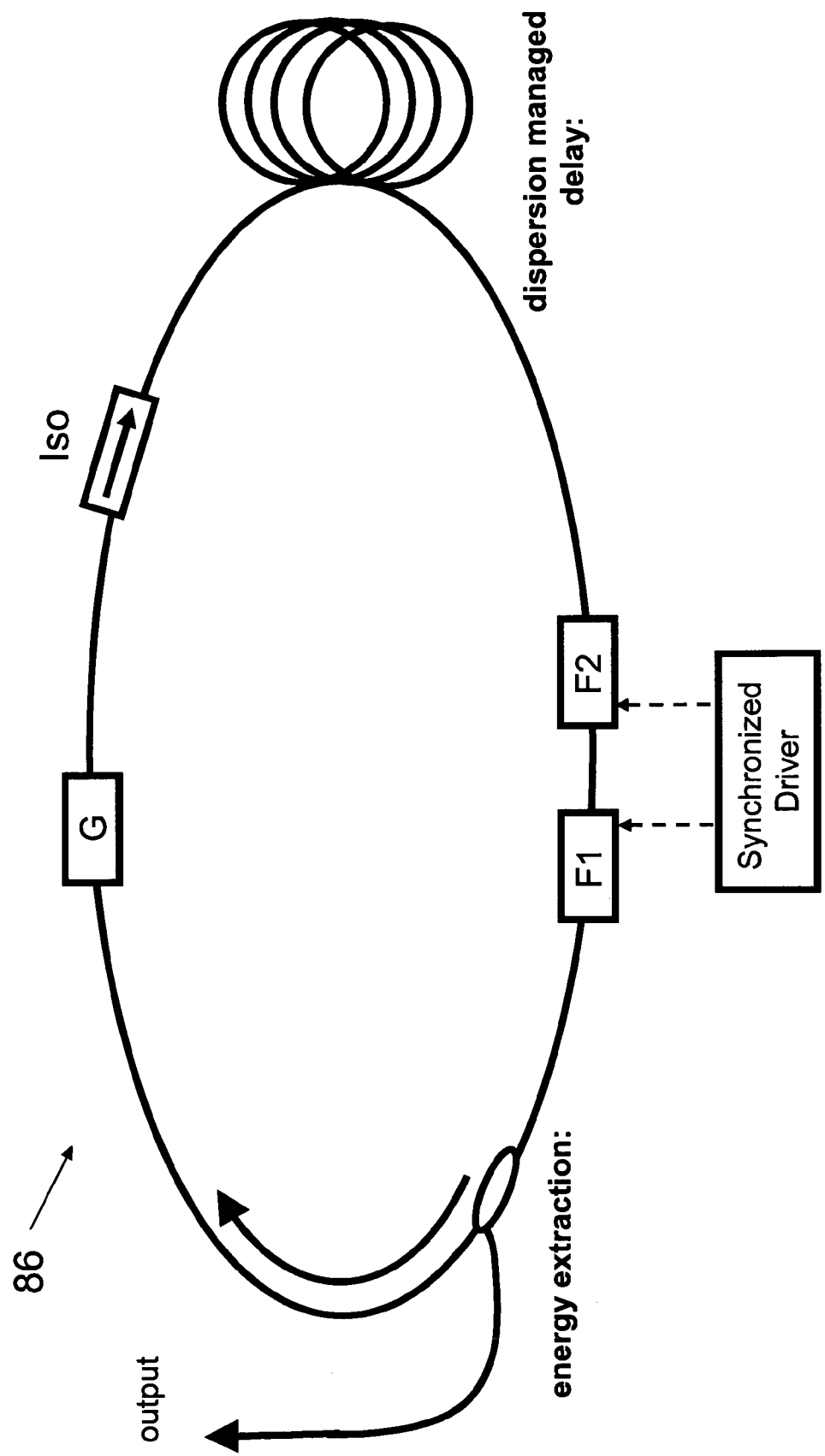
FIG. 30 is a schematic diagram depicting synchronized tunable filters in series according to an illustrative embodiment of the invention.
Figure 31:
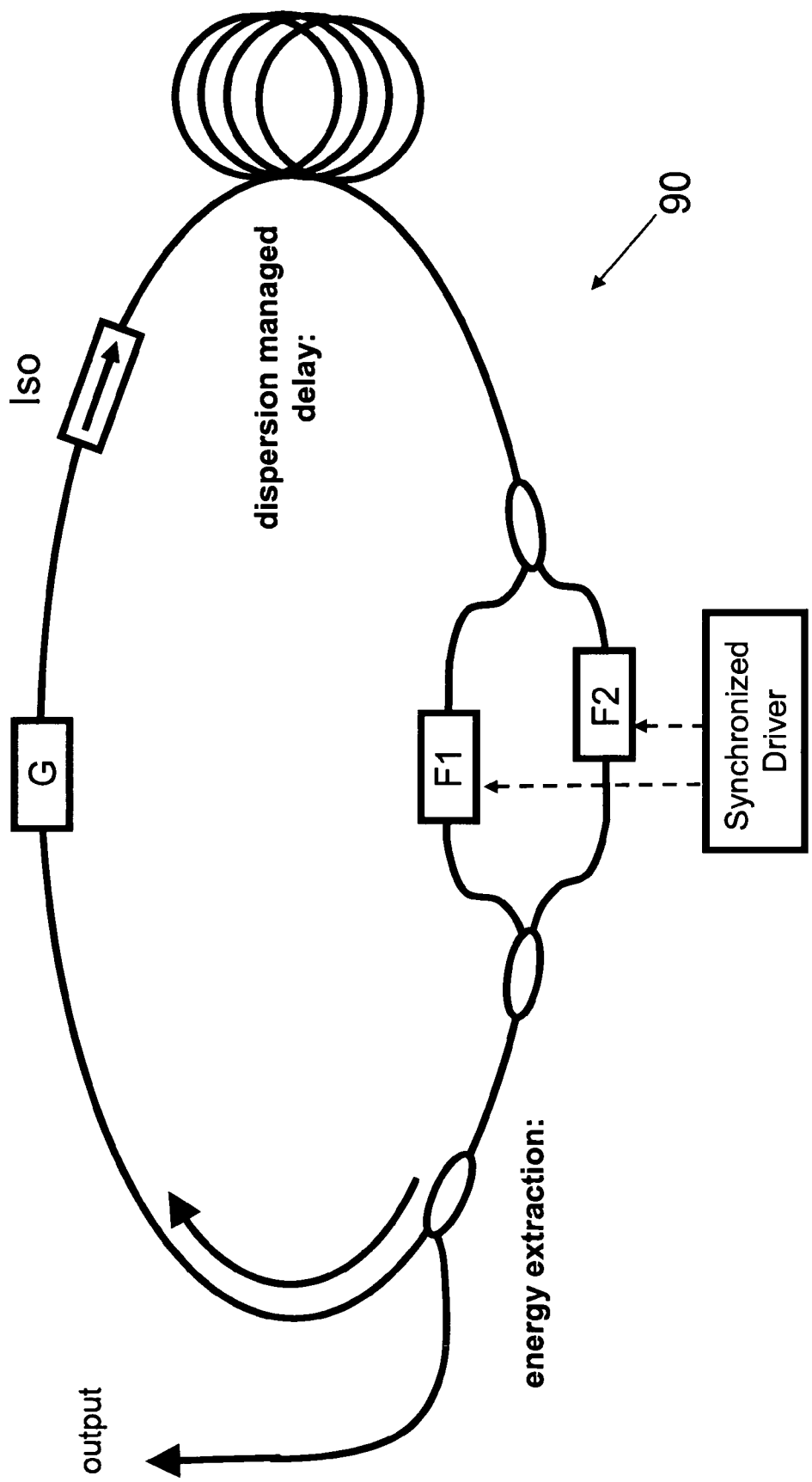
FIG. 31 is a schematic diagram depicting synchronized tunable filters in parallel according to an illustrative embodiment of the invention.

FIG. 30 shows a system 86 with two or more synchronized filters in series. This system can used to achieve a narrower filtering. Serial, coarse and a fine tuning can also be used. FIG. 31 depicts a system 90 for the parallel application (or a combination of serial and parallel assemblies) of two or more filters to allow for a wider tuning range if both filters have different spectral transmission ranges. The embodiments of FIGS. 30 and 31 can be combined in cascaded assemblies.

Figure 32A:
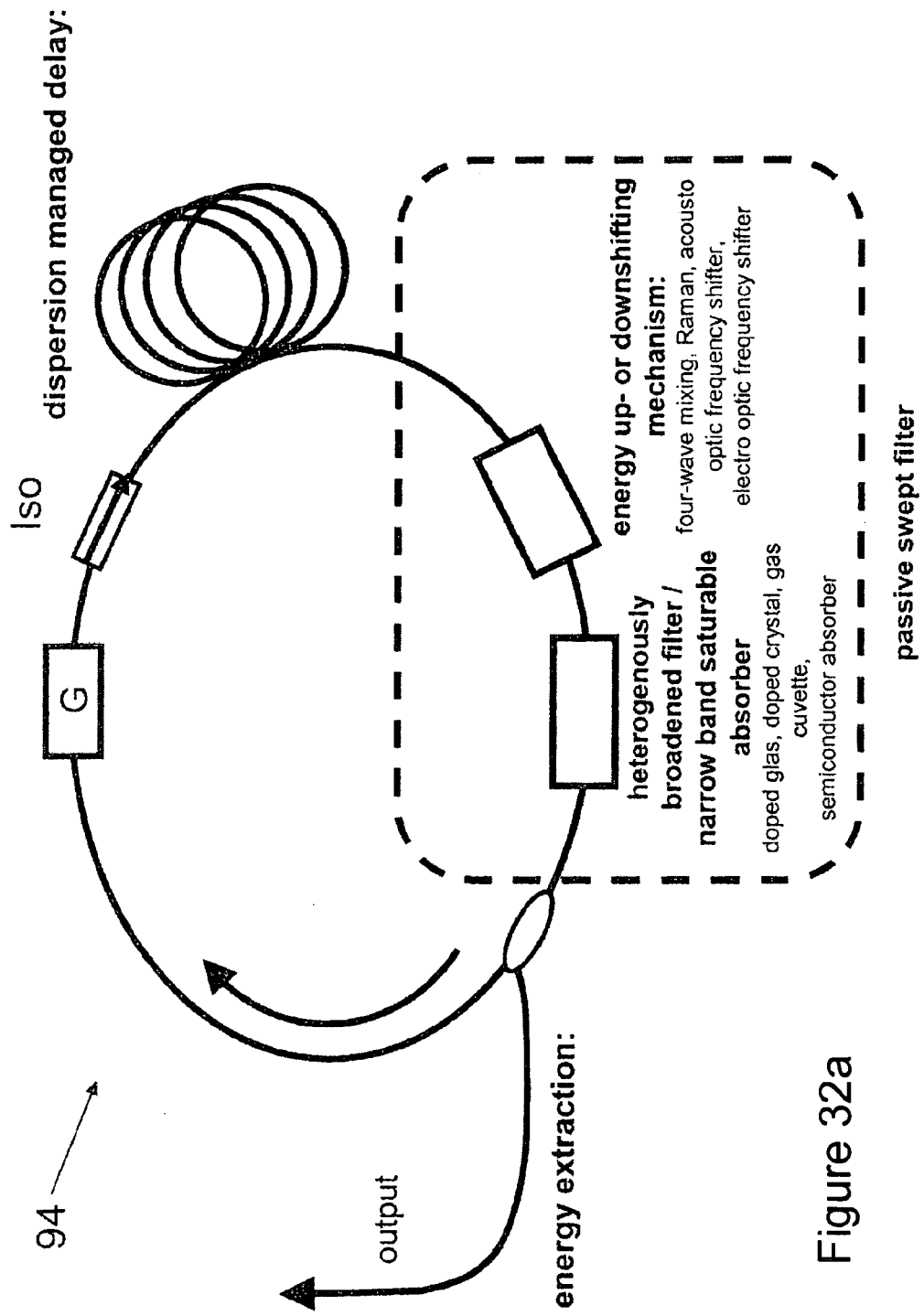
FIG. 32*a* is a schematic diagram depicting a passive swept filter according to an illustrative embodiment of the invention.
Figure 32B:
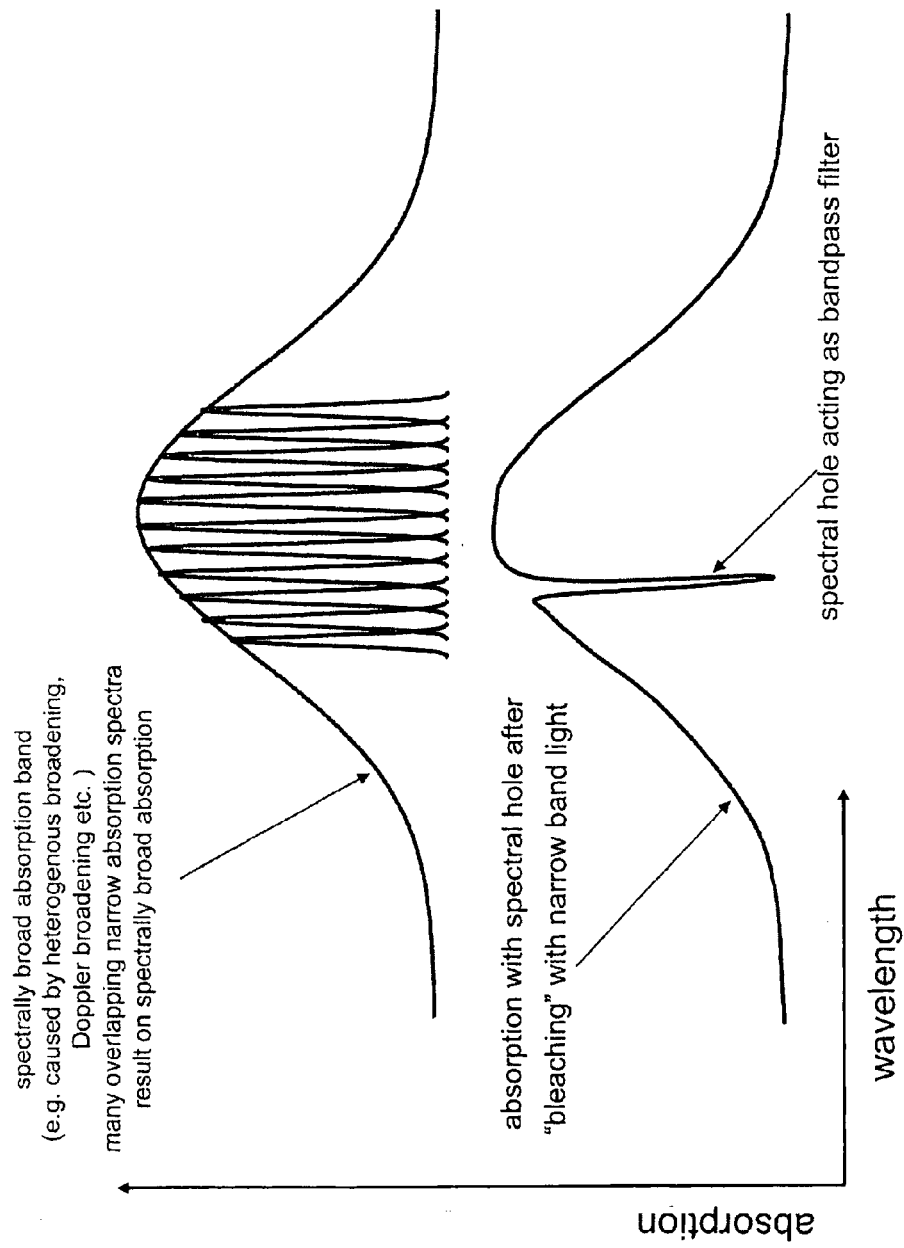
FIGS. 32*b*-32*c* are graphs depicting relationships associated with a passive swept filter according to a an illustrative embodiment of the invention.
Figure 32C:
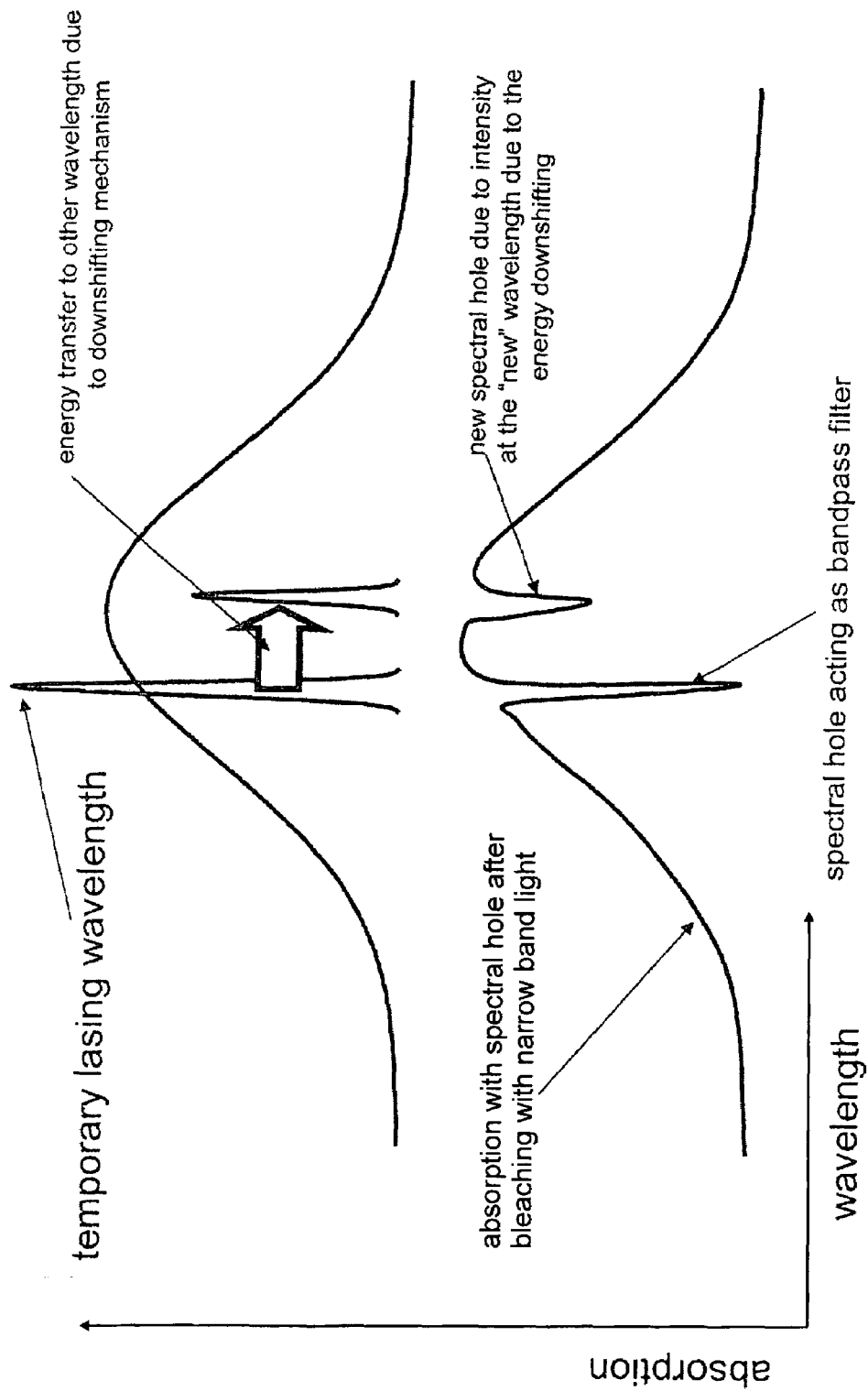

FIGS. 32a-c shows a system and the associated relationships for an embodiment of the invention that uses a passive swept filter. In the system 94 shown in FIG. 32a, a passive swept filter is used with no external control to regulate the filter. Such a filter has narrowband induced absorption characteristics which can occur over a broad spectral range, and a mechanism that shifts the absorption or results in an asymmetric absorption.

The absorption versus wavelength relationships associated with a passive filter are shown in FIGS. 32b and 32c. The non-linear effect of spectral hole-burning can be applied. If the filter has a spectrally broad absorption, which is caused by the superposition of many independent narrow band absorption spectra, incident light with a special wavelength can lead to a decreased absorption at this wavelength. This non-linear bleaching effect and the resulting spectral hole act as spectral narrow band-pass filter (See FIG. 32b bottom). This filter characteristic corresponds to the active filters in the preceding description. In the case of the passive swept filter, the active controllers of the previously described embodiments of the filters are replaced by a passive mechanism, which enables an up or downshifting of the filter wavelength or frequency as depicted in FIG. 32c.

Given narrowband lasing at a particular instant in time, an energy shifting mechanism such as four wave mixing effects, Doppler shift, Brillouin scattering, Raman-scattering or other effects can cause an energy transfer to longer or to shorter wavelengths in the passive filter. The generated narrowband light bleaches the filter at the new spectral position (FIG. 32c) and lasing at this position can occur. Setting the GDV to a non-zero value such that if two wavelengths are lasing simultaneously (in this example for energy downshifting operation) the longer wavelength is better synchronized and the shorter wavelength can help to stabilize the operation.

This concept can be used to construct a self-maintaining swept laser cavity without external control. To help start the laser operation, a narrowband seed laser can be used to inject (a pulse) of narrowband light into the cavity. However, self starting or starting of the lasing reaction by a small perturbation can also be expected. It is necessary to choose the correct operation point, regarding power, total linear and non-linear absorption coefficient of the filter, the correct non-linear coefficient for the energy shifting mechanism, length of the feedback line and GVD of the feedback line in such a way, that the FDML condition is fulfilled.

The passive swept filter can be a heterogeneously broadened absorber like dye molecules, doped glasses, doped crystals, (colloidal) semiconductor absorbers, photo-active proteins, and coupled dye-semiconductor systems. Also, Doppler broadening in gases, or the superposition of many narrowband absorbers can be applied. A filter that includes a superposition of many narrowband saturable absorbers, such as semiconductor absorbers, has the advantage of managing the linear and non-linear absorption characteristics independently. Cooling the filter for low temperatures, may be required to limit homogenous broadening. Besides two separate mechanisms for hole burning and frequency shifting, physical mechanisms like the dynamic Stokes shift can help to provide a "passive driver." In the case of using molecules as absorbers, the conformal reorganization (Stokes shift) leads to a dynamic shift of the bleached spectrum towards longer wavelengths. This effect results in an inherent dynamic frequency downshift to drive the passive filter.

Figure 33:
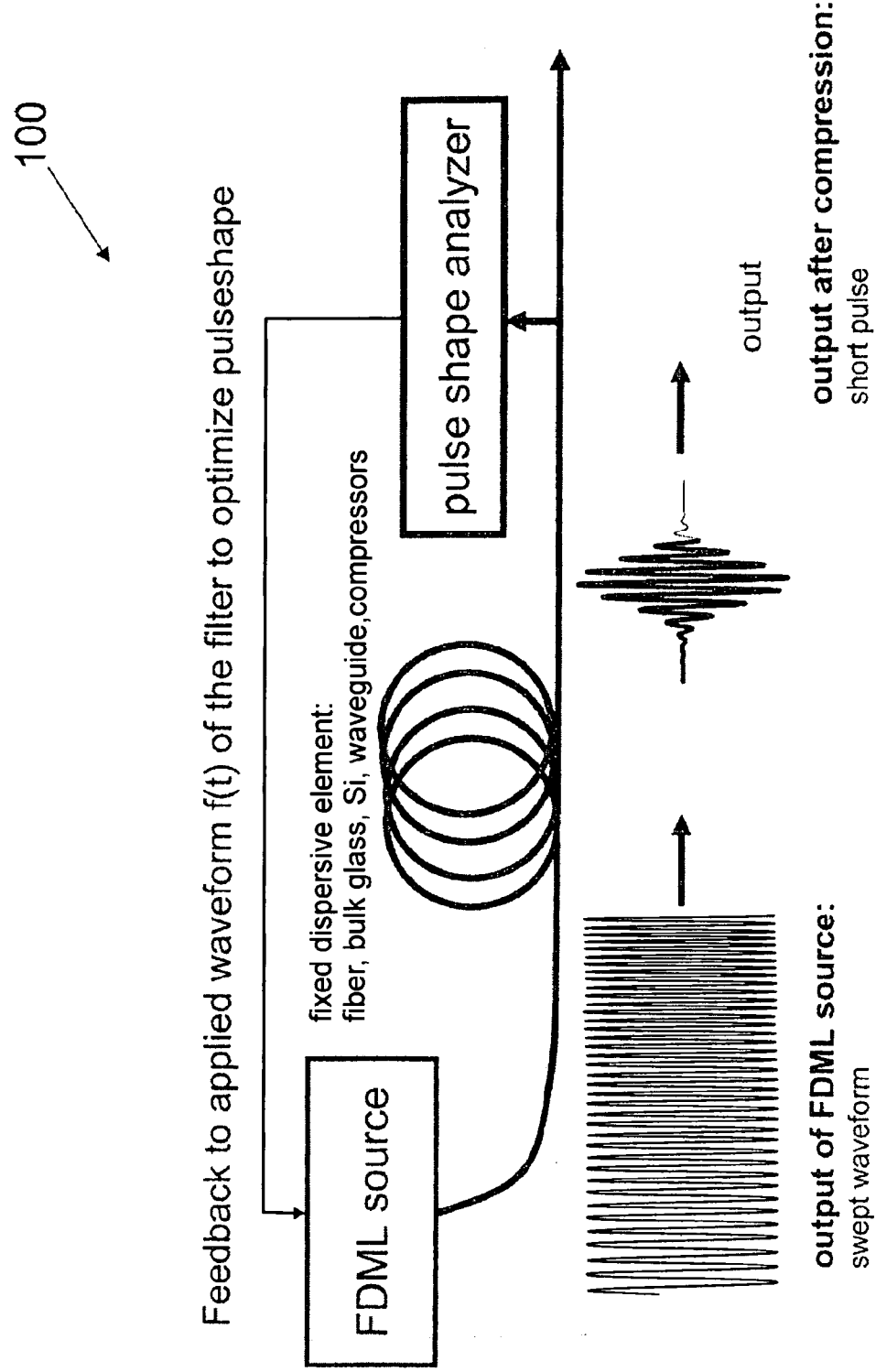
FIGS. 33-34 are schematic diagrams depicting compression of a generated swept waveform according to illustrative embodiments of the invention.
Figure 34:
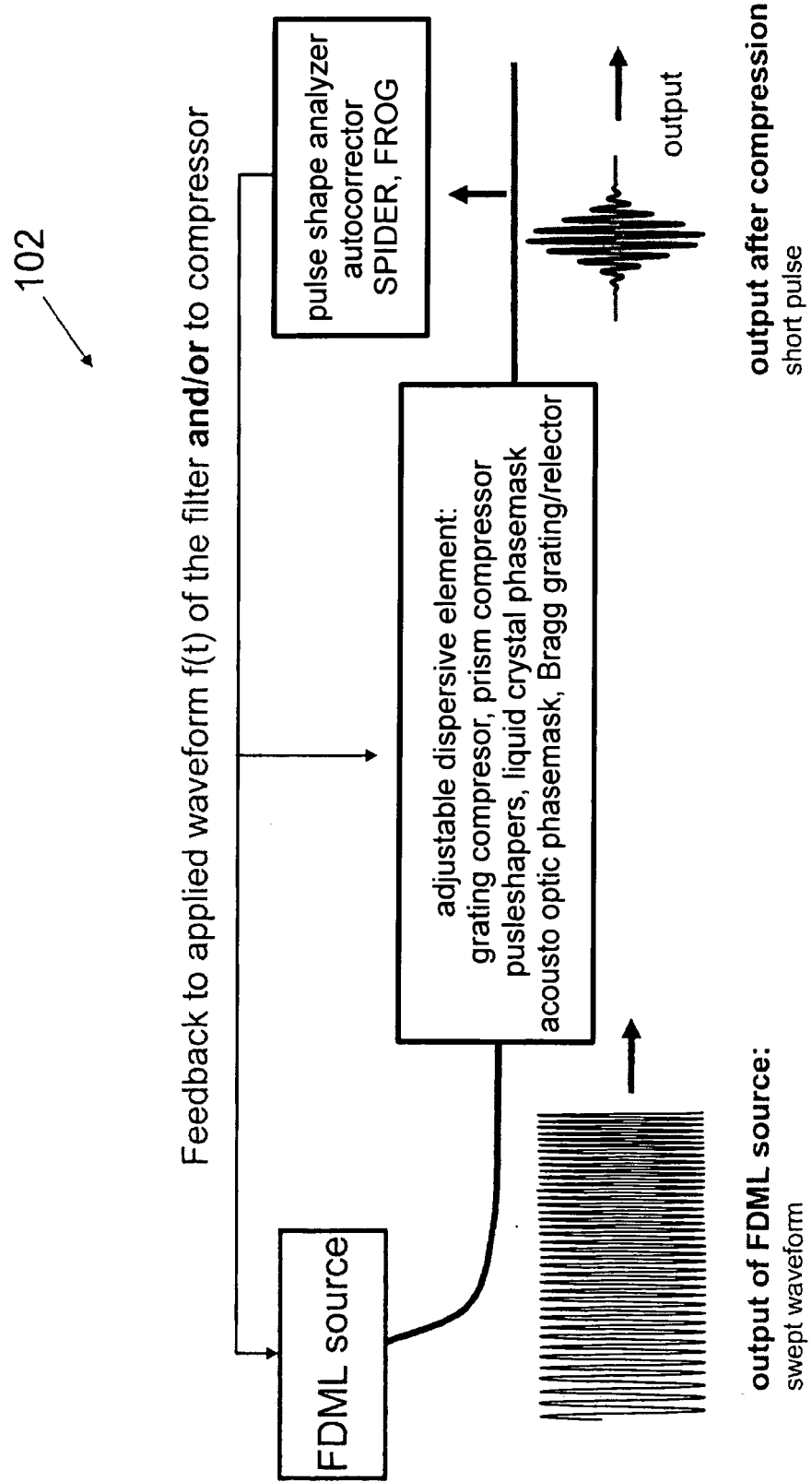

FIGS. 33 and 34 show embodiments 100, 102 for the generation of short pulses by FDML lasers. In FIG. 33 a system is shown wherein the compression of the pulse is achieved by introducing a dispersive material. This could be a highly dispersive fiber or dispersive bulk material which compresses the swept waveform to a pulse. To optimize the compression process, a pulse analyzer, measuring the pulse duration and/or phase, could generate an error signal in order to optimize the sweep function f(t). With this method it is possible to pre-compensate all orders of dispersion, which are introduced by the dispersive material and achieve compression. Pulse compression can also be achieved by standard prism compressors, grating compressors, liquid crystal or acousto optic pulse shaping devices as appropriate for the system 102 in FIG. 34. In such embodiments, the amount of dispersion introduced by the compressor can be adjusted, so that a feedback from a pulse analyzer to both, the waveform generator as well as the compressor is possible.

Figure 35:
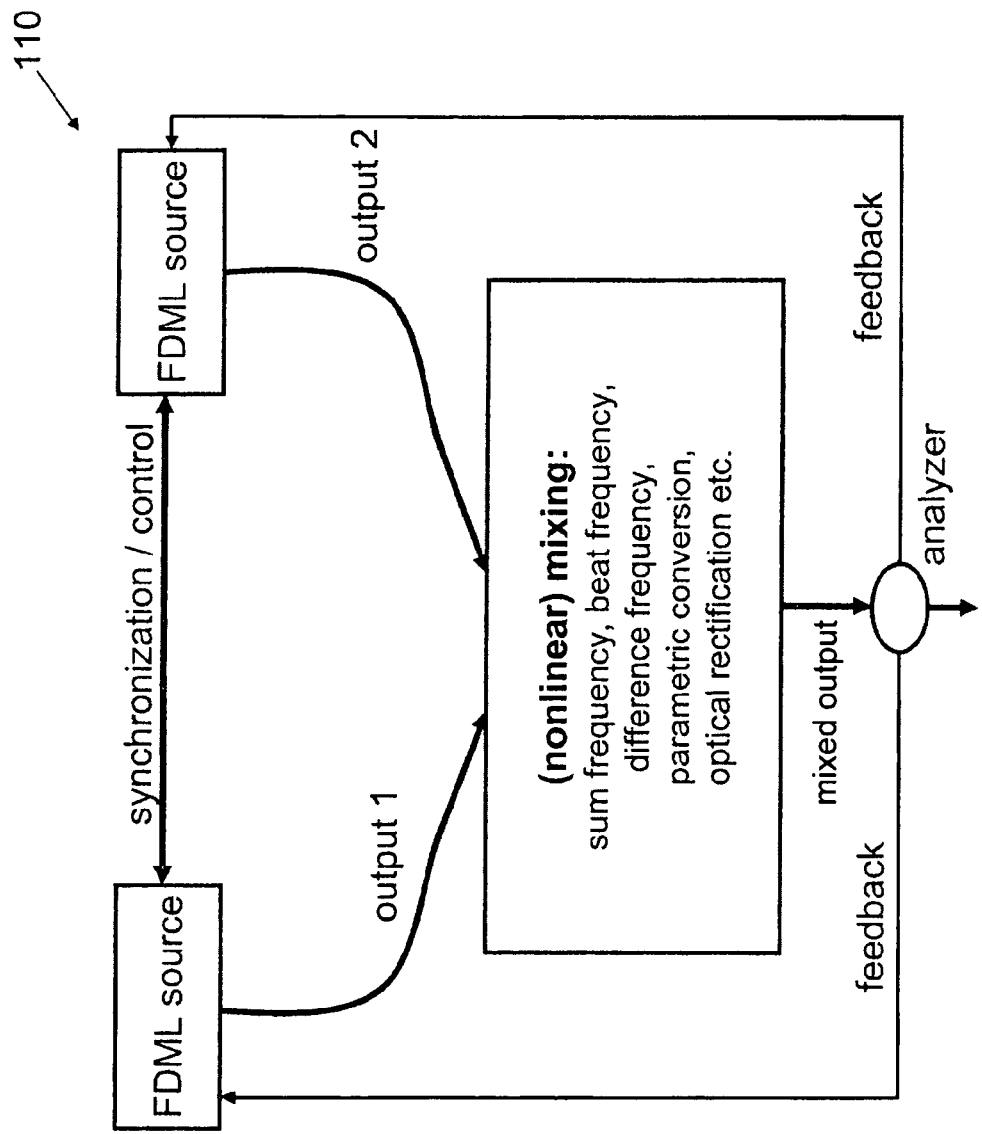
FIG. 35 is a schematic diagram depicting mixing of different outputs of different wave sources according to an illustrative embodiment of the invention.

FIG. 35 shows a FDML light source 110 mixing the outputs of two or more synchronized or simultaneously controlled FDML sources. The mixing process can be linear (superposition) or non-linear. The processes include sum frequency generation, beat frequency generation, difference frequency generation, parametric conversion, optical rectification, and others. A feedback from the mixed output to the FDML sources provides a defined tuning of the output parameters of the mixing device. By adjusting the timing of the different sources in the case of difference frequency mixing, a fast tunable CW-light source is possible.

Figure 36:
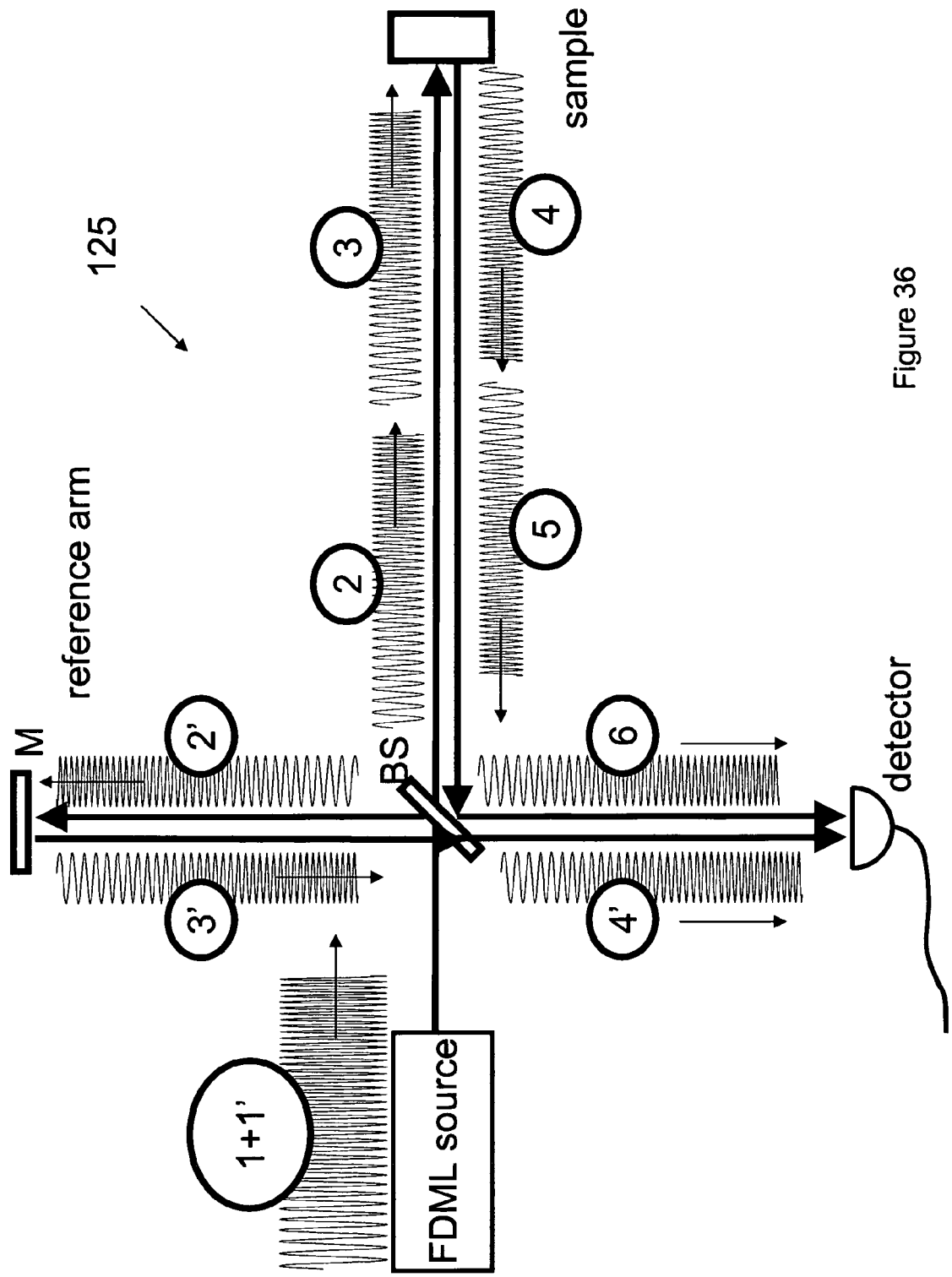
FIG. 36 is a schematic diagram depicting an interferometer having asymmetric delay according to an illustrative embodiment of the invention.

Since the FDML light source generates a periodic output which is obtained from successive roundtrips of the cavity, these outputs at different times will be coherent with respect to each other. FIG. 36 shows a system 125 that includes an interferometer incorporating a FDML source. The example shows a Michelson interferometer, but the following description applies for other interferometer types as well. The system 125 shows a profilometer based upon a frequency swept source OCT system or an optical Fourier domain reflectometer. The swept waveform from the FDML source is split by the beam splitter (BS) into a reference arm and a sample arm. The mirror in the reference arm reflects the intensity back to a detector. In the sample arm light is reflected or scattered back from the sample. Both waveforms are combined by the beamsplitter and a detector detects the interference signal. After Fourier transformation of the time dependent interference signal, a profile of the reflection intensity and/or phase can be extracted (see system in FIG. 6).

In contrast to all other non-mode locked swept sources, in the case of a FDML source the arm length of the interferometer can be extremely asymmetric, because it is possible to observe the interference between one frequency sweep and the next sweep. This concept is visualized in FIG. 36 by the numbering of the consecutive sweeps. Six (6) swept waveforms of the source are shown. As shown, waveforms 2-6 have already passed the beamsplitter. The parts of the swept waveforms, which went through the reference arm, are marked with an apostrophe. In the example waveform 4' and 6 overlap on the detector.

Only in mode-locked sources such as in the FDML case, a representative interference pattern can be observed, because a fixed phase evolution over the sweep is required. The concept of overlapping different sweeps applies only to mode locked sources. With other swept sources, only interference within one sweep can be observed. This fact allows for extremely asymmetric arm lengths of the interferometer, where the beat frequency of the interference signal can be much smaller and therefore easier to handle, because it only depends on the difference in frequency, no matter if the overlap is between different sweeps. This provides enhanced performance for measurements over long distances or OCT measurements of remote samples by keeping a reasonable length for the reference arm. The embodiment of FIG. 36 is suitable for heterodyne measurement.

Current frequency swept laser sources exhibit a compromise between tuning speed or instantaneous linewidth. Very narrow band or single-mode swept lasers typically sweep with a few nanometers per second corresponding to a sweep repetition rate of several Hertz. Fast swept lasers with several Kilohertz tuning repetition rates have instantaneous linewidths of approximately 0.1 nm corresponding to a coherence length of several millimeters. For example, the embodiment depicted in FIG. 5a sweeps at 58 kHz and 116 kHz and shows a coherence length of >>4 cm corresponding to <<0.03 nm linewidth. The actual linewidth is expected to be much narrower, and quasi single line sweeping could be possible. This corresponds to an improvement of at least a factor of 10× in linewidth compared to existing high speed swept sources and to an increase of the sweep speed of a factor 10,000 compared to single line swept lasers.

For optical chirped radar or profilometry (see FIG. 6) often a Michelson interferometer with significantly different arm lengths is used (FIG. 36). Therefore, the sweep speed is usually limited in order to keep the beat frequency low enough to handle the generated beat frequencies of the electronic signals. FDML sources offer a fundamental advantage in this respect because the subsequent frequency sweeps have a fixed phase relation. As a result, it is possible to observe interference between two different sweeps and therefore the observed fringe frequency will be lower or the possible sweep frequency higher. A special embodiment with a detailed description of this concept is given in the last section and in FIG. 36. With FDML sources, high speed long distance profilometers having micrometer resolution are possible.

As discussed above, Fourier-Domain Mode Locking generates a sweep in frequency equivalent to a maximum chirped or stretched pulse. As the different modes have a fixed phase relation, the stretched pulse can be compressed (see FIGS. 33 and 34). This means that for a given average power, the intensity inside the cavity is minimized. But as the peak intensity limits the maximum achievable pulse power in almost all mode locked lasers, Fourier Domain Mode Locking might be used to generate higher pulse powers. Stretching a pulse and post amplifying are not needed if a broadband highly chirped pulse can be directly generated with a frequency chirp suitable for compression. A further advantage of the aspects of the invention arises because the function f(t) (see FIG. 1) can be arbitrarily chosen and therefore pulse-shaping within the device itself can be performed (FIGS. 33 and 34). Higher order chirp of the subsequent compressor can be precompensated. These features make FDML lasers superior to many other pulsed lasers regarding maximum pulse energy and minimum pulse duration. Because it is possible to generate high pulse energies and short pulses with semiconductor based lasers, a dramatically lower cost for such devices is expected.

There are four main fields of applications for the presented invention:
  I) Generation of fast sweeps in terms frequency using swept laser sources;
  II) Development of chirped optical radar devices;
  III) Generation of high power laser pulses; and
  IV) Generation of a multi-wavelength signal source for optical fiber communication.

However, the techniques disclosed herein are not limited solely to these fields.

For many applications, like chirped radar, swept source optical coherence tomography, spectrographs and spectrometers, scanning photometers, fiber sensing, and optical Fourier domain reflectometers, a fast swept laser source with narrow linewidth is important. Typical prices for such swept laser sources are in the range of 20 to 30 thousand dollars. Many companies are working to develop such sources right now. The fundamental improvement in performance of the present invention compared to other swept sources could allow the systems disclosed herein to replace a significant part of these swept sources by devices based on the presented FDML concept. The fact that none of the commercially available swept laser sources has a fixed phase relation between two sweeps, could allow for high speed profilometry over long distances, new devices could be built for quality control of difficult to access surfaces, like turbines, large sheet metals etc. These measurements are difficult to perform with the currently available sources.

As in the previous section discussed above (see FIG. 36), only modelocked lasers or lasers with a fixed phase evolution over each sweep can be used to make interferometric measurement by overlapping one sweep with another. Especially for remote measurements, where a highly asymmetric arm length of the interferometer is required, FDML sources could be the only choice for fast measurements. New high speed optical chirped radar devices for remote profile analysis with a micron scale resolution can use the sources disclosed herein. Thus, handheld profilometry devices measuring over many meters with micron accuracy may be possible.

Laser pulses with high peak intensity have a broad application in many fields. For example, these fields include, but are not limited to machining, welding, drilling, surgery, telecommunication, optical switching, and nonlinear optics. The significantly improved performance of the present invention allows the systems disclosed herein to be used in lieu of standard mode locked systems. In particular, companies in the field of fiber lasers and semiconductor lasers will be interested, because the high nonlinearities of these gain media hinder high pulse energies, but offer less expensive sources with improved reliable sources.

As described above, the invention describes a mode-locked laser which generates frequency sweeps. Because these periodic sweeps show a typical comb-structure in the output spectrum over the whole sweep bandwidth, it is possible that this source provides a multiple wavelength continuous wave (CW) light source by separating each mode through a spectral filter. Each separated mode acts as a narrowband continuous wave light source, which is separately modulated for encoding data. Presently, this technique is possible using short pulse mode-locked lasers. The superior power performance of the described invention, due to the minimized nonlinearities in the cavity, indicates that the systems described herein can provide higher performance for these kinds of applications.

It should be appreciated that various aspects of the claimed invention are directed to subsets and substeps of the techniques disclosed herein. Further, the terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed. Accordingly, what is desired to be secured by Letters Patent is the invention as defined and differentiated in the following claims, including all equivalents.

What is claimed is:

1. A frequency varying wave generator comprising:
    a gain element adapted to amplify a wave having a wavelength;
    a time varying tunable wavelength selective filter element being adjustably tunable over a given periodic time T, and in communication with the gain element, the tunable filter element adapted to selectively filter waves; and
    a feedback element in communication with the tunable filter element and the gain element,
    wherein the tunable wavelength selective filter element, the gain element and the feedback element define a circuit such that the roundtrip time for the wave to propagate through the circuit is substantially equal to a non-zero integer multiple of the periodic time T.

2. The wave generator of claim 1 wherein the waves are electromagnetic waves and have wavelengths in the range of about 600 nm to about 2000 nm.

3. The wave generator of claim 1 wherein the waves generated are electromagnetic waves.

4. The wave generator of claim 3 wherein the waves are electromagnetic waves and have wavelengths in the range of about 1200 nm to about 1600 nm.

5. The wave generator of claim 1 wherein the tunable filter element is a tunable band-pass filter.

6. The wave generator of claim 1 wherein the time varying tunable wave length selective filter element and the gain element are a single apparatus.

7. The wave generator of claim 1 further comprising an optical compressor in optical communication with the circuit.

8. The wave generator of claim 1 wherein the filter element is a passive filter.

9. The wave generator of claim 1 wherein the filter element is self-tuning.

10. The wave generator of claim 1 wherein the wavelength is optical and the tunable filter element is selected from the group consisting of: an acoustic-optical filter, an electro-optical filter, a Bragg filter, a graded interferometric filter, a prismatic filter, and a grating filter.

11. The wave generator of claim 1 wherein the tunable filter element is a Fabry Perot filter.

12. The wave generator of claim 1 wherein the tunable filter element is a Mach Zehnder filter.

13. The wave generator of claim 1 wherein the feedback element further comprises a means for performing dispersion management.

14. The wave generator of claim 13 wherein the means for performing dispersion management is selected from the group consisting of: an optical fiber, a free space element, a telescope element, and a multi-pass cavity element.

15. The wave generator of claim 1 wherein the feedback element is selected from the group consisting of: an optical fiber, a free space element, a waveguide, a telescope element, and a multi-pass cavity element.

16. The wave generator of claim 1 further comprising an energy extraction element in optical communication with the circuit.

17. The wave generator of claim 1 wherein the gain element is selected from the group consisting of: a semiconductor optical amplifier, a fiber amplifier, a dye amplifier, an excimer amplifier, a solid state amplifier, a Raman amplifier, a gas amplifier, a Brillouin amplifier, and a parametric amplifier.

18. The wave generator of claim 1 wherein the feedback element comprises at least two mirrors.

19. The wave generator of claim 1, wherein the energy is extracted at two or more different points in the circuit to generate temporally shifted output waves.

20. The wave generator of claim 1, wherein the energy is extracted at two or more different point in the circuit to generate temporally shifted output waves which are combined in an external device.

21. An apparatus adapted for generating waves having temporally varying frequencies, the apparatus comprising:
- a gain element adapted for amplifying waves having different wavelengths;
- a time varying tunable wavelength selective filter element configured to be adjustably tunable over a given periodic time T;
- a feedback element in communication with the gain element and the tunable filter element
- the tunable filter element, gain element and feedback element defining a circuit such that the roundtrip time of the wave substantially equals a non-zero integer multiple of a periodic time T during which the tunable filter element is tuned.

22. The apparatus of claim 21, wherein the energy is extracted at two or more different points in the circuit to generate temporally shifted output waves.

23. The apparatus of claim 21, wherein the energy is extracted at two or more different points in the circuit to generate temporally shifted output waves which are combined in an external device.

24. The apparatus of claim 21 wherein the time varying tunable wavelength selective filter element has an associated substantially periodic varying wavelength dependent loss or gain.

25. The apparatus of claim 21 further comprising at least one energy extraction mechanism adapted for transmitting energy from the circuit.

26. The apparatus of claim 21 wherein the waves are electromagnetic waves.

27. The apparatus of claim 21 wherein the feedback element contains an element for performing dispersion management.

28. The apparatus of claim 21 wherein the tunable wavelength selective filter element is a tunable bandpass filter and is tuned continuously over time to generate a frequency sweep.

29. The apparatus of claim 21 wherein the circuit defined by the filter element, gain element and feedback element is selected from the group consisting of: a laser having a linear laser cavity, a laser having a ring cavity, and a laser having a sigma-ring cavity.

30. The apparatus of claim 21 wherein the circuit defined by the filter element, gain element and feedback element is a ring laser cavity.

31. The apparatus of claim 21 wherein the circuit defined by the filter element, gain element and feedback element is a sigma-ring laser cavity.

32. The apparatus of claim 21 wherein the tunable wavelength selective filter element is selected from the group consisting of: a Fabry Perot filter, a tunable etalon filter, an optical grating filter, a spectral filter, an acousto optic spectral filter, an electro-optic spectral filter, a Mach Zehnder or Michelson based filter and a thin film interferometric filter.

33. The apparatus of claim 21 wherein tunable wavelength selective filter element and the gain element are one physical entity such that the gain medium is adapted to provide a tunable wavelength dependent gain factor.

34. The apparatus of claim 21 wherein the feedback element is an optical delay line selected from the group consisting of: an optical fiber, a free space beam, a multi-pass cavity, a waveguide, and a telescope assembly.

35. The apparatus of claim 21 wherein the gain element is selected from the group consisting of: a rare earth doped fiber amplifier, a dye amplifier, an excimer amplifier, a solid state amplifier, a semiconductor optical amplifier, a Raman amplifier, a gas amplifier, a Brillouin amplifier, and a parametric amplifier.

36. A method of frequency sweeping a wave generator comprising a gain element, a tunable filter in communication with the gain element and a feedback element in communication with the tunable filter and the gain element, the tunable filter, gain element and feedback element defining a circuit, the method comprising the steps of:
- generating waves; and
- periodically tuning a tunable filter being adjustably tunable over a given periodic time T, such that the waves travel from the filter element through the circuit and back to the filter element during a time which is a non-zero integer multiple of time T.

37. The method of claim 36 further comprising the step of performing heterodyne measurements using waves from different filter tuning periods.

38. The method of claim 36 further comprising the step of superimposing electric fields of two different waves separated in time, wherein the separation time is longer than one roundtrip time.

39. The method of claim 36 wherein the waves are substantially short pulses generated using a compressor.

40. A laser for generating light having time varying wavelengths, the laser comprising:
- a gain element having a spectral bandwidth;
- a time varying, tunable optical bandpass filter being adjustably tunable over a given period time T and having an optical pass band that is varied during the periodic time T; and
- a feedback element in communication with the gain element and the filter, forming a laser resonator, wherein the roundtrip time of the optical waves in the resonator is substantially equal to a non-zero integer multiple of the time T.

41. The laser of claim 40 wherein the laser resonator is an optical fiber based laser resonator.

42. The laser of claim 40 wherein the filter is a tunable Fabry Perot filter.

43. The laser of claim 40 wherein the feedback element is a single mode optical fiber.

44. The laser of claim 40 wherein the gain element is a semiconductor optical amplifier.

45. The claim 40 wherein the resonator comprises an optical isolator.

46. The laser of claim 41 further comprising a fiber coupler, the fiber coupler adapted to extra energy from the resonator.

47. The laser of claim 40 wherein the feedback element contains a means for performing dispersion management.

48. The laser of claim 40 further comprising an external optical compressor in optical communication with the laser.

49. The laser of claim 48 wherein the compressor is adapted to substantially compensate for a relative time delay associated with waves emitted from the laser by regulating the transit time through the compressor for waves having different wavelengths.

50. The laser of claim 48 wherein the compressor is a dispersion compensating optical fiber adapted to generate temporally short optical pulses from the laser.

51. The laser of claim 48 further comprising a pulse analysis system and a feedback control system in communication with the filter.

52. The laser of claim 48 wherein the compressor is a grating type compressor.

53. The laser of claim 40 further comprising an interferometer, the interferometer adapted to superimpose electric fields of two different waves generated by the laser, wherein the waves are separated by a time period longer than one roundtrip time.

54. The apparatus of claim 21 wherein a timing error of the filter is less than 0.01% of a drive period.

55. The apparatus of claim 21 where a frequency of a driver is matched to within 1 Hz.

56. The apparatus of claim 21 where a ratio between roundtrip-time of and timing error is larger than between sweep range and filter bandwidth.

57. The apparatus of claim 21 where the gain element is modulated in combination with a time multiplexed output.

58. The apparatus of claim 21 where the gain element is modulated to achieve higher sweep rates in combination with time multiplexed output.

59. The apparatus of claim 21 where the roundtrip time of the waves in the circuit is detuned from a non-zero integer multiple of the period T.

60. The apparatus of claim 21 comprising a feedback-system to adjust the filter tuning period.

61. The apparatus of claim 21 comprising two or more gain elements.

62. The apparatus of claim 21 comprising two or more synchronized filter elements.

63. The apparatus of claim 21 comprising two or more synchronized apparatuses in communication with each other.

64. The apparatus of claim 21 comprising two or more paths for wave propagation.

65. The apparatus of claim 21 comprising two or more paths for wave propagation wherein a delay for propagation through one path is a non-zero integer multiple of an other path through the circuit.

66. The apparatus of claim 21 wherein an instantaneous linewidth of the wave is narrower than the filter bandwidth.

67. The laser of claim 40 wherein a timing error of the filter is less than 0.01% of a drive period.

68. The laser of claim 40 wherein a frequency of the filter is matched to within 1 Hz.

69. The laser of claim 40 where a ratio between roundtrip-time of and timing error is larger than between sweep range and filter bandwidth.

70. The laser of claim 40 wherein the gain element is modulated such that unidirectional sweep operation is achieved.

71. The laser of claim 40 wherein the gain element is modulated such that a multiple of the sweep rate can be generated.

72. The laser of claim 40 wherein the resonator has a sigma-ring geometry.

73. The laser of claim 40 wherein the resonator has a sigma-ring geometry comprising a polarization beam splitter.

74. The laser of claim 40 comprising a feedback-system to adjust a filter tuning period.

75. The laser of claim 40 comprising two or more synchronized filter elements.

76. The laser of claim 40 comprising two or more gain elements.

77. The laser of claim 40 comprising two or more cavities sub-resonators with a common filter element.

78. The laser of claim 40 comprising two or more synchronized lasers in communication with each other.

79. The laser of claim 40 comprising a branched path.

80. The laser of claim 40 comprising a branched path wherein a propagation delay through one path is a non-zero integer multiple of a propagation through an other path.

81. The laser of claim 40 wherein the resonator comprises a polarization maintaining fiber.

82. The laser of claim 40 wherein the resonator comprises a polarization controller.

83. The laser of claim 40 where an instantaneous linewidth is narrower than the filter bandwidth.

84. The laser of claim 40 wherein the resonator comprises a device for dispersion management.

85. The laser of claim 40 comprising an output coupler extracting an energy at two different times during a propagation through the cavity.

86. The laser of claim 40 comprising an output coupler in a linear part of the cavity.

87. The laser of claim 40 comprising a free space beam path.

88. The laser of claim 40 wherein active modes have a phase relation.

89. The laser of claim 40 where the cavity stores all frequencies in the sweep.

90. The laser of claim 40 wherein tuning speed is higher than 1 THz per us.

91. The laser of claim 40 where the filter passband frequency is controlled by a control voltage.

92. The laser of claim 40 where the filter passband wavelength is substantially linearly dependent on a control voltage.

93. The laser of claim 91 where the control voltage is generated by a digital function generator.

94. The laser of claim 40 where a temporal evolution of the filter passband is programmable.

95. The laser of claim 40 where the optical resonator contains one or more non-reciprocal elements.

96. The laser of claim 40 wherein the gain element is a rare earth doped fiber.

97. The laser of claim 40 wherein the gain element is Raman amplifier.

98. The laser of claim 40 wherein the cavity comprises more than one output coupler.

99. The laser of claim 40 wherein the gain medium is periodically modulated with the period T.

100. The laser of claim 40 comprising a Faraday rotating mirror.

101. The laser of claim 40 comprising a polarization beam splitter.

102. The laser of claim 40 wherein the gain element is used for filtering.

103. The laser of claim 40 wherein the gain and the filter are one element.

104. A laser for generating light having time varying frequencies, the laser comprising:
 a gain element having a spectral bandwidth;
 a tunable Fabry Perot filter having an optical passband that is tunable over a given periodic time T;
 and a feedback element in communication with the gain element and the filter, forming a laser resonator,
 wherein a roundtrip time of optical waves in the resonator is substantially equal to a non-zero integer multiple of the periodic time T.

105. The laser of claim 104 comprising a feedback loop to control the Fabry Perot filter.

106. The laser of claim 104 wherein the filter is tuned by a Piezo actuator.

107. A frequency varying wave generator comprising:
 a gain element adapted to amplify a wave having a frequency;
 a time varying tunable frequency selective filter element, including independently adjustable minimum and maximum frequency and adjustable tuning speed, in communication with the gain element, the tunable filter element adapted to selectively filter waves, where the filter element is tuned over a given period time T; and a feedback element in communication with the tunable filter element and the gain element, wherein the tunable frequency selective filter element, the gain element and the feedback element define a circuit such that the roundtrip time for the wave to propagate through the circuit is substantially equal to a non-zero integer multiple of the period T.

108. The wave generator of claim 107 wherein the frequency varying wave includes a continuously varying frequency, and a lowest frequency generated by the wave generator can be adjusted by adjusting a control signal interacting with the filter.

109. The wave generator of claim 107 wherein the frequency varying wave has a continuously varying frequency, and a highest frequency generated by the wave generator can be adjusted by adjusting a control signal interacting with the filter.

110. The wave generator of claim 107 wherein the frequency varying wave is light including a changing frequency, wherein a time dependence of the frequency can be chosen by control of the tunable filter element.

111. The wave generator of claim 107 wherein the frequency varying wave includes a continuously varying frequency, and a time dependence of the frequency variation is adjusted by adjusting a control signal interacting with the filter.

112. The wave generator of claim 107 wherein the wavelength varying wave has a frequency that varies continuously between two frequencies and the frequency generated is swept from lower to higher and from higher to lower.

113. The wave generator of claim 107 comprising a bidirectional frequency scan operation.

114. The wave generator of claim 107 wherein the frequency varying wave is light including continuously varying frequency in form of a sweep where a time dependence of the frequency exhibits a non-monotonic behavior.

115. The wave generator of claim 107 where a tuning speed is changed by control of the filter.

116. The wave generator of claim 107 wherein a tuning repetition rate is changed by control of the filter.

117. The wave generator of claim 107 wherein the filter passband frequency is controlled by a control voltage.

118. The wave generator of claim 117 wherein the filter passband wavelength is substantially linearly dependent on a control voltage.

119. The wave generator of claim 117 wherein the control voltage is generated by a digital function generator.

120. The wave generator of claim 107 wherein a temporal evolution of the filter passband is programmable.

121. The wave generator of claim 107 wherein a tuning speed is higher than 1 THz per us.

122. The wave generator of claim 107 wherein the roundtrip time of the waves in the circuit is detuned from a non-zero integer multiple of the period T.

123. A frequency variable light source comprising:
an optical gain element;
a time varying tunable frequency selective filter element with adjustable temporal tuning characteristics in communication with the gain element, the tunable filter element adapted to selectively filter waves, where the filter element is tuned over a given periodic time T; and
a feedback element in communication with the tunable filter element and the gain element, wherein the tunable frequency selective filter element, the gain element and the feedback element define a circuit such that the roundtrip time for the wave to propagate through the circuit is substantially equal to a non-zero integer multiple of the period T.

124. The frequency variable light source of claim 123 wherein the temporal tuning characteristic is changed by control of the filter.

125. The frequency variable light source of claim 123 wherein the temporal tuning characteristic of the individual sweeps is changed by control of the filter.

126. The frequency variable light source of claim 123 wherein the filter passband frequency is controlled by a control voltage.

127. The frequency variable light source of claim 126 wherein the filter passband wavelength is substantially linear dependent on the control voltage.

128. The frequency variable light source of claim 126 wherein the control voltage is generated by a digital function generator.

129. The frequency variable light source of claim 123 wherein a temporal evolution of the filter passband is programmable.

130. The frequency variable light source of claim 123 wherein tuning speed is higher than 1 THz per us.

131. The frequency variable light source of claim 123 wherein the roundtrip time of the optical waves in the resonator is detuned from a non-zero integer multiple of the period T.

132. A frequency variable light source comprising:
an optical gain element;
a time varying tunable frequency selective filter element with adjustable temporal tuning characteristics in communication with the gain element, the tunable filter element adapted to selectively filter waves, where the filter element is tuned over a given periodic time T; and
a feedback element in communication with the tunable filter element and the gain element, wherein the tunable frequency selective filter element, the gain element and the feedback element define a circuit such that the roundtrip time for the wave to propagate through the circuit is substantially equal to a non-zero integer multiple of the period T with a timing error of less than 0.01% of the period T.

133. A frequency variable light source comprising:
an optical gain element;
a time varying tunable frequency selective filter element with adjustable temporal tuning characteristics in communication with the gain element, the tunable filter element adapted to selectively filter waves, where the filter element is tuned over a given periodic time T; and
a feedback element in communication with the tunable filter element and the gain element, wherein the tunable frequency selective filter element, the gain element and the feedback element define a circuit such that the roundtrip time for the wave to propagate through the circuit is substantially equal to a non-zero integer multiple of the period T with a timing error smaller than the period T times the filter bandwidth divided by the tuning range.

134. A frequency varying wave generator comprising:
a gain element adapted to amplify a wave having a frequency;
a time varying tunable frequency selective filter element being adjustably tunable over a given period time T, and in communication with the gain element; and a feedback element in communication with the tunable filter element and the gain element, wherein the tunable frequency selective filter element, the gain element and the feedback element define a circuit such that the roundtrip time for the wave to propagate through the circuit is approximately, but not equal to a non-zero integer multiple of the period T.

135. The wave generator of claim 1 wherein a tuning rate is adjustably tunable.

136. The apparatus of claim 21 wherein a tuning rate is adjustably tunable.

137. The method of claim 36 wherein a tuning rate is adjustably tunable.

138. The laser of claim 40 wherein a tuning rate is adjustably tunable.

139. The wave generator of claim 134 wherein a tuning rate is adjustably tunable.

* * * * *